(12) United States Patent
Okeshi et al.

(10) Patent No.: US 6,827,783 B2
(45) Date of Patent: Dec. 7, 2004

(54) PASTE APPLICATION APPARATUS AND METHOD FOR APPLYING PASTE

(75) Inventors: Motoyuki Okeshi, Yasu-gun (JP); Tetsuya Mori, Moriyama (JP)

(73) Assignee: Murata Manufacturing Co., Ltd. (JP)

( * ) Notice: Subject to any disclaimer, the term of this patent is extended or adjusted under 35 U.S.C. 154(b) by 0 days.

(21) Appl. No.: 10/299,644

(22) Filed: Nov. 18, 2002

(65) Prior Publication Data

US 2003/0121470 A1 Jul. 3, 2003

(30) Foreign Application Priority Data

| Nov. 19, 2001 | (JP) | 2001-352837 |
| Apr. 23, 2002 | (JP) | 2002-120331 |
| Apr. 26, 2002 | (JP) | 2002-125771 |
| May 22, 2002 | (JP) | 2002-147641 |
| Jul. 8, 2002 | (JP) | 2002-199003 |
| Sep. 3, 2002 | (JP) | 2002-257336 |

(51) Int. Cl.$^7$ ............................................. B05C 1/02
(52) U.S. Cl. ................. 118/679; 118/103; 118/211; 118/212; 118/261
(58) Field of Search ............... 427/8, 428; 118/679; 718/103, 674, 259, 261, 262, 244, 211, 212, 63

(56) References Cited

U.S. PATENT DOCUMENTS

| 3,830,197 | A | * | 8/1974 | Romaine ...................... 118/104 |
| 4,046,931 | A | * | 9/1977 | Innes et al. .................. 427/428 |
| 4,588,470 | A | * | 5/1986 | Abegglen ..................... 156/578 |
| 5,057,337 | A | * | 10/1991 | Makino et al. ................ 427/96 |
| 5,423,927 | A | * | 6/1995 | Laurent et al. ................ 156/64 |
| 5,605,575 | A | * | 2/1997 | Anderson ..................... 118/679 |
| 5,785,802 | A | * | 7/1998 | Seki et al. ................... 156/471 |
| 6,379,464 | B1 | * | 4/2002 | Martel ......................... 118/672 |
| 6,423,374 | B1 | * | 7/2002 | Laursen ....................... 427/284 |

FOREIGN PATENT DOCUMENTS

| GB | 2351181 | 12/2000 |
| JP | 62252991 | 11/1987 |
| JP | 819752 | 1/1996 |
| JP | 8215798 | 8/1996 |
| JP | 9225369 | 9/1997 |
| JP | 10041339 | 2/1998 |
| JP | 10057884 | 3/1998 |
| JP | 2000315623 | 11/2000 |
| JP | 2001053086 | 2/2001 |
| JP | 2002237437 | 8/2002 |

* cited by examiner

Primary Examiner—Laura Edwards
(74) Attorney, Agent, or Firm—Ostrolenk, Faber, Gerb & Soffen, LLP

(57) ABSTRACT

A paste application apparatus capable of evenly applying a paste to each of the front portion and the rear portion of a coating target with a simple operation. The paste application apparatus includes a setting device for setting the velocity difference between the movement velocity of the target and that of a paste layer during application of the paste in order to evenly apply the paste to the front portion and the rear portion. The paste layer having a constant layer thickness on a substrate surface moves along an arc-shaped path, when viewed from the side, the target for coating moves along the tangential direction of the arc-shaped path at a constant velocity while being immersed to a predetermined depth relative to the paste layer, and thereby the paste is applied to the target for coating.

70 Claims, 53 Drawing Sheets

FIG. 50A
FIG. 50B
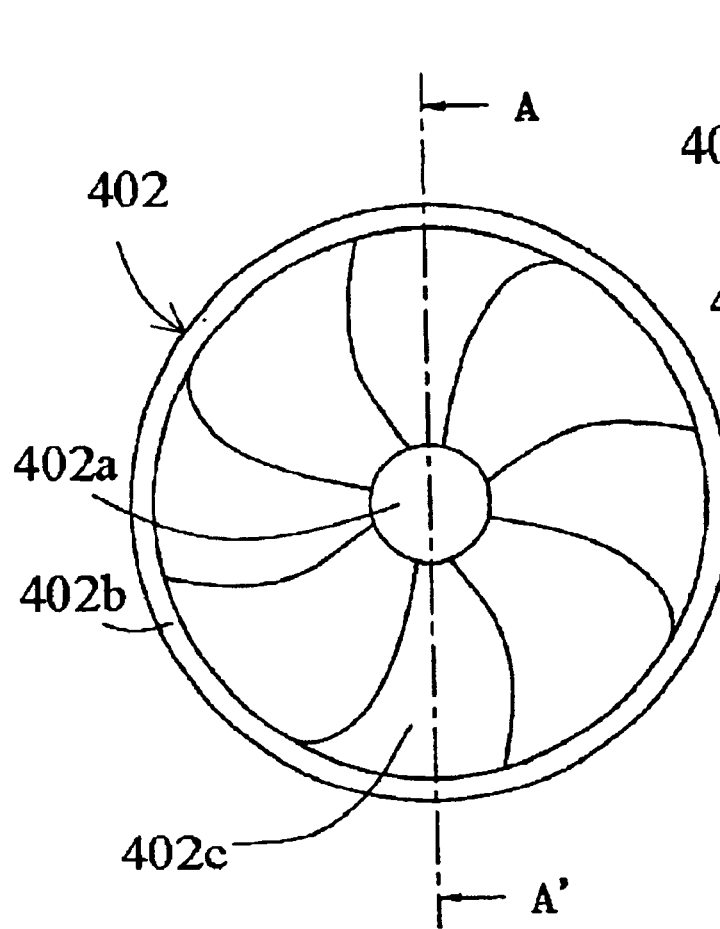
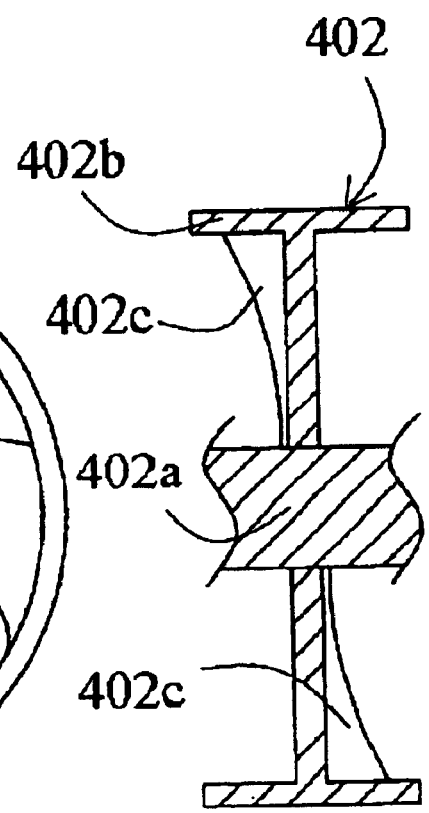

PASTE APPLICATION APPARATUS AND METHOD FOR APPLYING PASTE

BACKGROUND OF THE INVENTION

1. Field of the Invention

The present invention relates to a paste application apparatus which applies a paste, for example, an adhesive, conductive adhesive, external electrode, or flux, to a target for coating, for example, an electronic component, and a method for applying a paste.

2. Description of the Related Art

An example of the aforementioned type of paste application apparatus is disclosed in Japanese Unexamined Patent Application Publication No. 10-41339. As shown in FIG. 8, this is provided with a coating applicator (roller) 2 for circulating and moving a paste 3 in a constant direction in order that the circumferential velocity $V_2$ at the coating area A becomes a constant, a storage portion 1 for storing the paste 3 and bringing this paste into contact with the coating applicator 2, a squeegee 4 for adjusting the liquid thickness of the paste on the coating applicator in order that the thickness, that is, layer thickness, of the paste on the coating applicator 2 becomes constant in the coating area A, and a head 5 for moving the target for coating in the horizontal direction to a position 11, in order that when the target for coating 6 crosses the coating area A, the movement velocity $V_1$ of the target for coating and the circumferential velocity $V_2$ become in agreement with each other.

Another apparatus of this type is disclosed in Japanese Patent No. 3131156 (Japanese Unexamined Patent Application Publication No. 6-296929). Regarding this apparatus, as shown in FIG. 9, a predetermined quantity of paste 3 is adhered to the perimeter of a rotating thin disk-shaped coating disk 7, the paste adhered to the perimeter of the aforementioned coating disk 7 is transferred to the side surface of the chip-shaped components c while the chip-shaped components c as targets for coating are moved linearly in the tangential direction of the aforementioned disk 7 and, in addition, the shape of the paste e applied to each chip-shaped component c can be appropriately changed by controlling the difference between the circumferential velocity $V_2$ of the perimeter of the aforementioned coating disk 7 and the movement velocity $V_1$ of the chip-shaped component c during this transfer.

Another known paste application apparatus is shown in FIGS. 24A and 24B. A coating roller 103 having a width corresponding to the coating width is immersed in a paste bath 101 storing a paste 102 and is rotated so as to form a paste layer 102a having a predetermined thickness on the perimeter of the coating roller 103, and a target for coating 106 is brought into contact with this paste layer 102a so as to transfer and apply the paste. Specifically, a paste application apparatus for applying the paste to one surface of the target for coating, for example, an electronic component, is disclosed in Japanese Unexamined Patent Application Publication No. 10-41339.

This paste application apparatus is provided with a roller which is supplied with the paste to the perimeter surface and which rotates in one direction, and a transport mechanism which transports the target for coating in the condition that one surface thereof faces toward the perimeter surface of the roller to a required position above this roller, and the paste is applied to the one surface of the target for coating via the roller. In this paste application apparatus, the coating thickness of the paste with respect to one surface of the target for coating is determined by the adherence thickness of the paste with respect to the perimeter surface of the roller.

Furthermore, in this paste application apparatus, the paste is supplied to the perimeter surface of the roller rotating in one direction. The target for coating is transported to the required position above the roller in the condition that one surface thereof faces toward the perimeter surface of the roller. According to this, the paste is applied to the target for coating via the roller.

Specifically, this paste application apparatus is as shown at 411 in FIG. 53, and is provided with a cylindrical roller 412, a paste storage portion 419 for storing the paste, a movement mechanism 416 for moving the targets for coating 417 in order to bring them into contact with the paste layer 414 on the roller, and a squeegee 415 for adjusting the paste adhered to the perimeter of the roller 412 to have a constant film thickness.

In this paste application apparatus 411, when the roller 412 is rotated, the paste stored in the paste storage portion 419 is adhered to the perimeter of the roller 412. The paste adhered to the perimeter of the roller is adjusted to have a predetermined thickness by the squeegee 415 and, therefore, the paste layer 414 is produced. On the other hand, the movement mechanism 416 is for horizontally moving the adsorbed target for coating 417 above the roller 412 at the height at which the target for coating 417 is partially immersed in the paste layer 414 and, therefore, the paste is applied to the target for coating 417 when the bottom surface of the target for coating 417 passes through the paste layer.

Other conventional paste application apparatus is disclosed in Japanese Unexamined Patent Application Publication No. 8-19752. In this paste application apparatus, a paste is applied to the target for coating via a horizontal disk-shaped base. The paste is supplied along an arc-shaped path on the base with a predetermined thickness. The target for coating is pressed against the paste on the base.

The paste applied as described above is applied to the top surface portion or bottom surface portion, and the front portion and rear portion in the chip type electronic component, and it is desirable that the front portion and the rear portion are coated evenly. That is, for example, when the paste is a conductive adhesive, in mounting the electronic component, which is the target for coating after being coated, on a circuit substrate, occurrence of failure in mounting can be reduced by evenly joining the front and rear portion of the electrode of the component to the wiring of the substrate.

Among the aforementioned conventional techniques, regarding the former application apparatus, the coating applicator, for example, a roller, has an arc-shaped perimeter surface. When the paste is applied to the target for coating by horizontal movement of the head during movement of the paste layer together with the rotation of the roller, the target for coating has components of movement in both of the vertical and horizontal directions relative to the paste surface in the coating area (in the paste). Then, the target for coating scrapes the paste by the quantity of movement in the horizontal direction among them. Even when the paste layer surface of the coating applicator moves at a velocity equivalent to the movement velocity of the target for coating, difference in this component of movement in the horizontal direction (quantity of horizontal movement) occurs between the front portion and the rear portion of the target for coating. Consequently, difference in the quantity of scraping of the paste occurs between the front portion and the rear portion of the target for coating due to this difference in the quantity of horizontal movement and, therefore, difference in the quantity of coating occurs.

The reason for this will be described with reference to FIG. 5. This FIG. 5 shows orthogonal coordinates of the coordinate system viewed from the side with respect to the movement direction of the target for coating centering the hypothetical reference point O that is an arbitrary point on the paste layer surface moving together with the rotation of the roller. Here, the horizontal axis is the tangent to the paste layer surface at the point of contact of the hypothetical reference point O, and the vertical axis is the direction perpendicular to the tangent (the direction of the normal to the paste layer surface) passing through the hypothetical reference point O. Regarding the abscissa, the movement direction of the target for coating is indicated by plus, and regarding the ordinate, the direction of moving away from the paste layer surface is indicated by plus. The target for coating is assumed to be a rectangular parallelepiped. FIG. 5 shows the process of immersion of the rectangular parallelepiped target for coating in the paste layer as relative movement trajectories a2 and b2 of the front lower end position and rear lower end position, respectively, of the target for coating relative to the aforementioned hypothetical reference point O. That is, when the hypothetical reference point O moving practically at a constant velocity in the same manner as the paste layer surface is assumed to be fixed at the center of the coordinates, the movement trajectories a2 and b2 shown in this FIG. 5 indicate relative positional relationship between the hypothetical reference point O and the aforementioned front lower end position and rear lower end position. Here, the hypothetical reference point O is set to pass through the center position of the width from the front to the rear of the target for coating in the movement direction as well as the aforementioned normal when the target for coating being immersed in the paste layer reaches the deepest point. The horizontal component of the velocity among the movement velocity of the paste layer surface is set to agree the horizontal movement velocity of the target for coating at the uppermost position in the arc-shaped movement path.

In this case, when the hypothetical reference point O is in the neighborhood of the uppermost position, the movement velocity of the target for coating is larger than the horizontal component of the velocity among the components of the movement velocity of the paste layer surface. Consequently, since the movement velocity of the front portion of the target for coating was relatively larger than the movement velocity of the paste layer between the start of immersion and the completion of immersion, the quantity L1 of relatively forward horizontal movement of the front portion of the target for coating relative to the paste layer was larger than the quantity L2 of relatively backward horizontal movement of the rear portion of the target for coating relative to the paste layer.

Therefore, regarding this conventional technique, the paste extrusion quantity of the front portion of the target for coating is increased. Conversely, the paste extrusion quantity of the rear portion of the target for coating is decreased. According to this, the paste application quantity of the front portion of the target for coating became larger than that of the rear portion and, therefore, the requirement for even application quantities of the front portion and the rear portion was not met. Consequently, in order to evenly apply the paste to the front portion and the rear portion of the target for coating, after the target for coating was coated, the horizontal orientation was reversed and the coating operation had to be performed again and, therefore, there was a problem of low efficiency in operation.

Regarding the paste application apparatus shown in FIG. 9, the movement velocity $V_2$ of the paste surface of the disk 7 for applying paste is made larger than the movement velocity $V_1$ of the target for coating for the purpose of intensively adhering the paste e to the rear portion of the target for coating c, and even application of the paste to the front portion and the rear portion of the target for coating c was not intended.

Regarding the conventional paste application apparatus shown in FIGS. 24A and 24B, since the coating roller 103 having a width corresponding to the coating width was used, when the coating width was changed, an extensive coating roller exchange operation including release from a rotation drive mechanism, disassembling of a bearing portion, etc., had to be performed, a great deal of manpower and time was required for preparation and exchange thereof. In particular, regarding a small coating width, as shown in FIG. 24B, the coating roller 103 became a thin disk-shaped one, the stiffness of the coating roller itself became low and, therefore, there were problems in that runouts and deformation of the coating roller 103 were likely to occur, and variations in the application positions and coating dimensions occurred. When such a disk-shaped coating roller 103 is used, since the stiffness of the coating roller itself is low, adjustment of the thickness of the paste layer formed on the roller perimeter by a squeegee, etc., is difficult. Consequently, a method in which the coating roller 103 is immersed in a paste bath and is rotated so as to transfer and apply to the target for coating with the shape as is adhered to the roller perimeter is adopted. However, as shown in the drawing under magnification in FIG. 24B, regarding the paste layer 102a adhered to the roller perimeter, the thickness and the shape of the coating width of the side surface were not stabilized, the dimensions of the paste transferred and applied to the target for coating were likely to vary and, therefore, it was difficult to perform coating with high precision.

In the conventionally known apparatus as disclosed in Japanese Unexamined Patent Application Publication No. 2001-53086, a paste is applied individually to a pair of fixed inclined surfaces which are inclined in order to increase the distance therebetween in an upward direction, and the target for coating is positioned above the pair of inclined surfaces. Subsequently, the target for coating is allowed to move down, edge portions composed of the bottom surface and side surface of both end portions of the target for coating are brought into contact with respective corresponding inclined surfaces and, therefore, the paste is applied to the bottom surface and side surface of both end portions of the target for coating.

However, regarding this conventional configuration, since operations of horizontal movement or termination of the head for holding and moving this target for coating and operations of vertical movement of the head, etc., are required in order to apply the paste to all over the target for coating, the operation of paste application cannot be performed rapidly and, therefore, there was a problem in that production efficiency was low.

Targets for coating may be required to coat not only one surface, but also the other surfaces. For example, piezoelectric vibration components must be fixed firmly to a substrate in order to prevent excessive vibration thereof. Consequently, large quantities of adhesives must be applied to the piezoelectric vibration components. In such a case, regarding the aforementioned paste application apparatus, the quantity of the paste adhered to the perimeter surface of the roller must be increased so as to increase the thickness of adherence.

In this case, when the quantity of the paste adhered to the perimeter surface of the roller is increased, the centrifugal force of the paste accompanying the rotation of the roller is increased and, therefore, the paste may be peeled off the perimeter surface of the roller and be fly into the surroundings. In order to prevent such flying of the paste, it is considered to decrease the rotation speed of the roller.

However, when the rotation speed of the roller is decreased, although flying of the paste can be prevented, the application speed of the paste is decreased and, therefore, the operation efficiency is reduced. The contact time of the paste with air is increased and, therefore, degradation of the paste is accelerated. As described above, it is not easy to increase the thickness of adherence of the paste to the perimeter surface of the roller without reduction of the rotation speed of the roller according to the aforementioned paste application apparatus.

On the other hand, an apparatus for applying a paste to a sheet-shaped target for coating by a roller is disclosed in Japanese Unexamined Patent Application Publication No. 9-225369. In this paste application apparatus, many grooves 222 having a narrow groove width are arranged parallel to the axis direction on the perimeter surface of the roller 221 as shown in FIG. 39. The quantity of the paste adhered and held on the perimeter surface of the roller 221 can be increased by the many grooves.

However, regarding such a structure, even if the quantity of the paste held on the perimeter surface of the roller can be increased, the thickness of adherence of the paste with respect to the perimeter surface of the roller cannot be made an adequate thickness. When chip-shaped or block-shaped targets for coating are coated with pastes, the targets for coating are interfered by concave and convex protrusions arranged on the roller perimeter and, therefore, the portions to be coated with the paste of the target for coating cannot be immersed deeply in the paste to the extent that the side surfaces are immersed in the paste.

Regarding the paste application apparatus in the aforementioned Japanese Unexamined Patent Application Publication No. 10-41339 (FIGS. 24A and 24B), since there is no regularity with respect to the position at which the paste to be applied to the target for coating at the application position should be located, the paste being adhered on the perimeter surface of the roller, it may take a long time depending on the position on the perimeter surface of the roller until the paste is applied to the target for coating.

Among the pastes adhered on the perimeter surface of the roller, the paste which has not been applied to the target for coating passes through the paste supply portion again. However, in general, the paste which has ever been adhered to the perimeter surface of the roller is not adequately mixed with other pastes even if after passing through the paste supply portion.

Consequently, in many cases, the paste is adhered on the perimeter surface of the roller for a long time, and the surface layer of the paste is likely to bring about change in viscosity due to contact with the external air. In particular, a high viscosity paste has a remarkable tendency to become unlikely to mix with the paste in the paste supply portion, the viscosity change occurs at an earlier stage. When the viscosity of the paste is changed, the quantity of the paste applied to the target for coating is changed to increase or decrease. According to this, there is a problem in that continuous use of the paste for a long time is difficult.

Furthermore, the paste application apparatus in the aforementioned Japanese Unexamined Patent Application Publication No. 8-19752 is provided with a squeegee for scraping the paste after contact with the target for coating off the base and for dividing and directing the paste toward both sides. The pastes are mixed with each other and are self-agitated at a rearward position of this squeegee. Therefore, the viscosity increase due to drying of the paste can be controlled at a low level.

However, at least tip portion of the aforementioned squeegee is composed of an elastic body like rubber, this tip portion wears and the resulting powders are mixed into the paste and, therefore, the quality of the paste is degraded. Degradation and curing of the paste are accelerated by the frictional heat of the surface to which the paste is adhered and the squeegee and, therefore, the life of the paste is reduced. Furthermore, there are various problems in that, for example, adjustment of position or exchange of the squeegee in which the tip portion wears is required frequently and, therefore, maintenance requires much expense in time and effort.

Regarding the conventional paste application apparatus 411 shown in FIG. 53, when the rotation speed of the roller 412 is increased in order to increase the application speed of the paste, there is a problem in that the temperature of the paste is increased due to the frictional heat generated between the squeegee 415 and the paste during adjustment of the paste film thickness by the squeegee 415. Then, the viscosity of the paste is decreased, and the quantity of the coating becomes unstable. In addition, for example, when the paste is a thermosetting resin, the temperature is increased continuously so as to reaches the curing start temperature and, therefore, the paste is cured so that the paste may not be applied.

SUMMARY OF THE INVENTION

The present invention was made in consideration of the aforementioned circumstances. Accordingly, it is an object of the present invention to provide a paste application apparatus and a method for applying a paste, each capable of evenly applying a paste to each of the front portion and the rear portion of a target for coating with a simple operation.

It is a further object of the present invention to provide a paste application apparatus capable of performing application with high precision, performing prompt change of the coating width with ease, and achieving improvement of production efficiency.

It is a further object of the present invention to provide a paste application apparatus capable of applying large quantities of paste to a target for coating while flying of a paste from a roller is prevented.

Furthermore, the present invention is to overcome at least one of the aforementioned various problems in order that a paste can be used continuously for a long time.

It is further object of the present invention to provide a paste application apparatus capable of applying a paste to a target for coating for a long time with stability while the temperature increase of the paste is suppressed and the viscosity of the paste is kept constant even when a roller is rotated at a high speed.

In order to achieve the aforementioned objects, the present invention has following configurations.

A paste application apparatus according to the present invention includes a setting device for setting the velocity difference between the movement velocity of a target for coating and the movement velocity of a paste layer in order to evenly apply a paste to the front portion and the rear portion of the aforementioned target for coating during application of the paste to the aforementioned target for coating, wherein the paste layer having a constant layer thickness is formed on a substrate surface, the aforementioned paste layer moves along a path which is an arc-shaped path when viewed from the side together with the substrate, and the target for coating moves along the tangential direction of the aforementioned arc-shaped path, along which the aforementioned paste layer moves, while the aforementioned target for coating is immersed until a predetermined depth relative to the aforementioned paste layer and thereby the paste is applied to the aforementioned target for coating.

According to the paste application apparatus of the present invention, since the paste is evenly applied to the front portion and the rear portion of the target for coating by setting the velocity difference between the movement velocity of the target for coating during application of the paste and the movement velocity of the paste layer during application of the paste, excellent desired application of the paste can be performed by simple velocity control of only setting the velocity difference.

Preferably, the aforementioned arc-shaped path is set by the perimeter surface of a cylindrical roller, the aforementioned paste layer is adhered to the surface of the aforementioned arc-shaped path and, in addition, a supply portion for supplying the paste to the surface of the aforementioned arc-shaped path and a layer thickness adjustment portion for keeping the layer thickness of the paste layer on the surface of the aforementioned arc-shaped path constant are included. In this case, since the arc-shaped path, along which paste layer moves, is set by the perimeter surface of the cylindrical roller, and when the paste layer moves along the arc-shaped path, the paste is evenly applied to the front portion and the rear portion of the target for coating by setting the velocity difference between the movement velocity of the paste layer and the movement velocity of the target for coating, excellent desired application of the paste can be performed by simple velocity control of only setting the velocity difference.

Preferably, the aforementioned setting device sets the velocity difference between the movement velocity of the aforementioned paste layer and the movement velocity of the aforementioned target for coating during application of the paste at the position of application of the paste to the aforementioned target for coating with the paste based on the distance from the center of the arc of the aforementioned arc-shaped path to the aforementioned paste layer surface, the immersion depth of the aforementioned target for coating in the aforementioned paste layer, and the external dimensions of the aforementioned target for coating. In this case, since the velocity difference between the movement velocity of the paste layer on the arc-shaped path and the movement velocity of the target for coating during application of the paste can be simply set by determination using parameters of the distance from the center of the arc of the arc-shaped path to the paste layer surface, the immersion depth of the target for coating in the paste layer, and the external dimensions of the target for coating, the aforementioned velocity difference can be simply determined only by calculation even when various conditions are changed.

Preferably, the aforementioned substrate is composed of the cylindrical roller driven to rotate and, in addition, a supply portion for supplying the paste to the surface of the aforementioned roller, and a layer thickness adjustment portion for keeping the layer thickness of the paste layer on the surface of the aforementioned roller constant are included. In this case, the paste layer adhered on the roller surface is allowed to be in the condition of being rotated and moved accompanying the rotation of the roller, and when the target for coating is passed and moved along the tangential direction relative to the paste layer rotating and moving, the paste of the paste layer on the roller surface is applied to the target for coating.

Preferably, the aforementioned setting device sets the velocity difference between the movement velocity of the aforementioned paste layer and the movement velocity of the aforementioned target for coating during application of the paste at the position of application of the paste to the aforementioned target for coating based on the distance from the center of the aforementioned roller to the aforementioned paste layer surface, the immersion depth of the aforementioned target for coating in the aforementioned paste layer, and the external dimensions of the aforementioned target for coating. In this case, since the velocity difference between the movement velocity of the paste layer on the arc-shaped path and the movement velocity of the target for coating during application of the paste can be simply set by determination using parameters of the distance from the center of the roller to the paste layer surface, the immersion depth of the target for coating in the paste layer, and the external dimensions of the target for coating, the aforementioned velocity difference can be simply determined only by calculation even when various conditions are changed.

Preferably, the aforementioned setting device sets the movement velocity of the aforementioned paste layer at a velocity higher than the movement velocity of the aforementioned target for coating during application of the paste. In this case, by setting the movement velocity of the paste layer on the arc-shaped path at a velocity higher than the movement velocity of the target for coating during application of the paste, the quantities of application to the front portion and the rear portion of the target for coating can be made even.

Preferably, the aforementioned setting device sets the aforementioned velocity difference in order that regarding respective movement trajectories of immersion of the aforementioned front portion and the aforementioned rear portion in the movement direction of the aforementioned target for coating relative to the aforementioned paste layer during immersion in the aforementioned paste layer, the immersion start position and the immersion completion position become in agreement with each other. In this case, the respective quantities of forward or backward movement of the front portion and the rear portion of the target for coating in the condition of being immersed in the paste layer become the same and, therefore, the quantities of application of the paste on respective surface portions become the same.

A method for applying a paste according to the present invention includes the step of applying a paste to a target for coating by setting the velocity difference between the movement velocity of the aforementioned target for coating during application of the paste and the movement velocity of a paste layer during application of the paste in order to evenly apply the paste to the front portion and the rear portion of the aforementioned target for coating, wherein the paste layer having a constant layer thickness is formed on a substrate surface, the aforementioned paste layer moves along a path which is an arc-shaped path when viewed from the side together with the substrate, and the target for coating moves along the tangential direction of the aforementioned arc-shaped path, along which the aforementioned paste layer moves, while the aforementioned target for coating is immersed until a predetermined depth relative to the aforementioned paste layer and thereby the paste is applied to the aforementioned target for coating.

According to the paste application apparatus of the present invention, since the paste is evenly applied to the front portion and the rear portion of the target for coating by setting the velocity difference between the movement velocity of the target for coating during application of the paste and the movement velocity of the paste layer during application of the paste, excellent desired application of the paste can be performed by simple velocity control of only setting the velocity difference.

Another paste application apparatus according to the present invention is provided with a coating roller for transferring and applying a paste to a target for coating, a device for supplying the paste to the perimeter of the coating roller, and a paste layer formation member for scraping off an excess portion of the paste supplied to the perimeter of the roller and forming a paste layer having a predetermined cross-sectional shape on the perimeter of the coating roller, wherein the shape of the aforementioned paste layer formation member is set to form the paste layer having a width smaller than the width in the axis center direction of the coating roller as the paste layer, the aforementioned target for coating is held by a movable head, the paste is applied to the aforementioned target for coating by immersing the aforementioned target for coating in the aforementioned paste layer while the aforementioned head moves on the aforementioned rotating coating roller, and the aforementioned paste layer formation member is composed of a fixed squeegee provided with a concave portion at the tip portion.

According to this configuration, since the excess portion of the paste supplied to the perimeter of the coating roller is scraped off by the paste layer formation member, the paste layer having a width smaller than the width in the axis center direction of the coating roller can be formed on the perimeter of the coating roller, and by bringing the target for coating into contact with this past layer, the paste can be transferred and applied with a desired width.

In this case, since the width of the coating roller itself is not restricted by the coating width, even when a coating of a small width is performed, a wide coating roller having high stiffness can be used, and inconveniences, for example, runouts and deformation of the coating roller, do not occur.

Since the coating width is determined by the shape of the paste layer formation member, change of the coating width can be performed by exchange of the paste layer formation member only, and exchange of the coating roller is unnecessary.

Since the paste is applied to the target for coating by immersing the target for coating in the paste layer on the coating roller while the target for coating moves on the rotating coating roller, the coating step can be performed in a short time. Consequently, the operation of application of the paste to the target for coating can be efficiently performed and, therefore, the productivity can be improved.

Since an edge for scraping off the paste is set in accordance with the shape and position of the concave portion of the tip portion for scraping off the paste of the plate-shaped squeegee (paste layer formation member), a paste layer having an arbitrary width and thickness can be formed at an arbitrary position of the coating roller perimeter. Consequently, squeegees corresponding to various targets for coating may be prepared in advance, and the fixed squeegee may be exchanged in accordance with change of the target for coating.

The aforementioned paste layer formation member may be composed of a rotary roller provided with a circular concave groove on the perimeter.

According to this configuration, by setting the shape and position of the circular concave groove formed on the perimeter of the rotary roller (paste layer formation member), a paste layer having an arbitrary width and thickness can be formed at an arbitrary position of the coating roller perimeter. Even when the rotary roller is brought into contact with the perimeter of the coating roller and the excess portion of the paste is completely removed from the perimeter of the coating roller, since the coating roller and the rotary roller are only brought into rolling contact with each other, frictional heat and wear do not occur, and even when continuous operation is performed, degradation of the paste due to temperature increase and mixing of powders resulting from wear into the paste can be avoided before they happen.

Preferably, a circular convex thread is arranged on the perimeter of the aforementioned coating roller, and a concave portion to be fitted with this circular convex thread is arranged in the aforementioned paste layer formation member.

According to this configuration, by scraping off the excess portion of the paste supplied to the perimeter of the coating roller with the paste layer formation member, a paste layer having a desired thickness can be formed in the condition of being stable with respect to the shape on the perimeter of the circular convex thread of the coating roller, and by bringing the target for coating close to the coating roller in order to allow the circular convex thread of the coating roller to fit into the concave portion of the target for coating, the paste can be transferred and applied to the bottom of the concave portion of the target for coating with a desired width.

Preferably, the aforementioned paste layer formation member is composed of a fixed squeegee provided with a taper-shaped concave portion at the tip portion.

Here, "the concave portion arranged at the tip portion is in the shape of a taper" refers to that the side edge of the concave portion for scraping off the excess portion of the paste of the paste layer of the coating roller side is an edge inclined relative to the axis center direction of the coating roller and the diameter direction of the coating roller. Consequently, regarding the concave portion, an inclined side surface portion is formed in the paste layer when the excess portion of the paste layer on the coating roller side is scraped off.

According to this configuration, the inclined side surface portion is formed in the paste layer of the coating roller by the fixed squeegee provided with the taper-shaped concave portion, and the target for coating is immersed in the inclined side surface portion of the paste layer so that application of the paste can be performed. Since such an inclined side surface portion of the paste layer is a space portion in which the target for coating is moved in the condition of being held by the head, application of the paste to the target for coating can be performed by a simple operation of only moving the target for coating by the head in order to apply the paste.

Since the paste is applied to the target for coating by immersing the target for coating in the paste layer on the coating roller while the target for coating moves on the rotating coating roller, and movement of the target for coating during application can be performed by moving between a pair of inclined surfaces on the coating roller side along a constant direction, for example, the horizontal direction, the coating step can be performed in a short time.

Consequently, the operation of paste application to the target for coating can be efficiently performed and, therefore, the productivity can be improved.

Preferably, the aforementioned paste layer formation member is composed of a rotary roller provided with a taper-shaped circular concave groove on the tip portion.

Here, "the circular concave groove arranged at the tip portion of the rotary roller is in the shape of a taper" refers to that the side surface of the circular concave groove for scraping off the excess portion of the paste layer of the coating roller side is a surface inclined relative to the axis center direction of the coating roller and the diameter direction of the coating roller. Consequently, regarding the circular concave groove, an inclined side surface portion is formed in the paste layer when the excess portion of the paste layer on the coating roller side is scraped off.

According to this configuration, the inclined side surface portion is formed in the paste layer on the coating roller by the rotary roller provided with the taper-shaped circular concave groove, and application of the paste can be performed by immersing the target for coating in the inclined side surface portion of the paste layer. Consequently, since such an inclined side surface portion of the paste layer is a space portion in which the target for coating is moved in the condition of being held by the head, application of the paste to the target for coating can be performed by a simple operation of only moving the target for coating by the head in order to apply the paste.

Preferably, a coating roller for transferring and applying a paste to a target for coating, a device for supplying the paste to the perimeter of the coating roller, and a paste layer formation member for scraping off an excess portion of the paste supplied to the perimeter of the roller and forming a paste layer having a predetermined cross-sectional shape on the perimeter of the coating roller are arranged and, in addition, taper-shaped circular convex threads are arranged at both edge portions on the aforementioned perimeter of the coating roller, and concave portions to be fitted with these circular convex threads are arranged in the aforementioned paste layer formation member.

Here, "the circular convex thread is in the shape of a taper" refers to that the side surface thereof is a surface inclined relative to the axis center direction of the coating roller and the diameter direction of the coating roller.

According to this configuration, by scraping off the excess portion of the paste supplied to the perimeter of the coating roller with the paste layer formation member, a paste layer having a desired thickness can be formed in the condition of being stable with respect to the shape on the taper-shaped circular convex thread of the coating roller, and by moving the target for coating in order to immerse in the paste layer on the taper portion of the circular convex thread of the coating roller, the paste can be transferred and applied to the target for coating. Even when the position of the target for coating held by the head somewhat deviates in the horizontal direction, and the target for coating is brought into contact with one of the pair of circular convex threads, the holding attitude of the head is adjusted while the position is kept regulated due to the contact and, therefore, application of the paste to the target for coating can be performed while deviation, etc., are controlled.

Preferably, the paste application apparatus is provided with a roller to be supplied with a paste on the perimeter surface and a transport mechanism which transports the target for coating to the required position above the roller, wherein a paste holding portion in which at least a part of the target for coating can enters and which can holds the paste is arranged on the perimeter surface of the aforementioned roller.

According to this configuration, since the paste is held in the paste holding portion on the perimeter surface of the roller, and a part of the target for coating, that is, the portion on the side of paste application, enters in this paste, the target for coating is immersed deeply in the paste and, therefore, large quantities of paste is applied to the target for coating.

In the aforementioned configuration, the paste holding portion is a circumferential groove arranged along the circumference on the perimeter surface of the roller, and the size of the circumferential groove is set in order that the portion on the side of paste application of the target for coating can enter with clearance. In this circumferential groove, the paste is held with a large thickness. In this case, since the contact area of the circumferential groove and the paste is large with respect to the quantity of the paste, flying of the paste is prevented.

In addition to this, examples of paste holding portions include a flexible holding layer for a paste which is formed from a flexible member on the perimeter surface of the roller and which has a paste holding gap inside thereof.

The target for coating is pressed against this flexible holding layer during application of the paste. The flexible holding layer deforms in such a manner as to avoid the target for coating. At this time, the paste contained in the paste holding gap inside the flexible holding layer flows towards the target for coating side and adheres to the target for coating.

More specifically, the aforementioned flexible holding layer is composed of numbers of pliable linear bodies arranged by implantation on the perimeter surface of the roller, numbers of elastic protrusions protruding from the perimeter surface of the roller in all directions, or an elastic body having numbers of gaps open toward the outer diameter side.

Regarding these flexible holding layers, the thickness of the paste is ensured within the range in which the flexible holding layer can be deformed by compression toward the perimeter surface of the roller side, and since the contact area with the paste is large, flying of the paste is prevented.

Preferably, the paste application apparatus is provided with a roller to be supplied with a paste on the perimeter surface, an application position setting mechanism for immersing at least a part of the target for coating in the paste on the perimeter surface of this roller at a required depth, and a scraping member for scraping the paste off the perimeter surface of the roller, wherein the aforementioned scraping member scrapes off the paste with a scraping depth larger than the immersion depth of the target for coating being immersed in the adhered paste while the scraping member is in non-contact with the perimeter surface of the roller.

The aforementioned target for coating is not limited to an electronic component, and may be any material as long as the paste is applied to the surface thereof.

The aforementioned roller may be any member which has a rotary surface and which has a function of being adhered with a paste on the rotary surface, and the shape of the perimeter surface thereof is not limited to the shape of a cylinder or the like.

The aforementioned paste is not restricted by the name, and any coating material having a viscosity required for application to a target for coating is used. For example, adhesives, conductive adhesives, flux, and any other coating material may be used.

According to the aforementioned configuration, the target for coating is immersed in the paste adhered on the perimeter surface of the roller, and a part of the paste is applied to the target for coating. Although the surface layer portion of the paste is exposed to the external air, and the target for coating is immersed therein, after coating is completed, the surface layer portion is scraped off with the scraping member, is mixed with, for example, other paste stored in the paste supply portion, and agitation is performed. According to this, the paste at the application position becomes always fresh, viscosity change due to drying of the paste is suppressed and, therefore, the quantity of the paste applied to the target for coating is stabilized.

Among the paste adhered on the perimeter surface of the roller, the inner layer portion which is not scraped off with the scraping member is not replaced with an adequately fresh paste. However, that portion does not involve in application of the paste to the target for coating, no effect is exerted on the quantity of the paste applied to the target for coating.

The surface layer portion of the adhered paste, which has been scraped off with the scraping member, may be taken out to the outside. However, when at least the tip portion of the scraping member is arranged above the aforementioned paste supply portion in order that the paste scraped by the scraping member flows into the paste supply portion under its own weight, the scraped paste and remaining past are mixed in the paste supply portion and, therefore, the total paste is self-agitated. According to this, viscosity change of the total paste is suppressed and, therefore, the quantity of the paste applied to the target for coating is stabilized. Since the scraped paste is returned to the paste supply portion, the quantity of decrease of the paste can be controlled to be minimum and, therefore, the paste can be used continuously for a long time.

In this case, since the scraping member is not brought into contact with the roller, wear does not occur, and degradation of the quality of the paste due to powders resulting from wear does not occur. The frictional heat between the scraping member and the roller does not occur and, therefore, degradation and cure of the paste due to the frictional heat between the two do not occur. Furthermore, since the scraping member does not wear, adjustment of the interval to the roller is unnecessary, and frequency of exchange of the scraping member itself is reduced.

Among the aforementioned configuration, the scraping member is not necessarily a plate in the shape of a squeegee having a sharp tip, a member having some thickness can be used, and the shape thereof is not limited to those shown in drawings in the embodiments.

The paste supply portion may be a paste bath including an open upper portion and the roller is arranged inside the open portion, and the paste supply portion may be formed from the liquid thickness adjustment member for adjusting the adhesion thickness of the paste on the perimeter surface of the roller and the perimeter surface of the roller. The liquid thickness adjustment member constituting the paste supply portion is arranged under the scraping member.

The aforementioned liquid thickness adjustment member is not necessarily a plate in the shape of a squeegee, a roller capable of rotating can also be used, and the shape thereof is not limited to those shown in drawings in the embodiments.

In the apparatus including the liquid thickness adjustment member arranged under the scraping member, when shifting members for shifting the paste toward the liquid thickness adjustment member side are arranged on both sides of the liquid thickness adjustment member in the shape surrounding the aforementioned scraping member from both sides, walls are thereby arranged on both sides of the paste supply portion and, therefore, this paste supply portion can store large quantities of paste. Furthermore, since the paste having been scraped with the scraping member can be stored in the paste supply portion and be used again, the paste can be used efficiently.

The paste application apparatus of the present invention may be provided with a paste supply portion for supplying the paste to the perimeter surface of the roller as a part of the apparatus, and this may be prepared independently of the apparatus. The application position setting mechanism may transport the target for coating in the horizontal direction relative to the perimeter surface of the roller, or may transport in the vertical direction.

Preferably, the paste application apparatus is provided with a roller having a rim-shaped perimeter, a paste supply mechanism for supplying the paste on the perimeter of the aforementioned roller so as to form the paste layer, and an application position setting mechanism for setting relative positions of the aforementioned roller and the aforementioned target for coating in order that the paste layer on the roller and the target for coating are brought into contact with each other and the paste is adhered to the surface of the aforementioned target for coating, wherein the aforementioned roller is provided with a blast plate which generates an air current by the rotation of the roller.

BRIEF DESCRIPTION OF THE DRAWINGS

FIG. 21A shows the case where the quantity of immersion is small, and FIG. 21B shows the case where the quantity of immersion is larger than that shown in FIG. 21A.

FIG. 24A shows the manner of application of the paste with a coating roller having a relatively large width, and FIG. 24B shows the manner of application of the paste with a disk-shaped coating roller having a narrow width and a coated portion under magnification.

FIG. 50A is a plan view showing a roller portion in a paste application apparatus of the present invention, and FIG. 50B is a sectional view of the section indicated by a line A–A' shown in FIG. 50B.

DESCRIPTION OF EMBODIMENTS OF THE INVENTION

Embodiments of the present invention will be described below with reference to the drawings.

Figure 1:
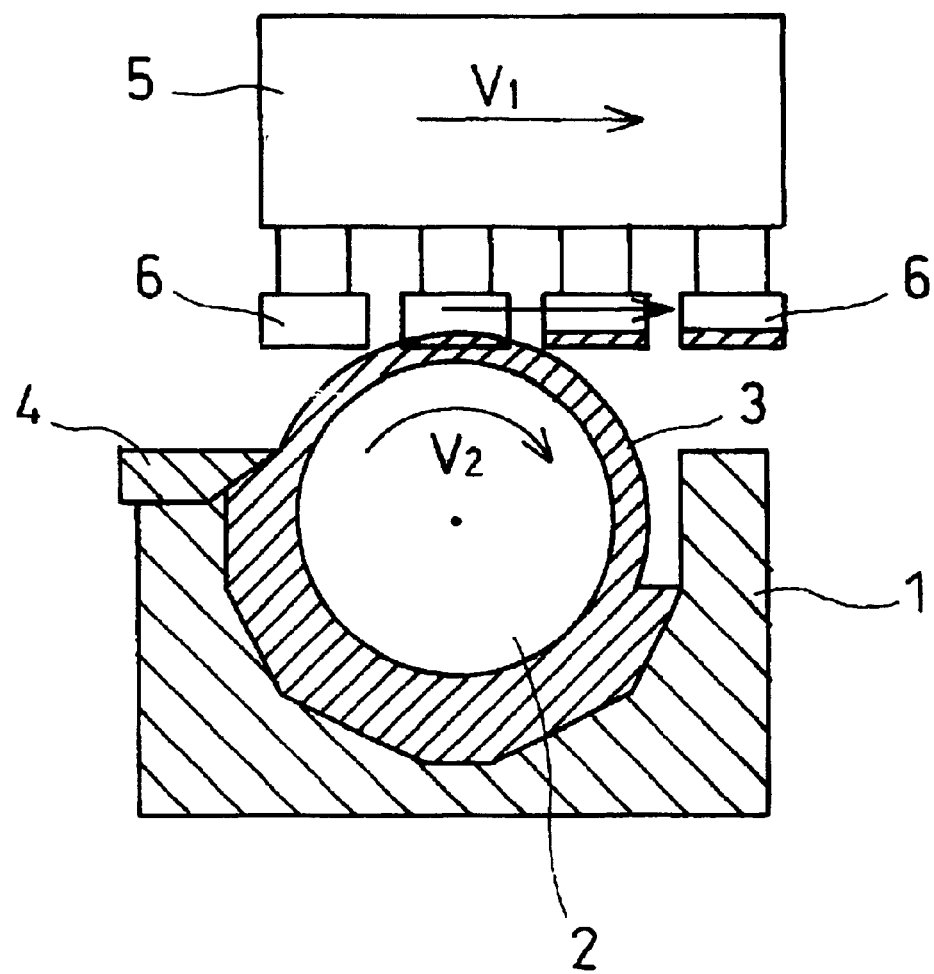
FIG. 1 is a vertical side view showing a paste application apparatus according to a first embodiment of the present invention.
Figure 2:
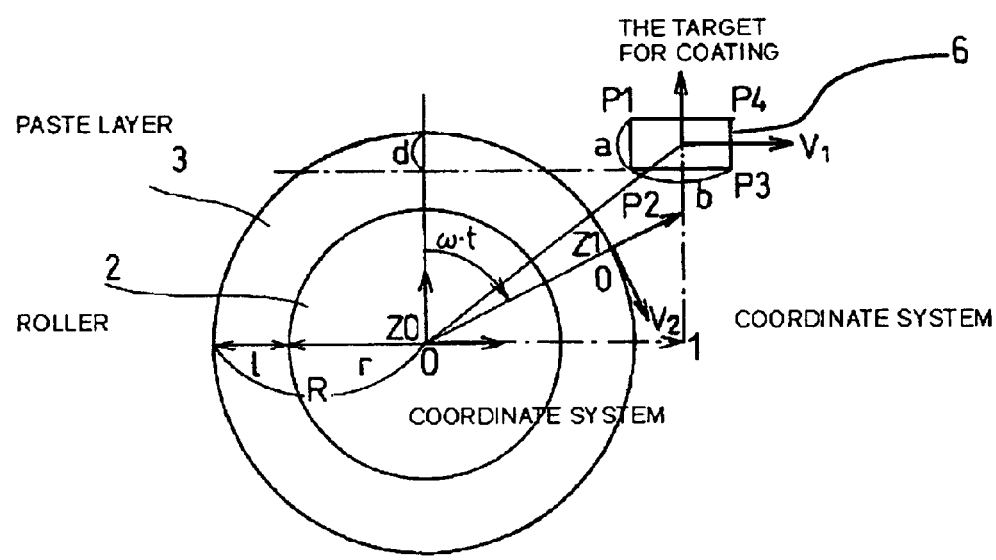
FIG. 2 is a diagram viewed from the side for illustrating the principle.
Figure 3:
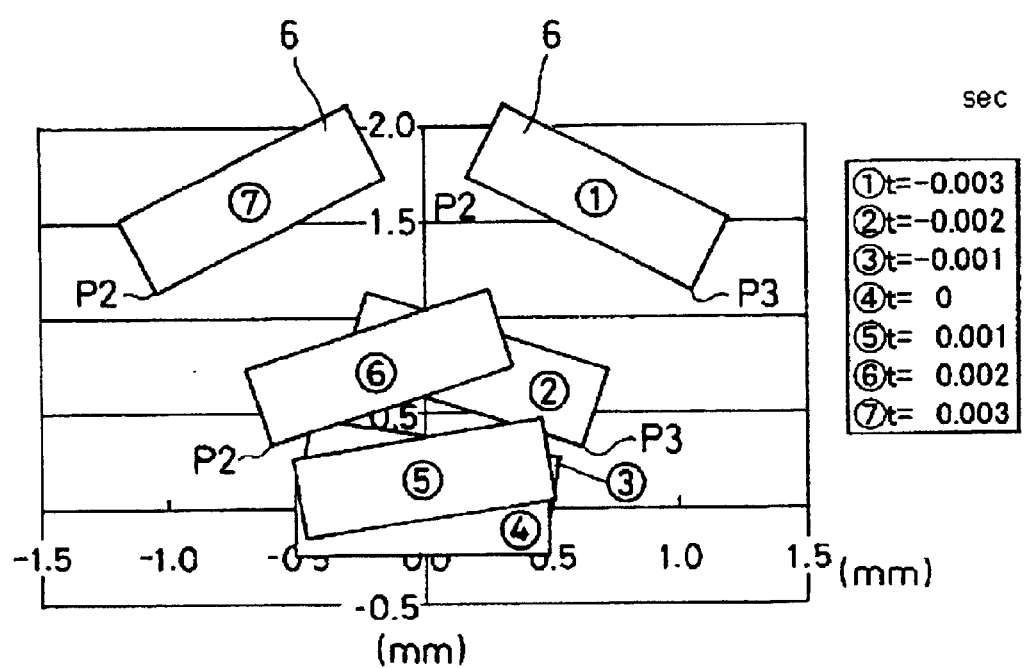
FIG. 3 is a side view showing the position of a target for coating on a predetermined time basis during application of a paste.
Figure 4:
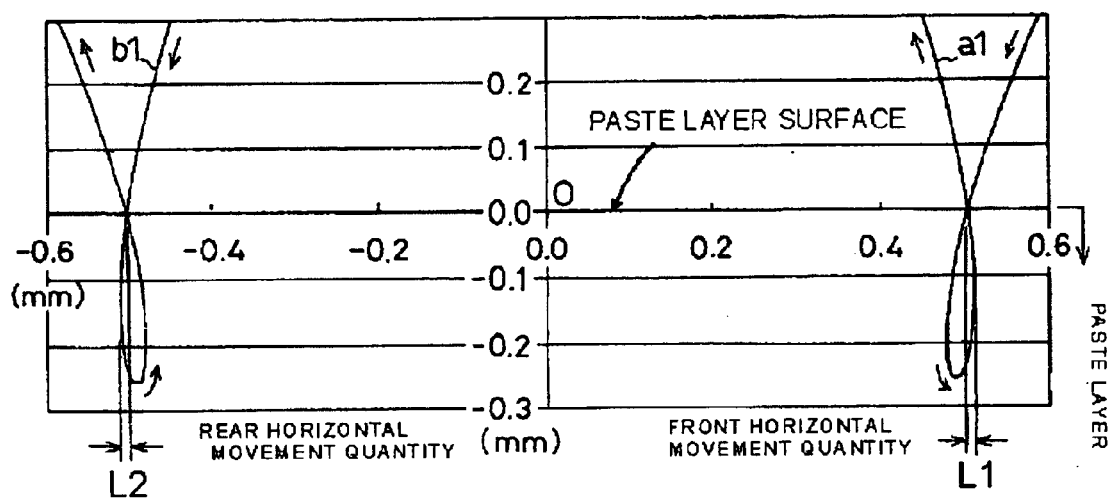
FIG. 4 is a side view showing movement trajectories of a target for coating during application of a paste.

FIG. 1 to FIG. 4 show a first embodiment according to the present invention. FIG. 1 is a vertical side view showing a paste application apparatus, FIG. 2 is a diagram viewed from the side for illustrating the principle, FIG. 3 is a side view showing the position of a target for coating on a predetermined time basis during application of a paste, and FIG. 4 is a side view showing movement trajectories of a target for coating during application of a paste.

In FIG. 1, reference numeral 1 denotes a paste bath as a supply portion for supplying a paste, reference numeral 2 denotes a roller as a substrate for applying the paste, the roller being driven to rotate, reference numeral 3 denotes a paste layer, reference numeral 4 denotes a squeegee as a layer thickness adjustment portion for adjusting the paste thickness, reference numeral 5 denotes a head, and reference numeral 6 denotes a target for coating, for example, a chip type electronic component.

The roller 2 rotates about the center in the direction indicated by an arrow (clockwise direction in FIG. 1) and, thereby, the paste in the paste bath 1 is hoisted up together with the roller 2 so as to form the paste layer 3 on the roller 2 surface. This paste layer 3 is adjusted to have a constant thickness by the squeegee 4. Since the paste is rotated together with the roller 2, the surface of the paste layer 3 with a constant thickness has a surface circumferential velocity $V_2$ corresponding to the rotation speed of the roller 2.

The target for coating 6 held on the head 5 by adsorption moves horizontally in the direction indicated by an arrow (the direction from left toward right in FIG. 1) with a velocity $V_1$ while the bottom thereof is at the position slightly (on the order of 0.01 to 1.0 mm) higher than the top of the roller 2, and when the target for coating 6 passes in the neighborhood of the top of the roller 2, the paste on the surface of the roller 2 is applied thereto. That is, the position of the surface of the paste layer 3 at the top of the roller 2 is the uppermost position of the paste layer 3, and the paste is applied to the target for coating 6 while the target for coating 6 is moved along the horizontal direction that is the tangential direction passing through this uppermost position.

As the paste, conductive adhesives, insulating adhesives, flux, etc., can be used in accordance with uses.

Furthermore, this paste application apparatus is provided with a control device although not shown in the drawing. This control device controls the movement velocity of the head 5 during application of the paste, and by extension movement velocity of the target for coating 6 and, in addition, the rotation speed of the roller 2 can be controlled. For details, the control device is provided with a setting device for setting the velocity difference between the aforementioned velocity $V_1$ that is the movement velocity of the target for coating 6 and the surface circumferential velocity $V_2$ of the paste layer 3 and, in addition, controls the movement velocity of the head 5 and the rotation speed of the roller 2 in order to meet the velocity difference having been set.

A specific example of velocity control by the control device and setting of the velocity difference by the setting device will be shown below. For example, in the case where the distance from the roller 2 center to the paste surface (roller radius+paste thickness) of the coating applicator composed of the roller 2 and the paste layer 3 is 10 mm, the height dimension a of the target for coating 6 is 0.5 mm, the dimension in the movement direction (to-and-fro direction) is 1.0 mm, and the immersion depth is 0.25 mm, when the movement velocity $V_1$ of the target for coating 6 is set at 2,000 mm/s, the ratio of the movement velocity $V_1$ of the target for coating and the paste surface circumferential velocity $V_2$ of the coating applicator is made to be $V_2/V_1 = 1.008$. Therefore, the paste surface circumferential velocity $V_2$ of the coating applicator is 2,016 mm/s. In this case, the point in time when the target for coating 6 reaches the lowermost point during immersion in the paste layer 3, that is, the point in time when the center of the width in the to-and-fro direction of the target for coating 6 passes through the uppermost position of the surface of the paste layer 3 is assumed to be 0, and the position of the target for coating 6 at every 0.001 second in the neighborhood thereof is shown in FIG. 3.

Under this condition, trajectories a1 and b1 drawn by the relative movement path of the target for coating 6 relative to the specific point O on the paste layer surface are shown in FIG. 4. The curved trajectories a1 and b1 shown in FIG. 4 are the trajectories drawn by the apex P3 of the front lower end angle and the apex P2 of the rear lower end angle, respectively, of the target for coating 6, when viewed from the side, shown in FIG. 2. Under the aforementioned condition, regarding each of the trajectories a1 and b1, the position of entrance and the position of leaving with respect to the paste layer surface are in agreement with each other. Each of the trajectories a1 and b1 from entrance to leaving in the paste layer is a nearly symmetrical trajectory with respect to to-and-fro direction and, therefore, it can be seen that the quantities Li and L2 of scraping movement in the to-and-fro direction of the front side portion and the rear side portion (indicated by front horizontal movement quantity L1 and rear horizontal movement quantity L2, respectively, in FIG. 4) of the target for coating in the paste layer 3 are the same.

Next, the principle of the fact that the paste can be evenly applied to the front side portion and the rear side portion of the target for coating 6 by setting the velocity difference between the paste surface circumferential velocity $V_2$ and the movement velocity $V_1$ of the target for coating 6 as described above and a method for determination by calculation based on each parameter will be described below with reference to FIG. 2.

In the model shown in FIG. 2, the position of the target for coating 6 relative to the paste on the roller 2 (the position $(x_{pn}, y_{pn})$ of the target for coating in the coordinate system 1) can be represented by Formula (1). The coordinate system 1 is the coordinates centering the specific point O hypothetically set on the paste layer surface, and as described above, the movement trajectories a1 and b1 of the target for coating 6 with respect to this specific point O are shown in FIG. 4 as trajectories drawn by the aforementioned points P3 and P2.

$$\overrightarrow{Z1Pn} = \begin{pmatrix} (V_1 t + x_{pn})\cos\omega t - (R + y_{pn})\sin\omega t \\ (V_1 t + x_{pn})\sin\omega t + (R + y_{pn})\cos\omega t - R \end{pmatrix} \quad \text{Formula (1)}$$

Wherein R denotes the sum of the radius r of the roller 2 and the thickness 1 of the paste layer 3 after a constant layer thickness is established, that is, the distance between the paste layer 3 surface and the roller center, ω denotes the rotation speed of the roller 2, and t denotes the time relative to the point in time when the center of the width in the to-and-fro direction of the target for coating 6 passes through the uppermost position of the surface of the paste layer 3 that is assumed to be 0.

Derivation of Formula (1) will be described supplementally.

Initially, preconditions will be described below. In FIG. 2, Pn represents each of apexes P1, P2, P3, and P4 of the target for coating when viewed from the side. The time when the center of the target for coating (the center of width in the to-and-fro direction) passes through the top of the roller is assumed that t=0. Here, a denotes the horizontal width dimension of the target for coating 6, b denotes the width dimension in the movement direction of the target for coating 6, and d denotes the immersion depth of the target for coating 6 in the paste layer 3. The position of each apex of the target for coating 6 when viewed from the side in the coordinate system 1 at t=0 is represented by $x_{p1}$ and $y_{p1}$. Here, $x_{p1}=-b/2$, $y_{p1}=a-d$, $x_{p2}=-b/2$, $y_{p2}=-d$, $x_{p3}=b/2$, $y_{p3}=-d$, $x_{p4}=b/2$, $y_{p4}=a-d$. Therefore, when the immersion depth d changes, $x_{pn}$ and $y_{pn}$ also change.

The coordination system 0 is the orthogonal coordinates of the X axis and the Y axis in which the origin point is the center of the roller 2.

The coordination system 1 is the orthogonal coordinates of the X axis and the Y axis in which the origin point is the paste layer 3 surface on the top (uppermost point) of the roller 2 at t=0.

$\Sigma 0Z1Pn$ represents the length of a line segment Z0Pn projected onto the X axis and the Y axis in the coordination system 0.

$\Sigma 1Z1Pn$ represents the length of a line segment Z0Pn projected onto the X axis and the Y axis in the coordination system 1, that is, the position of Pn in the coordination system 1.

Consequently, the position of the target for coating relative to the paste layer 3 surface on the roller 2 (the position of the target for coating in the coordination system 1) can be represented by $\Sigma 1Z1Pn$.

Regarding Formula (1), $\Sigma 1Z1Pn$ is determined by coordinate transformation of $\Sigma 0Z1Pn$ from the coordination system 0 to the coordination system 1.

That is, Formula (1) is derived as described below.

[Transformation of Z0 coordination system to Z1 coordination system]

$$\sum 1Z1Pn = \begin{pmatrix} \cos\omega t & -\sin\omega t \\ \sin\omega t & \cos\omega t \end{pmatrix} \sum 0Z1Pn \quad \text{Transformaion of } Z0 \text{ coordination system to } Z1 \text{ coordination system}$$

$$= \begin{pmatrix} \cos\omega t & -\sin\omega t \\ \sin\omega t & \cos\omega t \end{pmatrix} \begin{pmatrix} V_1 t - R\sin\omega t + x_{pn} \\ R - R\cos\omega t + y_{pn} \end{pmatrix}$$

$$= \begin{pmatrix} (V_1 t - R\sin\omega t + x_{pn})\cos\omega t - (R - R\cos\omega t + y_{pn})\sin\omega t \\ (V_1 t - R\sin\omega t + x_{pn})\sin\omega t + (R - R\cos\omega t + y_{pn})\cos\omega t \end{pmatrix}$$

$$= \begin{pmatrix} (V_1 t + x_{pn})\cos\omega t - (R + y_{pn})\sin\omega t \\ (V_1 t + x_{pn})\sin\omega t + (R + y_{pn})\cos\omega t - R \end{pmatrix}.$$

Formula (1)

As is clear from Formula (1), the position of the target for coating relative to the paste layer surface is represented by a trajectory with the time t as a parameter, and this trajectory varies with values of $V_1$, R, $\omega$ (in a proportional relationship with $V_2$), $x_{pn}$ and $y_{pn}$. As shown in the preconditions, since $x_{pn}$ and $y_{pn}$ change depending on the dimensions and the immersion depth d of the target for coating 6, the trajectory also varies depending on the dimensions and the immersion depth d of the target for coating 6.

The movement condition of the target for coating relative to the paste surface on the roller is shown in the aforementioned FIG. 3 by using Formula (1). The positions of the target for coating at time t=−0.003 to 0.003 indicated at every 0.001 second are shown as the positions viewed from the side of the target for coating 6.

Next, a method for determining an optimum velocity difference between the movement velocity of the target for coating and the movement velocity of the paste layer surface in movement along the arc-shaped path will be described.

As described above, this optimum velocity difference is the velocity difference at which the horizontal movement quantity of the front side portion and the horizontal movement quantity of the rear side portion of the target for coating relative to the paste become equivalent while the target for coating enters into and leaves the paste layer.

Put another way, in the movement trajectory of the target for coating relative to the paste layer surface, the point of entrance into the paste layer surface and the point of leaving from the paste layer surface are in agreement with each other regarding each of the front and rear ends of the target for coating. This has been verified with simulation by the inventors of the present invention.

Therefore, the movement velocity $V_1$ of the target for coating is arbitrarily set beforehand, the movement trajectories of the front end of the rear end of the target for coating relative to the paste surface are drawn based on calculation, and movement velocity $V_2$ of the paste layer surface at which the position of entrance of the target for coating into the paste layer surface and the position of leaving are in agreement with each other is determined. Consequently, the aforementioned optimum velocity difference can be obtained by determining the velocity ratio $V_2/V_1$ of the movement velocities $V_1$ and $V_2$. Such a velocity ratio $V_2/V_1$ corresponding to the velocity difference is automatically computed by the setting device of the control device when an operator inputs the aforementioned parameters therein.

Figure 5:
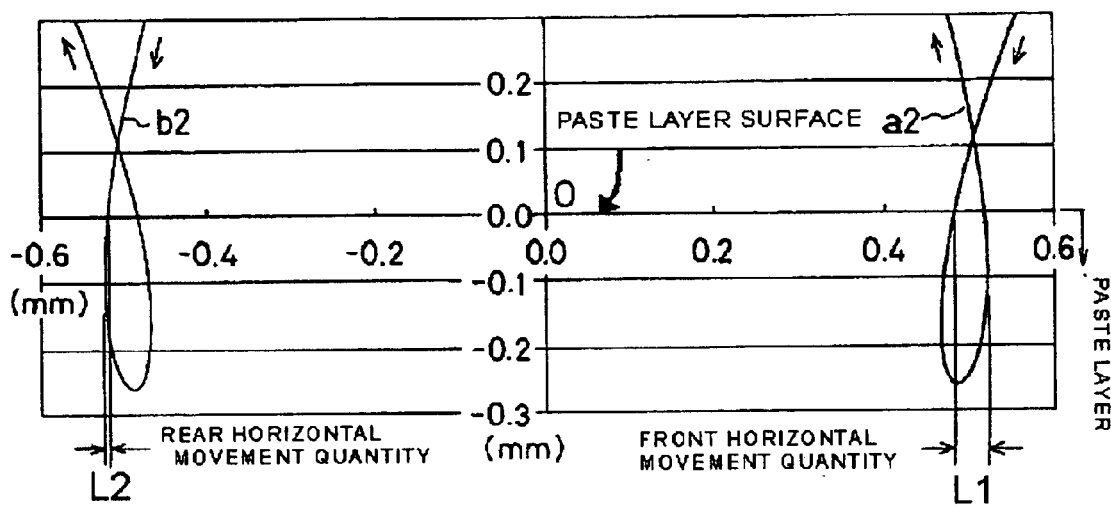
FIG. 5 is a side view showing movement trajectories of a target for coating during conventional application of a paste.

As a comparative example, FIG. 5 shows a relative movement path of the target for coating relative to the specific point on the paste layer surface when the movement velocity of the target for coating 6 and the movement velocity of the paste layer surface are set at the same velocity.

As was described in the aforementioned problems to be overcome with reference to the same FIG. 5, the horizontal movement quantity L1 of the front side portion and the horizontal movement quantity L2 of the rear side portion of the target for coating while the target for coating enters into and leaves the paste layer become in the relationship L1>L2 as shown in FIG. 5 and, therefore, the quantity of the paste applied to the front becomes larger than that applied to the rear, so that unevenness occur in the quantities of the paste applied to the front and rear.

As described above, the aforementioned velocity difference is set based on the distance R between the roller center and the paste layer surface, the immersion depth d of the target for coating in the aforementioned paste layer (the immersion depth in time when the target for coating reaches the lowermost point), and the width dimension b in the movement direction of the aforementioned target for coating. Even when those parameters, R, d, and b are different from those in the aforementioned embodiment, an optimum velocity difference can be determined by calculation and, therefore, the movement velocity $V_1$ of the target for coating and the movement velocity $V_2$ of the paste layer surface are set by the setting device in order that the optimum velocity difference is established. Specific example thereof is shown in Table 1. The velocity difference is indicated as $V_2/V_1$.

TABLE 1

| R | b | Velocity difference ($V_2/V_1$) | | |
| --- | --- | --- | --- | --- |
| | | d = 0.25 | d = 0.5 | d = 0.75 |
| R = 5 | b = 0.2 | 1.017 | 1.035 | 1.053 |
| R = 5 | b = 1.0 | 1.013 | 1.031 | 1.050 |
| R = 10 | b = 0.2 | 1.008 | 1.017 | 1.026 |
| R = 10 | b = 1.0 | 1.008 | 1.016 | 1.025 |
| R = 20 | b = 0.2 | 1.004 | 1.008 | 1.013 |
| R = 20 | b = 1.0 | 1.004 | 1.008 | 1.012 |

R: distance between roller center and paste surface (mm)
b: dimension in movement direction of target for coating (mm)
d: immersion depth in paste layer (mm)

The present invention is not limited to the aforementioned embodiment, and, for example, the following modified examples can also be performed.

Figure 6:
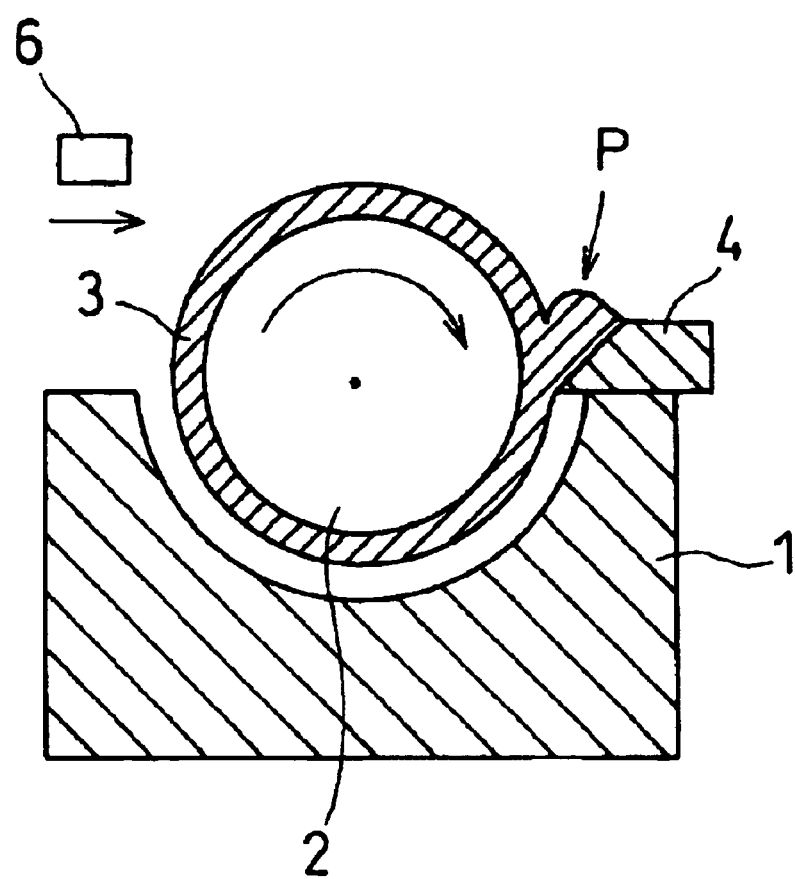
FIG. 6 is a vertical side view showing a paste application apparatus according to another embodiment.

(1) In the aforementioned embodiment, the paste layer was applied to the surface of the rotating roller. However, for example, regarding the form of supply of the paste, in addition to the form in which the paste is stored in the paste bath, and is hoisted up by the roller and is supplied as shown in FIG. 1, the supply portion may be configured in order that a paste P is stored on the upper portion of a squeegee 4 as a layer thickness adjustment portion and, therefore, the paste can be adhered and supplied to a roller surface as shown in FIG. 6.

Furthermore, as the layer thickness adjustment portion, a roller capable of keeping the layer thickness of the paste layer constant may be used instead of the squeegee.

Figure 7:
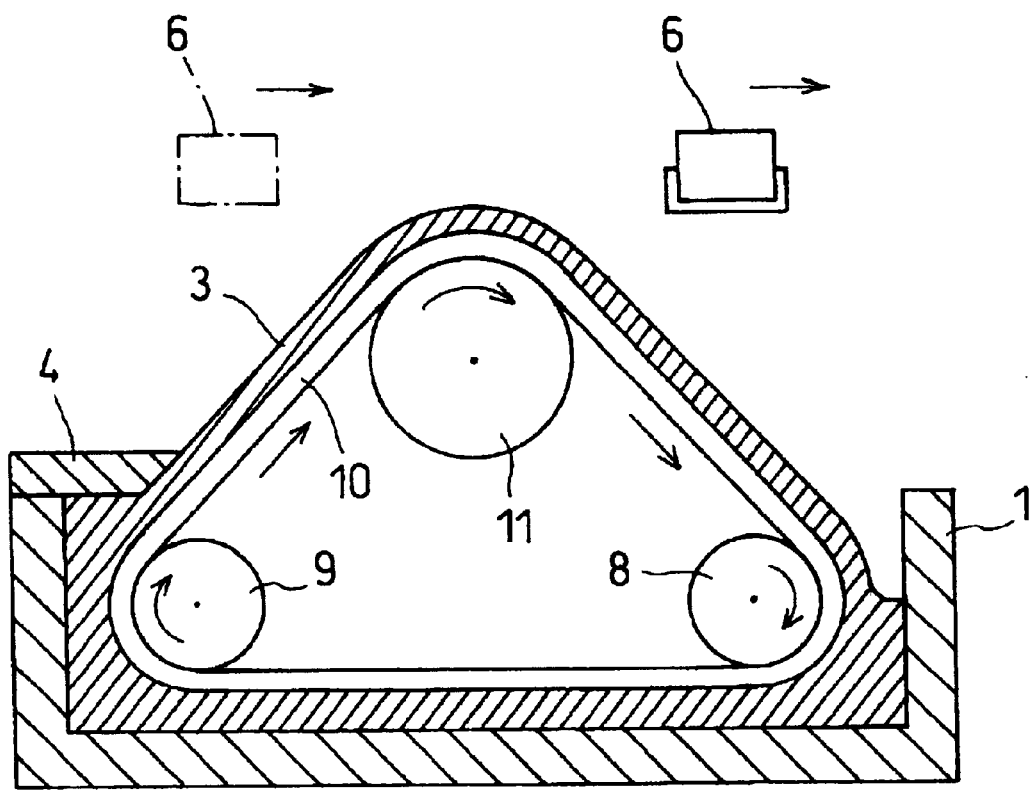
FIG. 7 is a vertical side view showing a paste application apparatus according to another embodiment.
Figure 8:
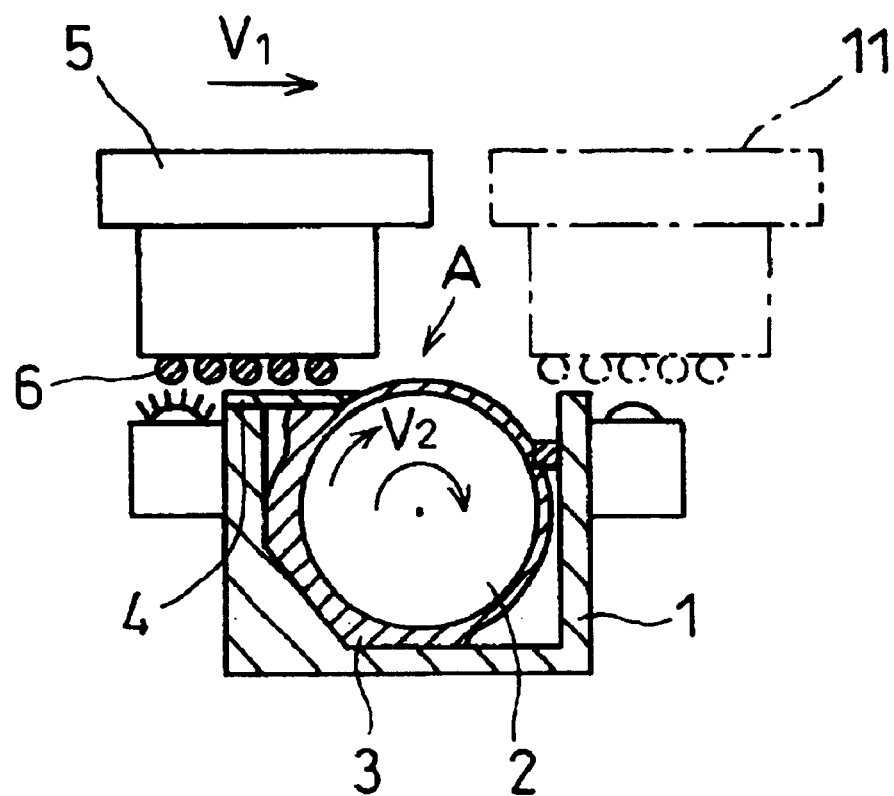
FIG. 8 is a vertical side view showing an example of a conventional paste application apparatus.
Figure 9:
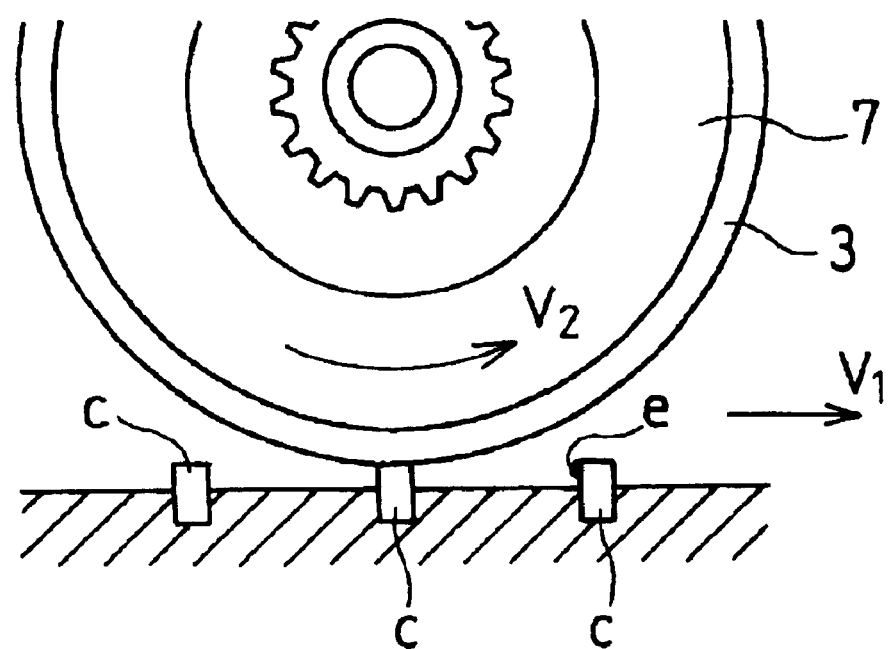
FIG. 9 is a vertical side view showing another example of a conventional paste application apparatus.

(2) In the aforementioned embodiment, the roller was used as a substrate constituting the coating applicator. However, for example, as shown in FIG. 7, the coating applicator may be configured in a manner that a belt 10 as a substrate which is looped over a driving roller 8 and a driven roller 9 and which is driven to rotate at a constant speed is applied with a paste stored in a paste bath 1 on the surface thereof and is hoisted up, the paste layer 3 adhered is allowed to have a constant thickness by scraping in midway with a squeegee 4, and the belt 10 can be moved along an arc-shaped movement path by a freely rotating roller 11 arranged at an intermediate position. In this configuration, the paste of the paste layer on the belt 10 surface can be applied to the target for coating 6 by moving the target for coating 6 along the horizontal direction in the arc-shaped movement path thereof. In this case as well, a velocity difference is set between the movement velocity of the target for coating 6 and the movement velocity of the paste layer surface of the belt 10 surface in the arc-shaped movement path and, therefore, the quantities of application to the front and rear of the target for coating 6 are adjusted to become identical.

Figure 10:
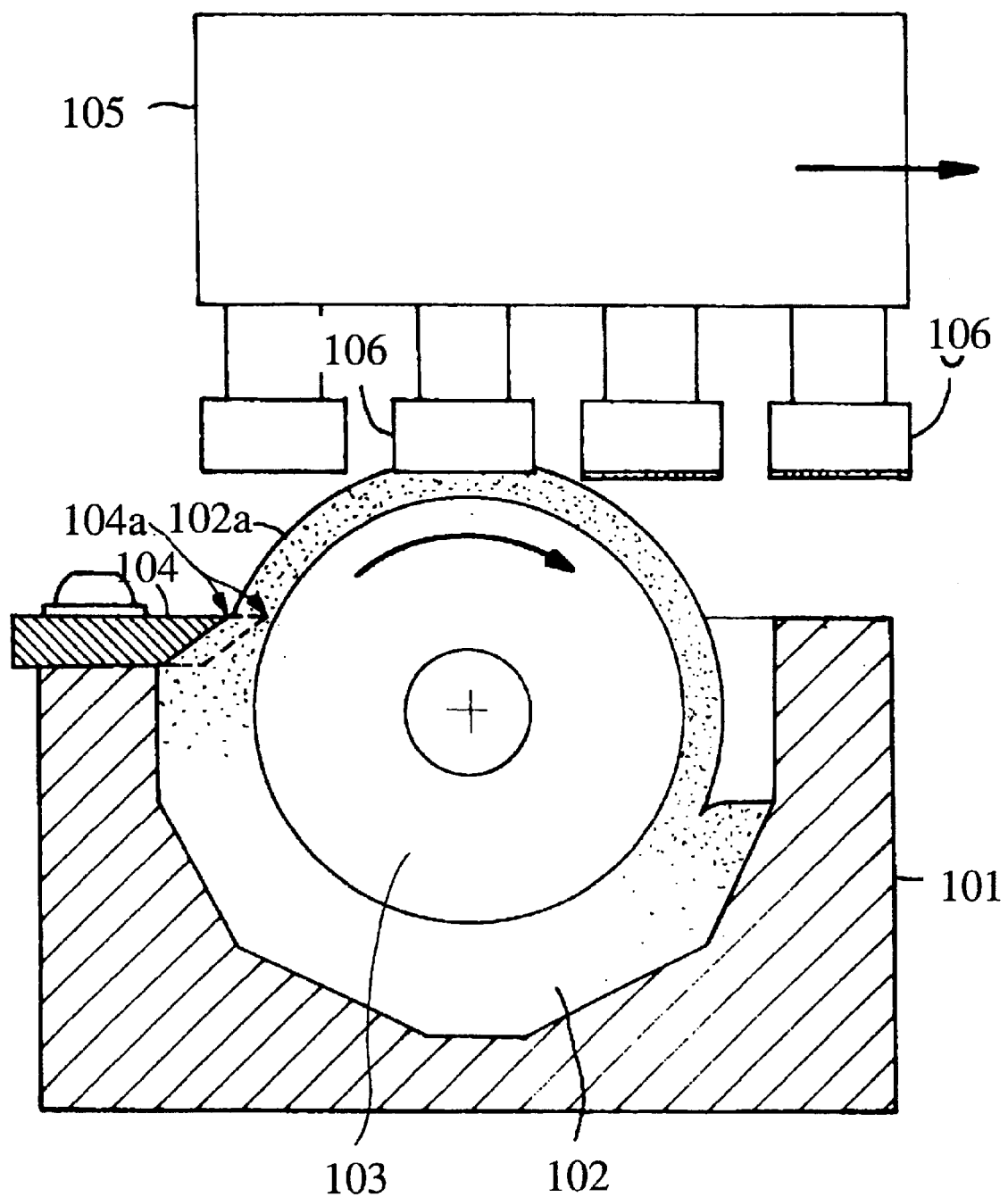
FIG. 10 is a vertical side view schematically showing a paste application apparatus according to a second embodiment of the present invention.

FIG. 10 shows a schematic side view of a paste application apparatus according to a second embodiment of the present invention. This paste application apparatus is configured in order that a paste 102, for example, an adhesive, a conductive adhesive, and flux, stored in a paste bath 101 is hoisted up with a coating roller 103 driven to rotate in a constant direction at a constant speed, an excess portion of the paste is scraped off with a squeegee 104 as a paste layer formation member fixed at the top end of the paste bath 101 so as to form a paste layer 102a having a predetermined thickness on the roller perimeter, the bottom surface of the target for coating 106 which is adsorbed and held by a adsorption head 105 and which passes and moves in the neighborhood of the top of the roller at a predetermined velocity is immersed in and brought into contact with the paste layer 102a on the roller perimeter and, therefore, the paste layer 102a is transferred and applied to the target for coating 106.

Figure 11:
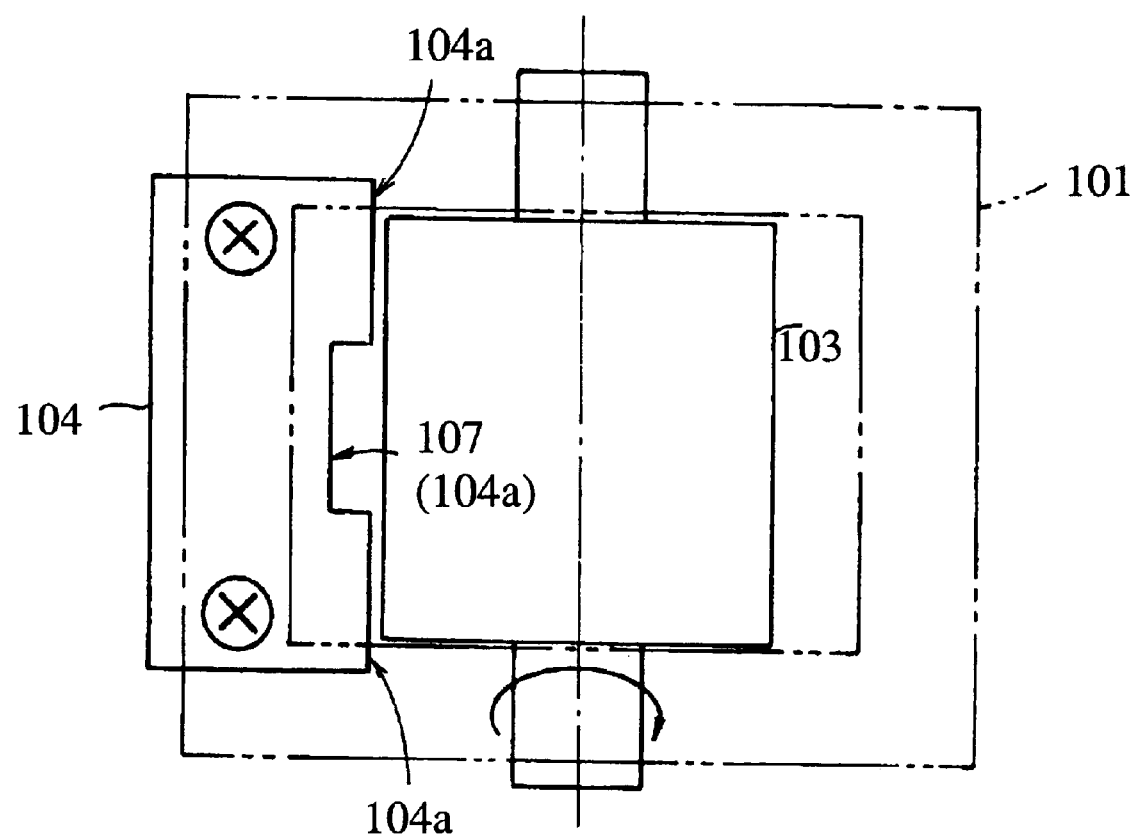
FIG. 11 is a plan view of the key portion.
Figure 12:
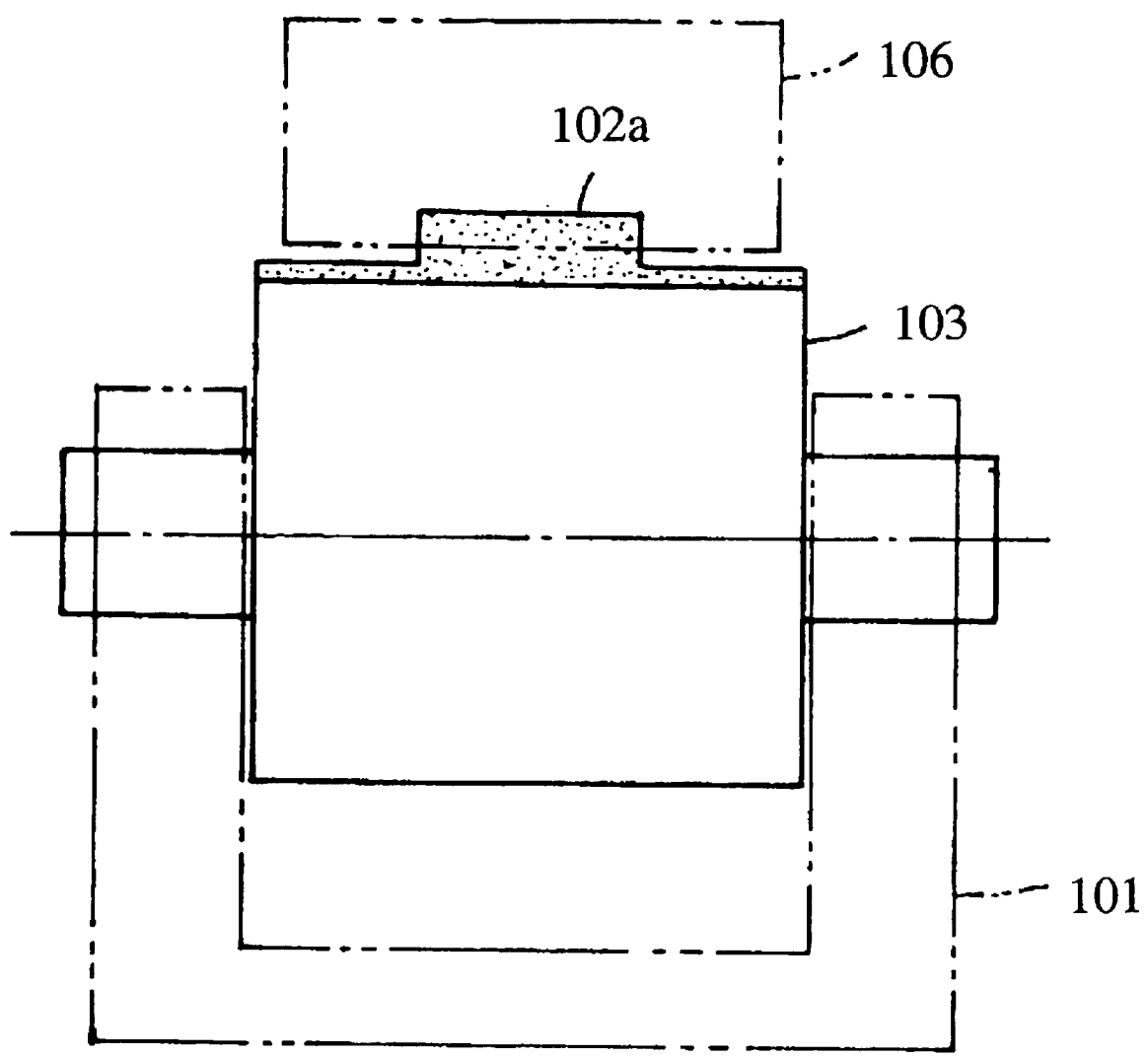
FIG. 12 is a vertical front view of the key portion.

As shown in FIG. 11 and FIG. 12, the width in the axis center direction of the aforementioned coating roller 103 is specified to be larger than the coating width, a rectangular concave portion 107 is arranged at the tip portion of the aforementioned squeegee 104, the edges of this concave portion and end edges of the tip which are not the concave portion 107 constitute scraping edges 104a for scraping off the paste and, therefore, the paste layer 102a having a small width corresponding to the width of the concave portion 107 is formed on the perimeter of the coating roller 103.

As described above, the target for coating 106 is immersed in and brought into contact with the paste layer 102a formed on the intermediate portion in the roller width direction by scraping with the squeegee 104 and, therefore, the paste layer 102b is transferred and applied to the target for coating 106 with a width corresponding to the width of this paste layer 102a.

The present invention can also be performed in the following forms.

Figure 13A:
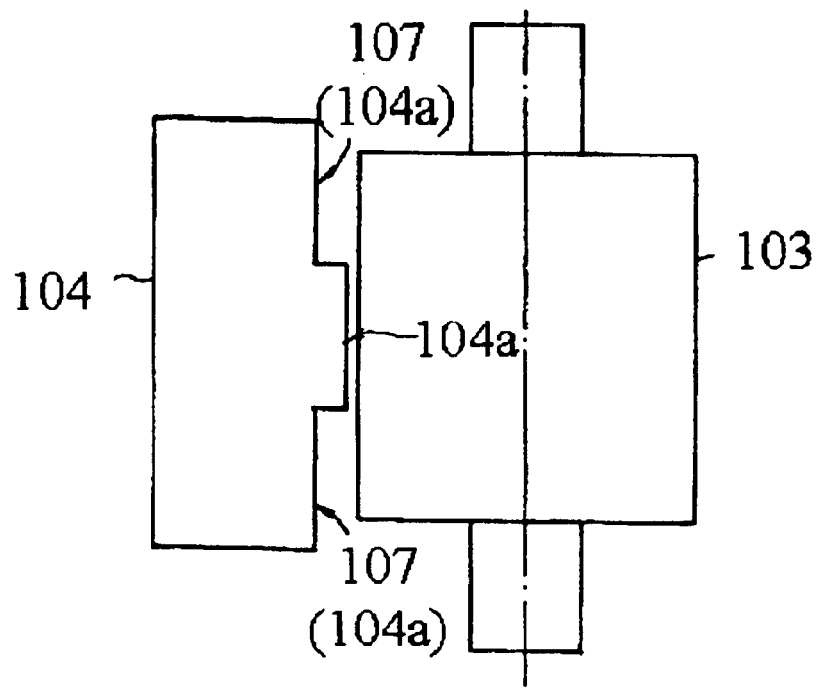
FIG. 13A is a plan view of the key portion of an embodiment using another squeegee.
Figure 13B:
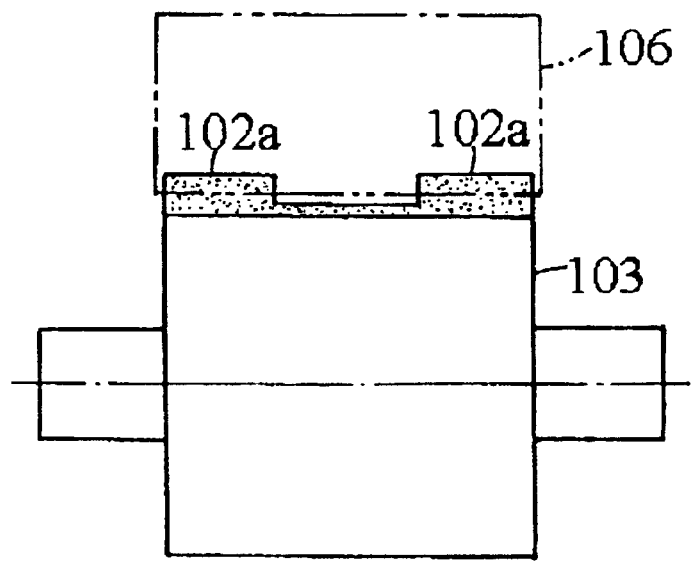
FIG. 13B is a vertical front view thereof.
Figure 14A:
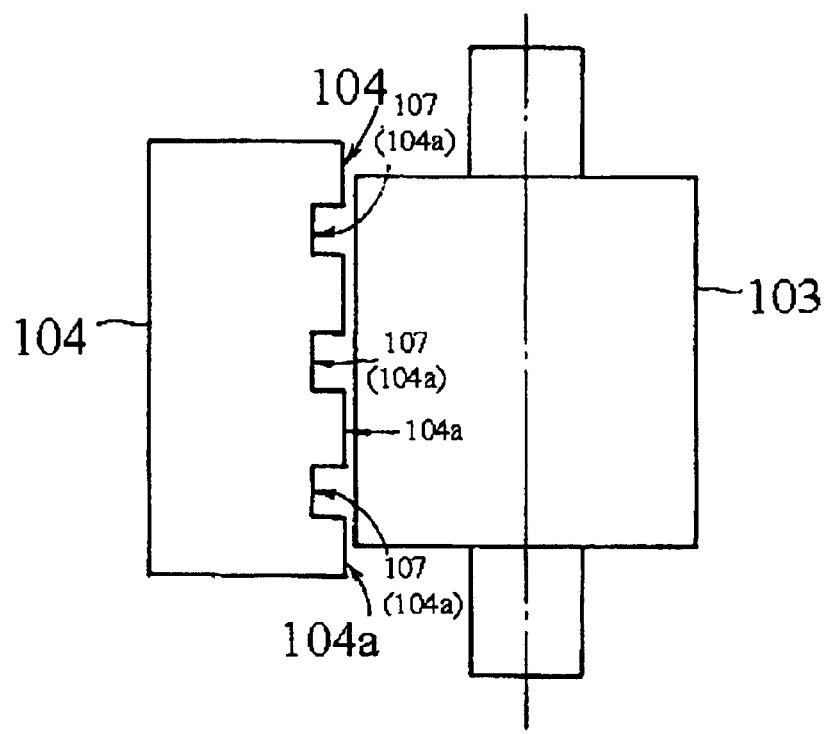
FIG. 14A is a plan view of the key portion of an embodiment using another squeegee.
Figure 14B:
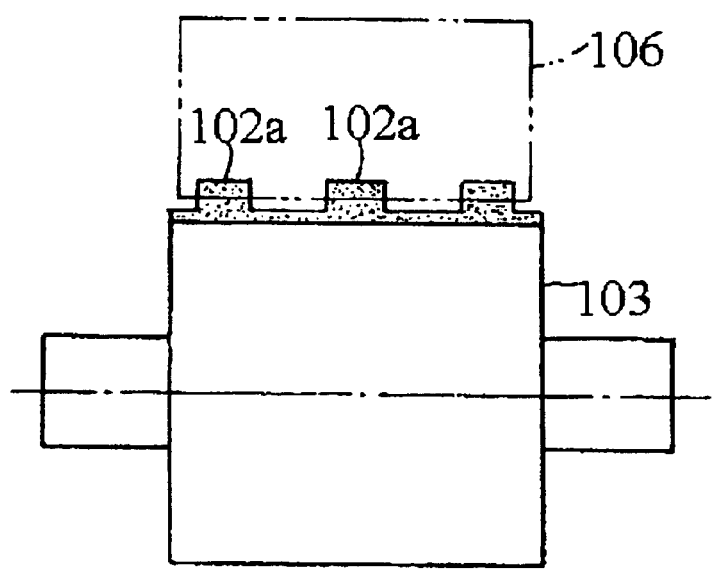
FIG. 14B is a vertical front view thereof.

(1) As shown in FIG. 13A, concave portions 107 are formed at both end portions in the width direction of the tip of the squeegee 104, scraping edges 104a are formed at the end edges thereof and, therefore, as shown in FIG. 13B, paste layers 102a having a small width are formed at both end portions of the perimeter of a coating roller 103, and can be applied to both ends of a target for coating 106. Furthermore, as shown in FIG. 14A, concave portions 107 having a small width are formed in parallel at three or more portions in the width direction of the tip of the squeegee 104, scraping edges 104a are formed at individual end edges and, therefore, as shown in FIG. 14B, a plurality of paste layers 102a having a small width are formed in parallel on the perimeter of a coating roller 103, and can be applied to a plurality of portions of a target for coating 106 simultaneously.

Figure 15A:
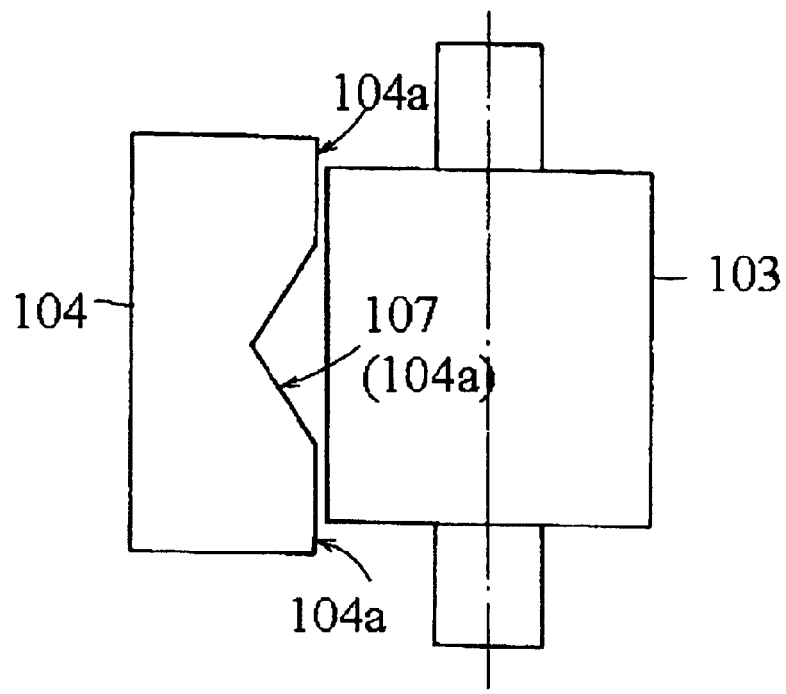
FIGS. 15A and 15B are plan views of the key portions showing other examples of squeegees.
Figure 15B:
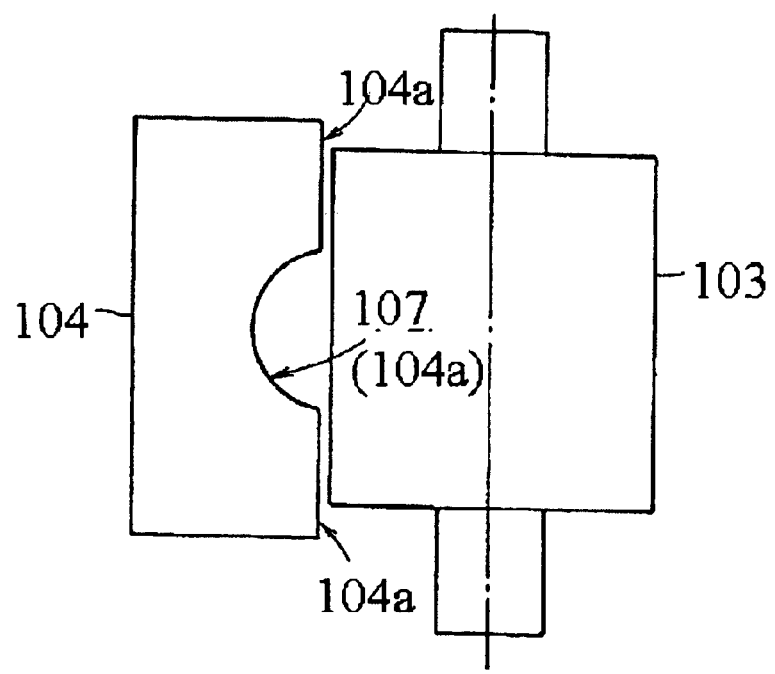

(2) The concave portion 107 formed at the tip of the squeegee 104 is not limited to have a rectangular cross-sectional shape. For example, it may be formed to have a cross section in the shape of a chevron as shown in FIG. 15A, or be formed to have a cross section in the shape of a semicircle as shown in FIG. 15B. Consequently, the paste layer 102a having an arbitrary cross-sectional shape can be formed on the perimeter of the coating roller 103, and the end edges thereof constitute the scraping edges 104a for scraping off the paste.

Figure 16A:
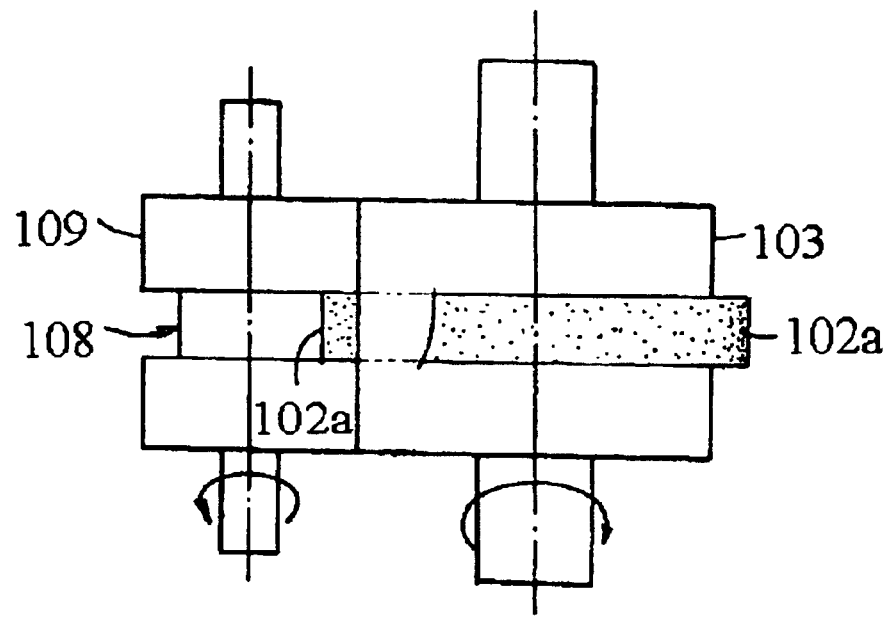
FIG. 16A is a plan view of the key portion of an embodiment using a rotary roller for a paste layer formation member.
Figure 16B:
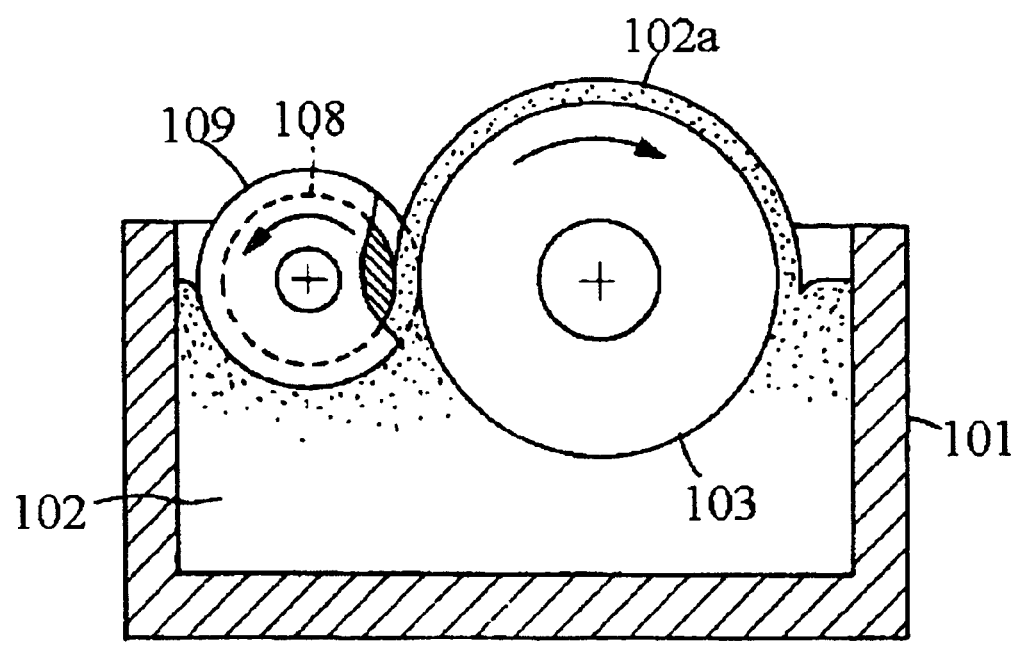
FIG. 16B is a vertical side view thereof.

(3) As shown in FIGS. 16A and 16B, a rotary roller 109 provided with a circular concave groove 108 having an arbitrary cross-sectional shape on the perimeter is used as a paste layer formation member and, therefore, the paste layer 102a having a small width can be formed on the perimeter of the coating roller 103. In this case, the rotary roller 109 is brought into contact with the coating roller 103 while being free to idle, or is brought into contact with the coating roller 103 while being driven in the reverse direction at a circumferential velocity nearly equivalent to the circumferential velocity of the coating roller 103 and, therefore, the rotary roller 109 is brought into rolling contact with the coating roller 103 with almost no friction so as to completely remove an excess portion of the paste and to form only a paste layer 102a having a desired width and thickness on the coating roller 103.

Figure 17A:
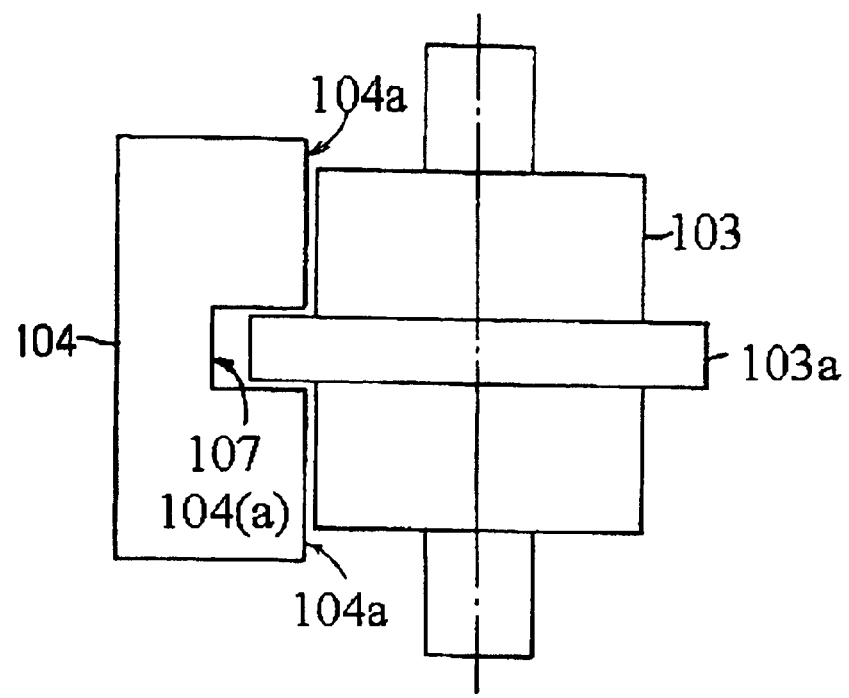
FIG. 17A is a plan view of the key portion of another embodiment.
Figure 17B:
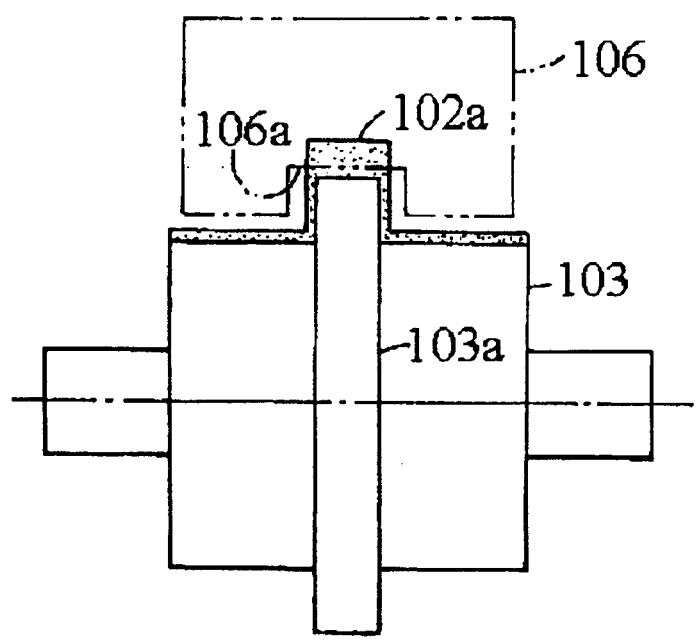
FIG. 17B is a vertical front view thereof.

(4) As shown in FIG. 17A, a circular convex thread 103a is arranged on the perimeter of the coating roller 103 and, in addition, a deep concave portion 107 to be fitted with the aforementioned circular convex thread 103a is arranged in a scraping edge 104a of a squeegee 104 and, therefore, as shown in FIG. 17B, a paste layer 102a having a desired thickness can be formed on the perimeter of the circular convex thread 103a of the coating roller 103. The target for coating 106 is brought close to the coating roller 106 in order to allow the circular convex thread 103a of the coating roller 103 to fit into the concave portion 106a of the target for coating 106 and, therefore, the paste can be transferred and applied to the bottom of the concave portion 106a of the target for coating 106 with a desired width.

Figure 18:
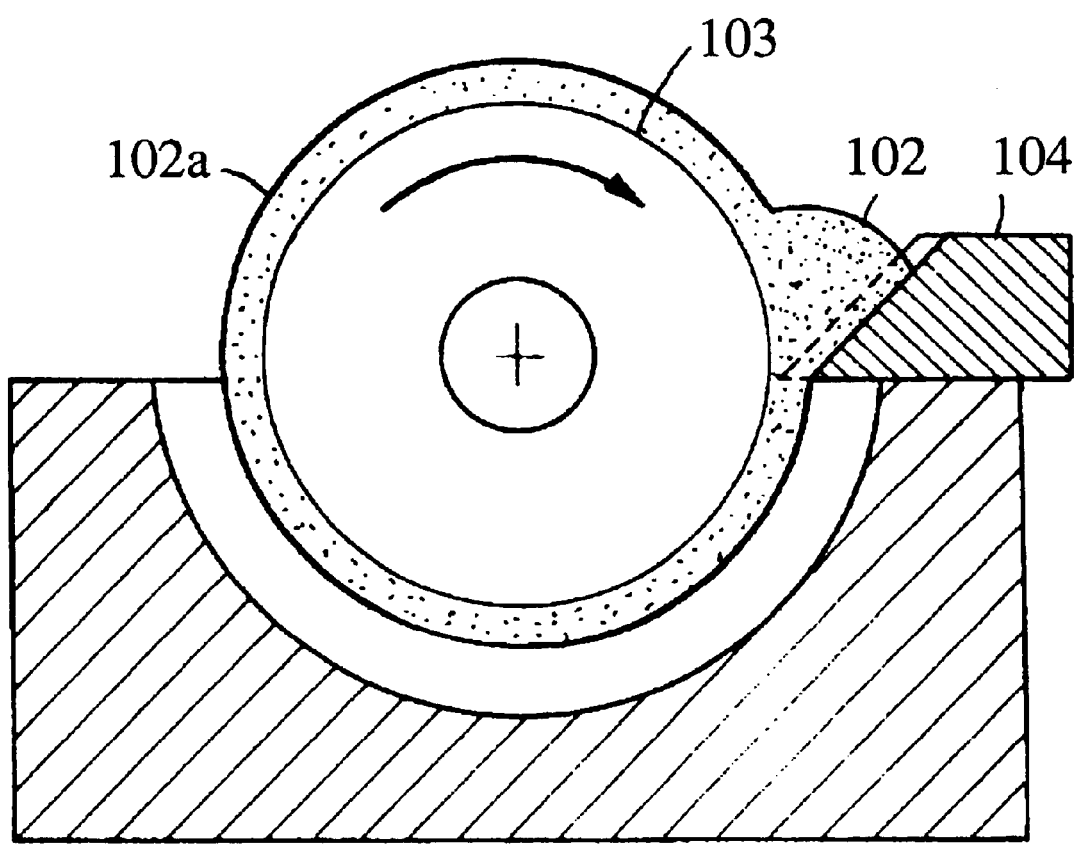
FIG. 18 is a vertical side view of the key portion showing another paste supply device.

(5) Regarding the means for supplying the paste to the perimeter of the coating roller 103, in addition to the form in which the paste stored in the paste bath 101 is hoisted up as described above, it is possible to perform in a form in which a paste 102 is stored on a squeegee 104 as shown in FIG. 18.

(6) A paste application apparatus shown in FIGS. 19A, 19B, FIG. 20, and FIGS. 21A, 21B is provided with structures similar to those in the aforementioned (5), and the similar structures are denoted by the same reference numeral.

This paste application apparatus is configured in order that a paste 102, for example, an adhesive, a conductive adhesive, and flux, stored in a paste bath 101 is hoisted up with a coating roller 103 driven to rotate in a constant direction at a constant speed, an excess portion of the paste is scraped off with a squeegee 114 as a paste layer formation member fixed at the top end of the paste bath 101 so as to form a paste layer 102a having a predetermined cross-sectional shape on the roller perimeter, a part of the bottom surface of the target for coating 106 which is adsorbed and held by a adsorption head 105 and which passes and moves in the neighborhood of the top of the roller at a predetermined velocity is immersed in the paste layer 102a on the roller perimeter and, therefore, the paste layer 102a is transferred and applied to the target for coating 106.

Figure 19A:
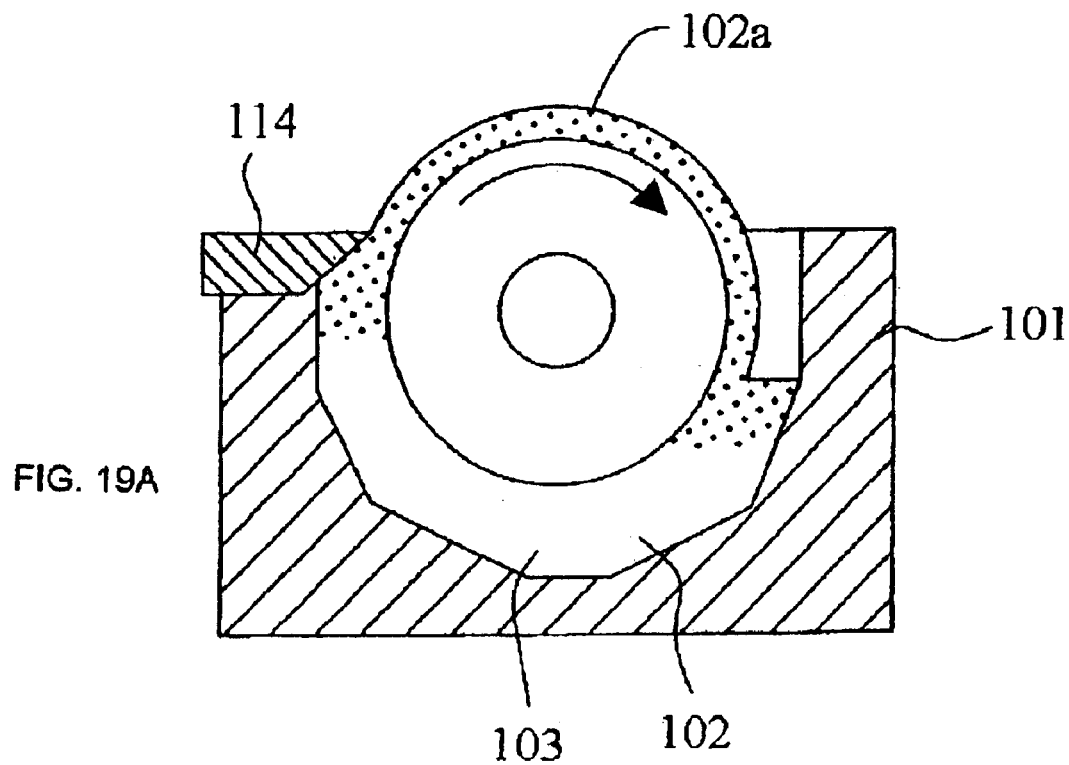
FIG. 19A is a vertical side view schematically showing a paste application apparatus of another embodiment.
Figure 19B:
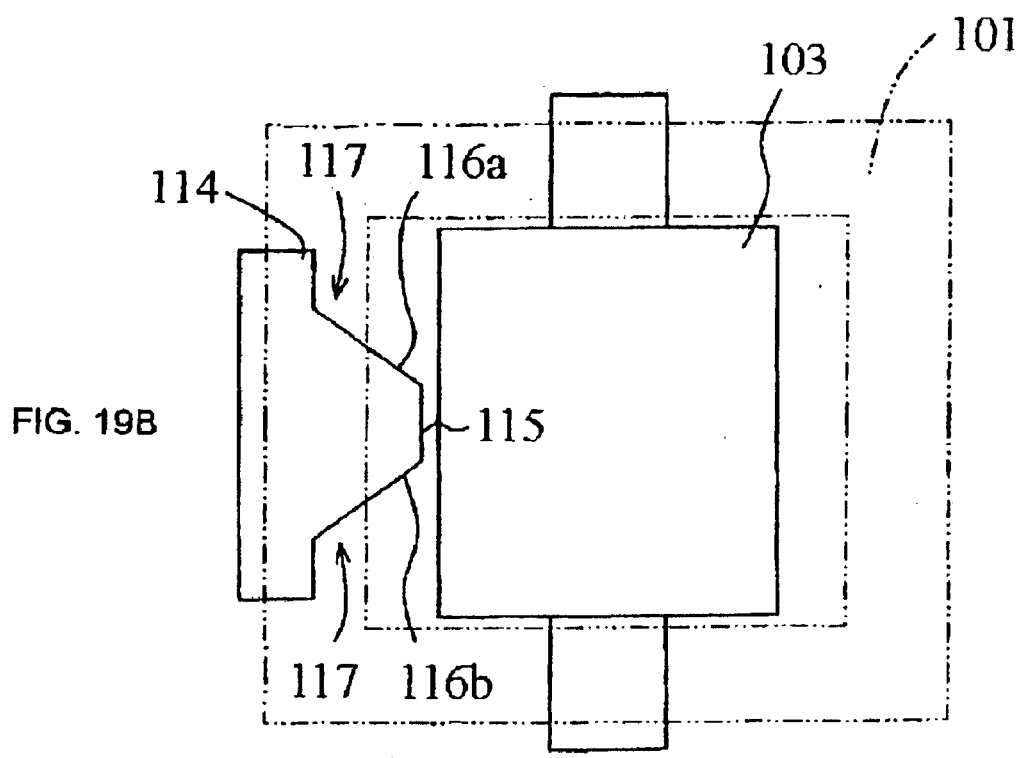
FIG. 19B is a schematic plan view thereof.

For details, as shown in FIG. 19B, the coating roller 103 is in the shape of a cylinder, and regarding the shape of the tip portion of the squeegee 114 in the plan view, a taper portion is arranged nearly at the center portion in the width direction, while the taper portion is protruding toward the coating roller 103 side. The tip edge of this taper portion constitutes a straight-line portion 115 nearly parallel to the axis center of the coating roller 103. At both ends of this straight-line portion 115 in the axis direction, inclined edges 116a and 116b inclining relative to the axis direction are formed while growing away from the coating roller 103. These inclined edges 116a and 116b and the straight-line portion 115 constitute the shape of a trapezoid in the plan view, and the portions where these inclined edges 116a and 116b are formed constitute individually concave portions 117 and 117.

Figure 21A:
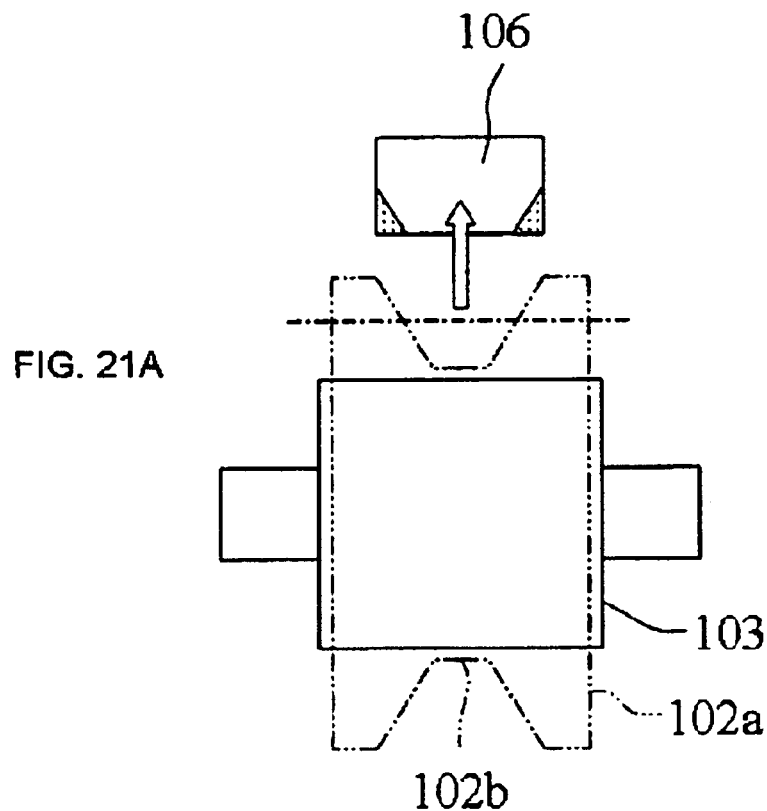
FIGS. 21A and 21B are front views showing the manner of immersion of a target for coating in a paste layer of the paste application apparatus shown in FIGS. 19A and 19B.
Figure 21B:
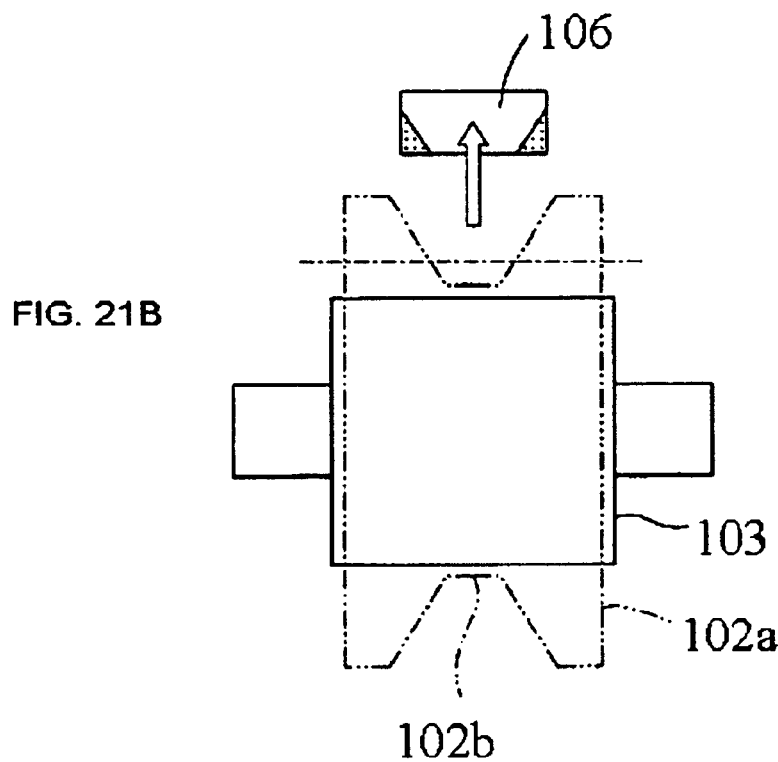

According to this squeegee 114, the cross-sectional shape of the paste layer 102a becomes as shown in FIGS. 21A and 21B. That is, regarding the perimeter surface of the coating roller 103, the thickness of the paste layer 102a is increased in the neighborhood of both ends in the axis direction, the thickness of the paste layer 102a is decreased in the portion near the center, and the portions between this portion near the center and both ends in the axis direction are inclined surfaces where the thickness of the paste layer 102a is increased gradually.

When the paste is applied to the target for coating 106, the target for coating 106 is held with an adsorption type head (not shown in the drawing), and the target for coating 106 is moved horizontally at a position of a predetermined height together with the head. Examples thereof are individually shown in FIGS. 21A and 21B. Regarding FIG. 21A, the target for coating 106 moves at a position (indicated by alternate long and short dashed lines in the drawing) relatively higher than the top of the coating roller 103 and, therefore, the quantity of immersion of the target for coating 106 in the paste layer 102a is relatively small. Regarding FIG. 21B, the target for coating 106 moves at a position (indicated by alternate long and short dashed lines in the drawing) nearer to the top of the coating roller 103 and lower than that in the case of FIG. 21A and, therefore, the quantity of immersion of the target for coating 106 in the paste layer 102a is larger than that in the case of FIG. 21A. According to this, adjustment of the quantity of application, etc., can be performed by only adjusting the height of movement of the target for coating 106. Even when the dimensions of the target for coating 106 are changed, adjustment of the quantity of application, etc., can be performed by appropriately changing the height of movement of the target for coating 106.

In this case, regarding inclination, the cross section of the inclined surface is represented by a straight line. However, the cross section may be represented by a curve.

Figure 20:
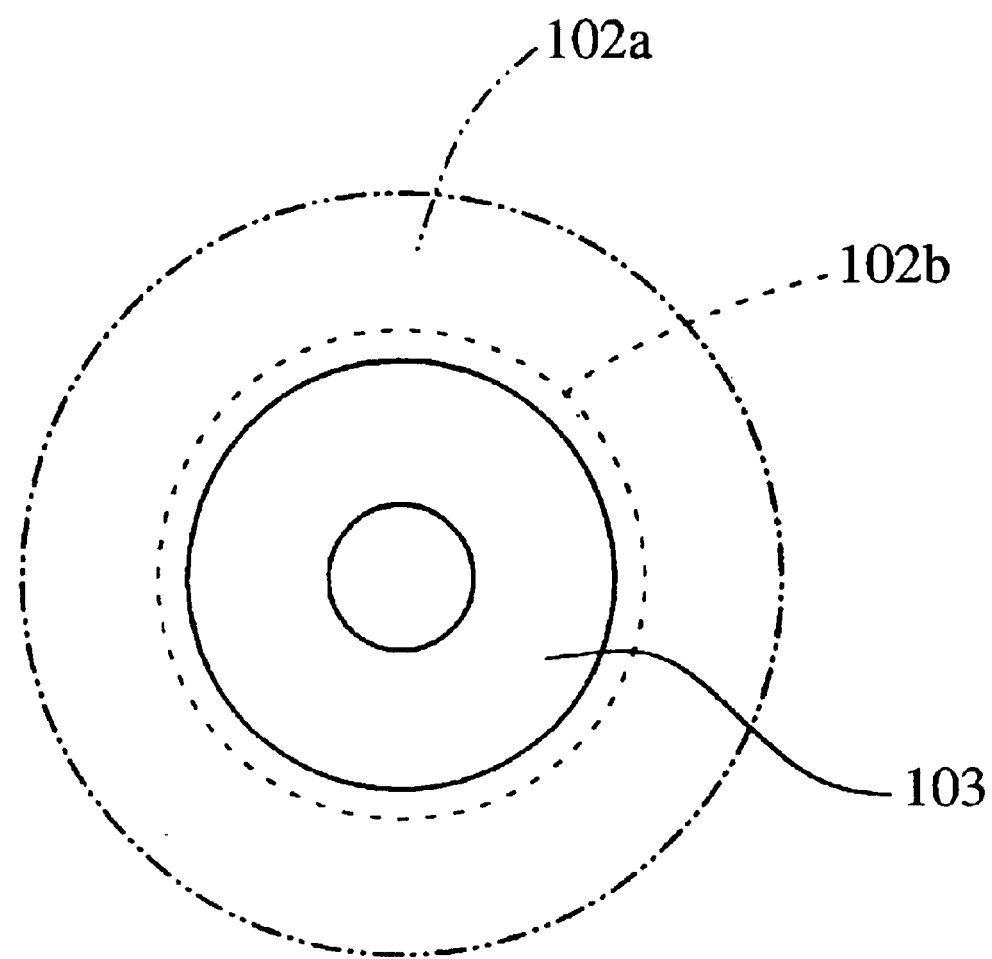
FIG. 20 is a side view of the paste application apparatus shown in FIGS. 19A and 19B showing the condition that a paste layer is arranged hypothetically on all over the perimeter.

FIG. 20 is a side view showing a hypothetical condition that the paste layer 102a is arranged on all over the perimeter of the coating roller 103. In the drawing, a broken line indicates a bottom portion of the cylindrical groove arranged by forming a concave in the paste layer 102a with the squeegee 114.

Figure 22A:
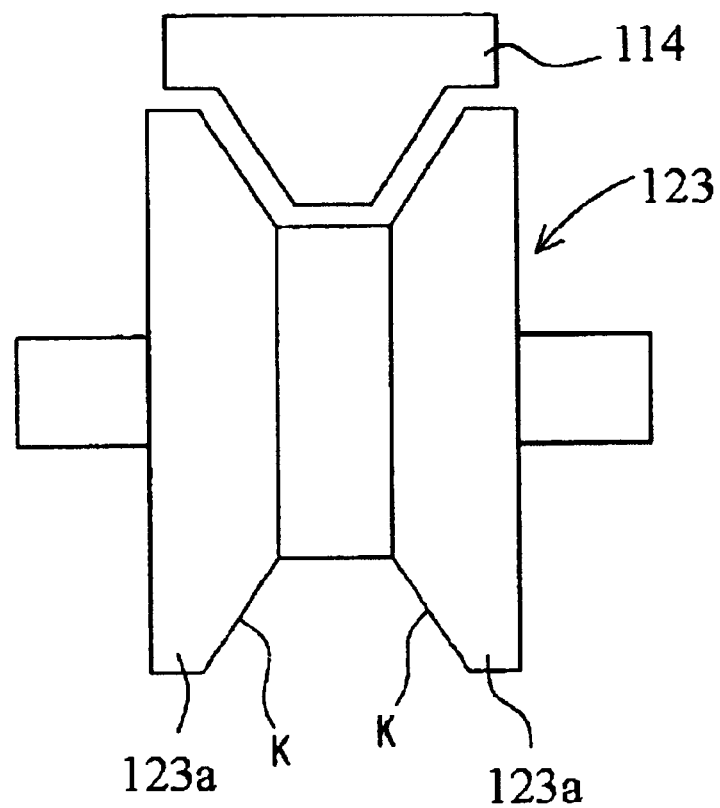
FIG. 22A is a schematic plan view showing a paste application apparatus of another embodiment.
Figure 22B:
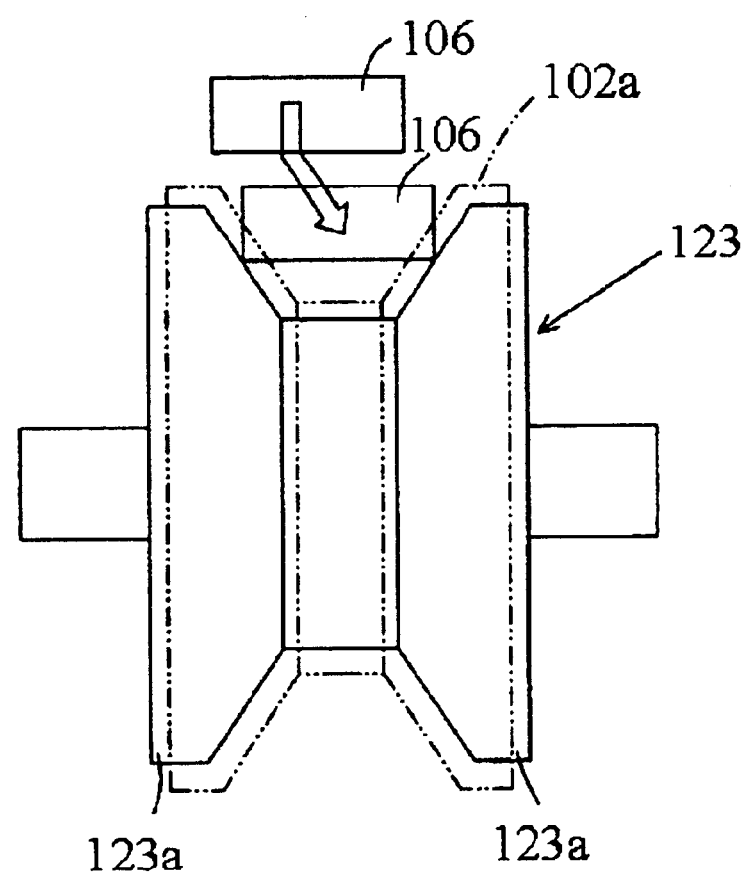
FIG. 22B is a schematic front view thereof showing the manner of application of a paste to a target for coating.

(7) As shown in FIGS. 22A and 22B, a coating roller 123 is not in the shape of a cylinder in contrast to that shown in FIG. 6, but is in the shape of a reel. That is, regarding the coating roller 123, the outer diameter thereof is increased at both ends in the axis direction, and the outer diameter thereof is decreased at the portion near the center in the axis direction. The portions having a large outer diameter at both ends in the axis direction in the coating roller 123 are circular convex threads 123a and 123a in the shape protruding outward in the diameter direction all over the perimeter. The side surfaces on the center side in the axis direction of these circular convex threads 123a and 123a are inclined surfaces K and K, respectively, having a diameter that decreases as the center in the axis direction approaches. On the other hand, the shape of the squeegee 124 is in the condition that the portion near the center in the axis direction is protruded in accordance with the shape of the perimeter of the coating roller 123. This shape has a configuration (refer to FIG. 22A) similar to that in the embodiment of the aforementioned (6).

As shown in FIG. 22B, in this embodiment, since a pair of inclined surfaces K and K are arranged on the coating roller 123 side and constitute the shape of a trough, when the target for coating 106 is moved in the condition of being adsorbed by the head (not shown in the drawing), and the position of the target for coating 106 is somewhat deviated in the axis direction relative to the head, an edge on the deviation side is initially brought into contact with one inclined surface K. Accompanying the contact, the target for coating 106 is moved horizontally while being adsorbed and held by the head 105, the other edge of the target for coating 106 is brought into contact with the other inclined surface K and, therefore, the horizontal movement is also restricted. Consequently, the deviation of the position is corrected in order that the position becomes suitable for excellent application of the paste. According to this, for example, when the target for coating 106 is a chip component in the shape of a rectangular parallelepiped, the bottom surface and the side surfaces of both end portions of the target for coating 106 can be coated with the paste by being immersed in the paste layer 102a on the surfaces of the inclined surfaces K and K of the circular convex threads 123a and 123a.

Figure 23A:
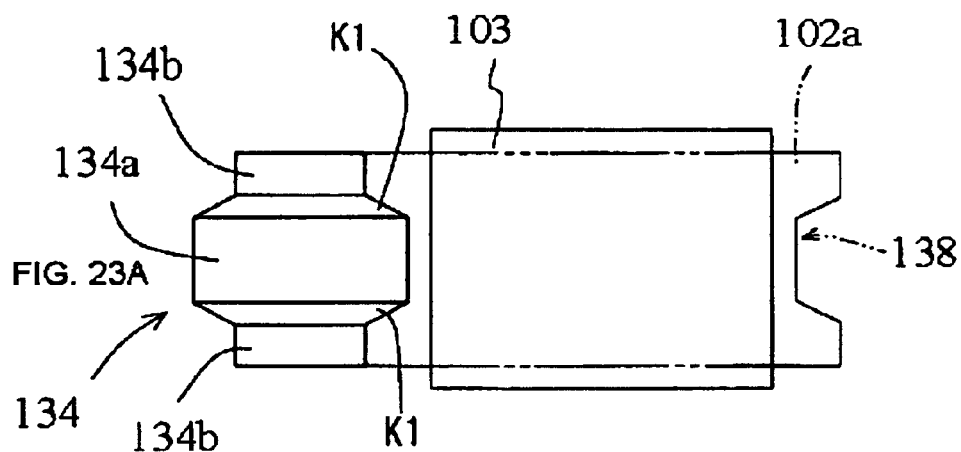
FIG. 23A is a schematic plan view showing a paste application apparatus of another embodiment.
Figure 23B:
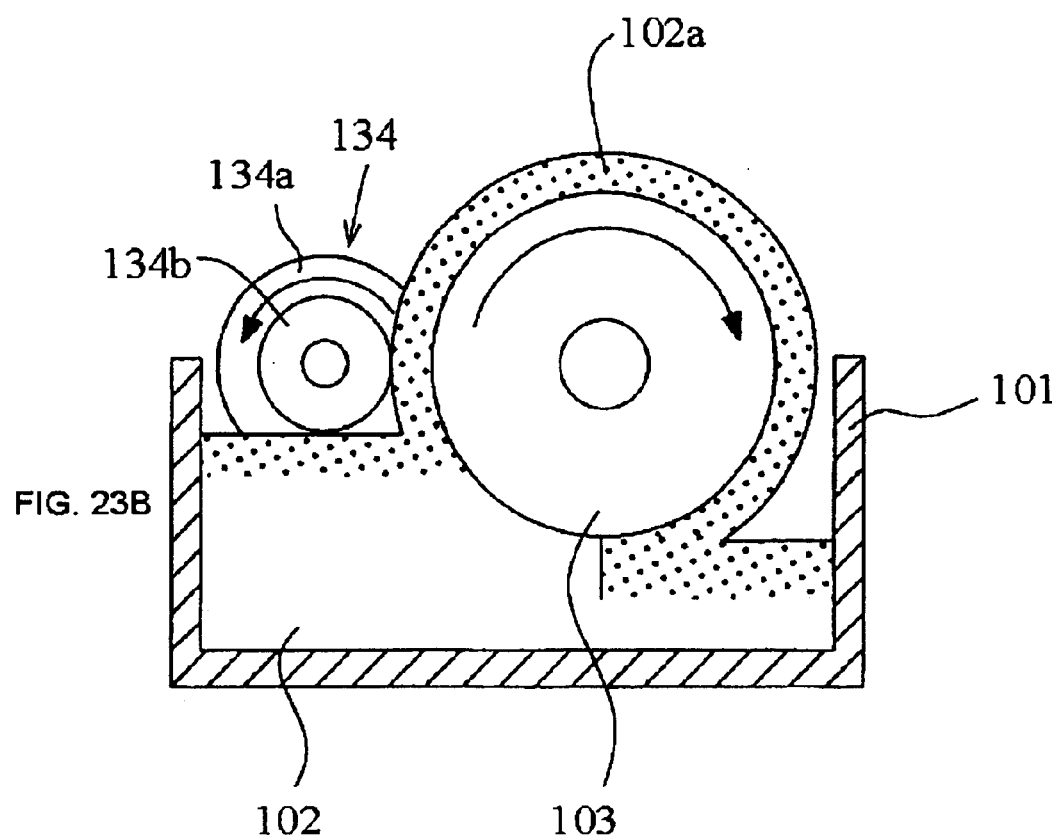
FIG. 23B is a schematic vertical side view thereof.
Figure 24A:
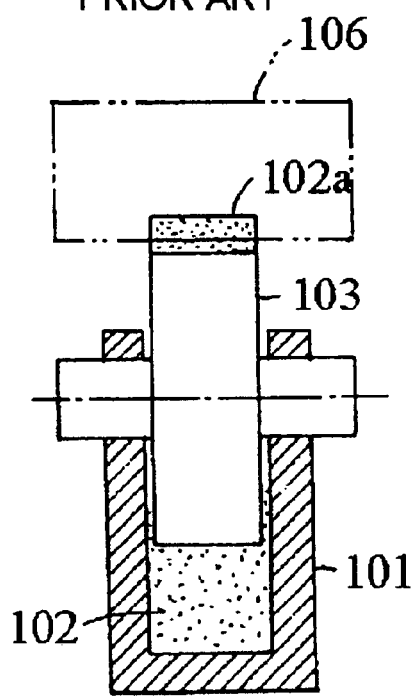
FIGS. 24A and 24B are vertical front views showing a conventional paste application apparatus.
Figure 24B:
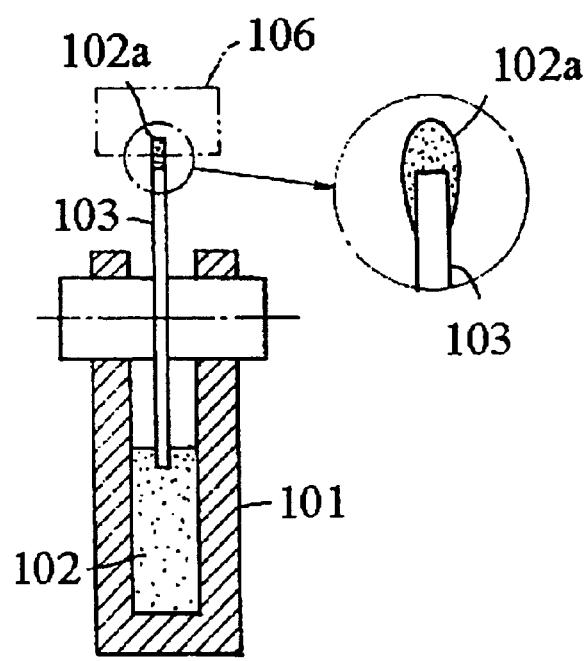

(8) As shown in FIGS. 23A and 23B, in this embodiment, an excess portion of the paste is scraped off with the roller 134 instead of the squeegee so as to put in order the shape of the paste. In the roller 134, the center portion in the axis direction is a large-diameter portion 134a, and both end portions in the axis center direction are small-diameter portion 134b and 134b. The side surfaces of the large-diameter portion are inclined surfaces K1 and K1. On the other hand, a coating roller 103 is in the shape of a cylinder. According to this, the shape of a paste layer formed on the perimeter surface of the coating roller 103 is a circular concave groove 138 in which the center portion in the axis direction is concave all over the perimeter as shown in FIG. 23A.

The roller 134 is also driven to rotate together with the coating roller 103 and, therefore, the paste layer having a predetermined cross-sectional shape is formed on the coating roller 103 while the excess portion of the paste is removed by the roller 134.

This roller 134 is not limited to driven to rotate, and may be fixed not to rotate, or be free to idle.

The target for coating 106 is allowed to horizontally pass the circular concave groove 138 of the paste layer 102a on the coating roller 103 in the condition of being adsorbed and held by the head 105. The inner side surfaces of the circular concave groove 138 are inclined surfaces inclining so as to expand outward, and when both end portions of the target for coating pass therethrough, both end portions are immersed in the respective inner side surfaces of the circular concave groove 138 and, therefore, the paste is applied to each of the portions.

Figure 25:
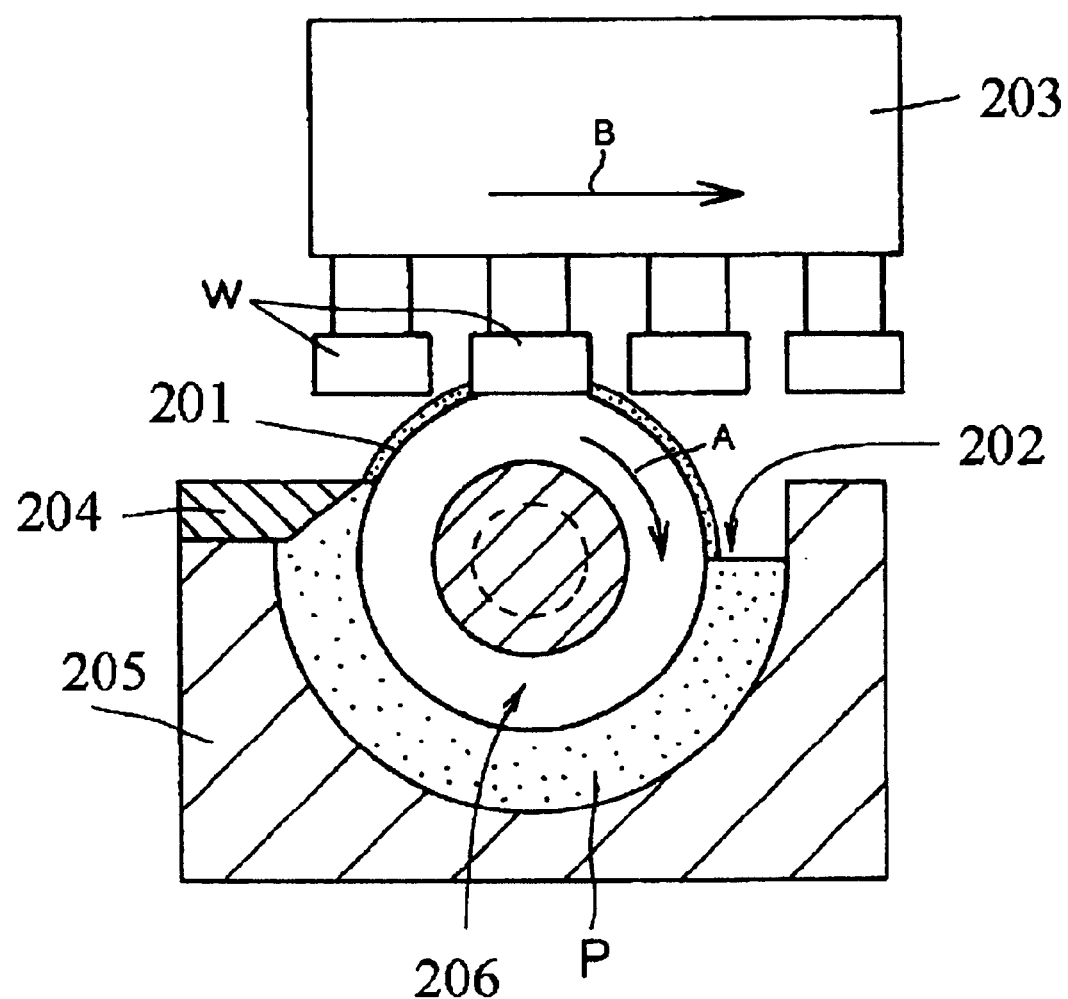
FIG. 25 is a vertical side view of a paste application apparatus according to a third embodiment of the present invention.
Figure 26:
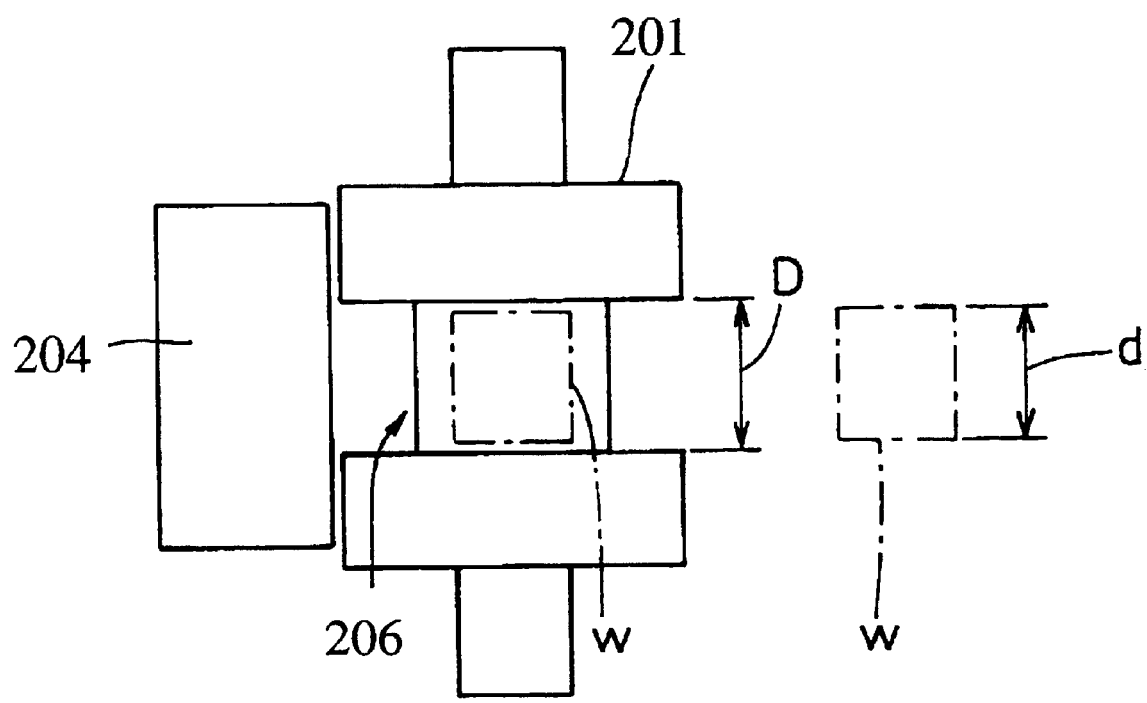
FIG. 26 is a plan view of a roller portion that is the key portion of the apparatus shown in FIG. 25.
Figure 27:
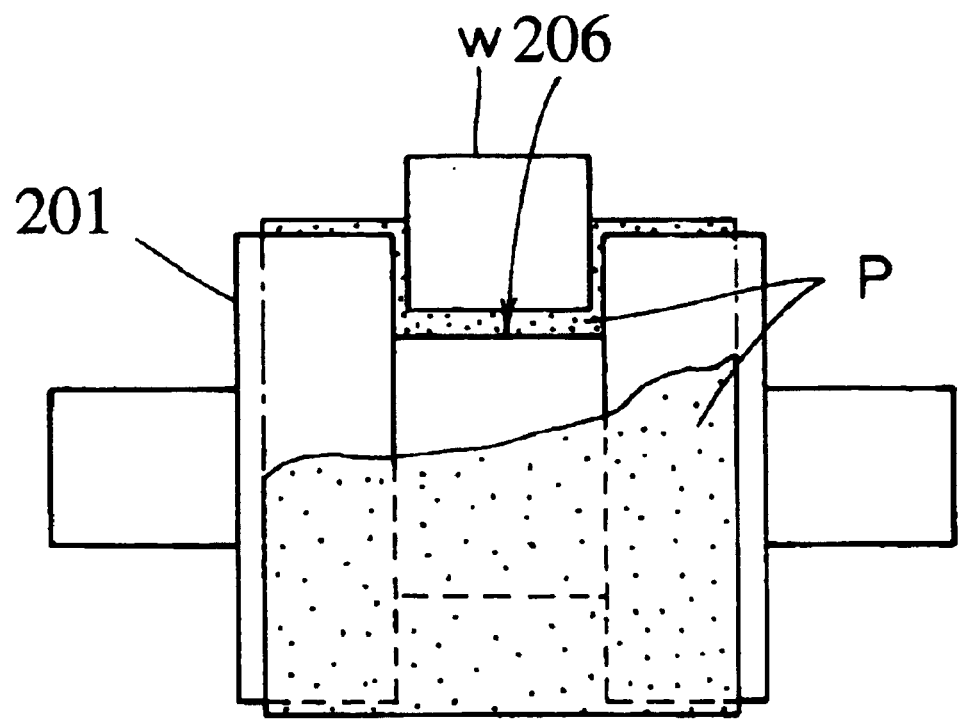
FIG. 27 is a diagram for illustrating the action of the apparatus shown in FIG. 25.

A paste application apparatus according to a third embodiment of the present invention will be described with reference to the drawings. FIG. 25 to FIG. 27 show the first example of the present embodiment. FIG. 25 is a vertical side view of a paste application apparatus, FIG. 26 is a plan view of a roller portion that is the key portion of the aforementioned apparatus, and FIG. 27 is a diagram for illustrating the action.

In these drawings, reference numeral 201 denotes a roller, reference numeral 202 denotes a paste bath which is a supply portion of a paste P to the aforementioned roller 201 perimeter surface, reference numeral 203 denotes a transport mechanism of a target for coating w, and FIG. 25 shows a head portion thereof. Reference numeral 204 denotes a liquid thickness adjustment plate for scraping an excess portion of the paste off the roller 201 perimeter surface and adjusting the liquid thickness of the paste P. This liquid thickness adjustment plate 204 is attached to a housing 205 of the paste bath 202.

The aforementioned roller 201 is arranged in the paste bath 202 with the upper side exposing outside, and is rotated in one direction (the direction indicated by an arrow A in FIG. 25). The paste P is stored in the paste bath 202 to the extent that nearly lower half portion of the roller 201 is immersed. The transport mechanism 203 adsorbs and holds the target for coating w by suction of air, moves in the horizontal direction orthogonal to the axis of the roller 201 (the direction indicated by an arrow B in FIG. 25), and transports the target for coating w to the paste application position above the roller 201.

As is clearly shown in FIG. 26, a circumferential groove 206 having a cross section in a shape similar to that of a square bracket is arranged on all over the perimeter surface of the aforementioned roller 201. This circumferential groove 206 is a portion (paste holding portion) for holding the paste P therein with a large liquid thickness. The width D of this circumferential groove 206 is set to be wider than the width d of the target for coating w in order that the target for coating w can enter into the circumferential groove 206 in the condition that clearances are ensured at both sides thereof.

In the aforementioned configuration, the paste P in the paste bath 202 is adhered to all over the perimeter surface of the roller 201, that is, the perimeter surfaces of the large-diameter portions and the inner surface of the circumferential groove 206, and is hoisted up toward the liquid thickness adjustment plate 204 side in the condition that a thick layer of paste P is formed on the perimeter of the roller 201 accompanying the rotation of the roller 201 in one direction. Since the liquid thickness adjustment plate acts on this layer of paste P, an excess portion of the paste P is scraped off, and among the paste P adhered to the perimeter surface of the roller 201, only the paste arranged in the circumferential groove 206 is transported to the position through which the target for coating w passes.

In this case, the paste P in the circumferential groove 206 has an adequate liquid thickness compared with the height of the target for coating w. Since this paste P is in contact with the bottom surface and both side wall surfaces of the circumferential groove 206 within the width D of the circumferential groove 206, the contact area with the roller 201 is large relative to the quantity thereof, the adherence to the roller 201 is large and, therefore, the paste P is held in the circumferential groove 206 in the condition that it does not fly even when the roller 201 rotates at a high speed.

On the other hand, at the portion above the roller 201, the target for coating w horizontally transported by the transport mechanism 203 is entered into the circumferential groove 206, and the portion thereof on the side of application is immersed in the paste P in the circumferential groove 206. In this case, since the circumferential groove 206 has an adequate size relative to the target for coating w, as shown in FIG. 27, the target for coating w is deeply immersed in the paste P in the circumferential groove 206 and, in addition, the paste P in the circumferential groove 206 comes to the side surfaces from the bottom surface side of the target for coating w and, therefore, adheres to the side surfaces as well. Consequently, large quantities of paste P can be applied to the target for coating w.

In the aforementioned example, the circumferential groove 206 having a cross section in a shape similar to that of a square bracket was shown as the circumferential groove formed on the perimeter surface of the roller 201. However, circumferential grooves having other shapes, for example, a circumferential groove open toward the outer diameter side and a circumferential groove having a cross section in the shape of a letter U, can be adopted, and the shape of the circumferential groove 206 is not limited to that shown in the drawings in the aforementioned example.

The aforementioned third embodiment showed the circumferential groove 206 having a constant width. However, when the roller 201 is composed of a plurality of portions divided, the width D of the circumferential groove 206 becomes variable. For example, when the roller 201 is composed of an axis portion in which the bottom of the circumferential groove 206 is the outer diameter and two circular large-diameter portions which fit around this axis portion, the width D of the circumferential groove 206 is changed by changing the interval between the large-diameter portions on the axis portion. Consequently, the present invention includes the case where the width D of the circumferential groove 206 is variable.

Figure 28:
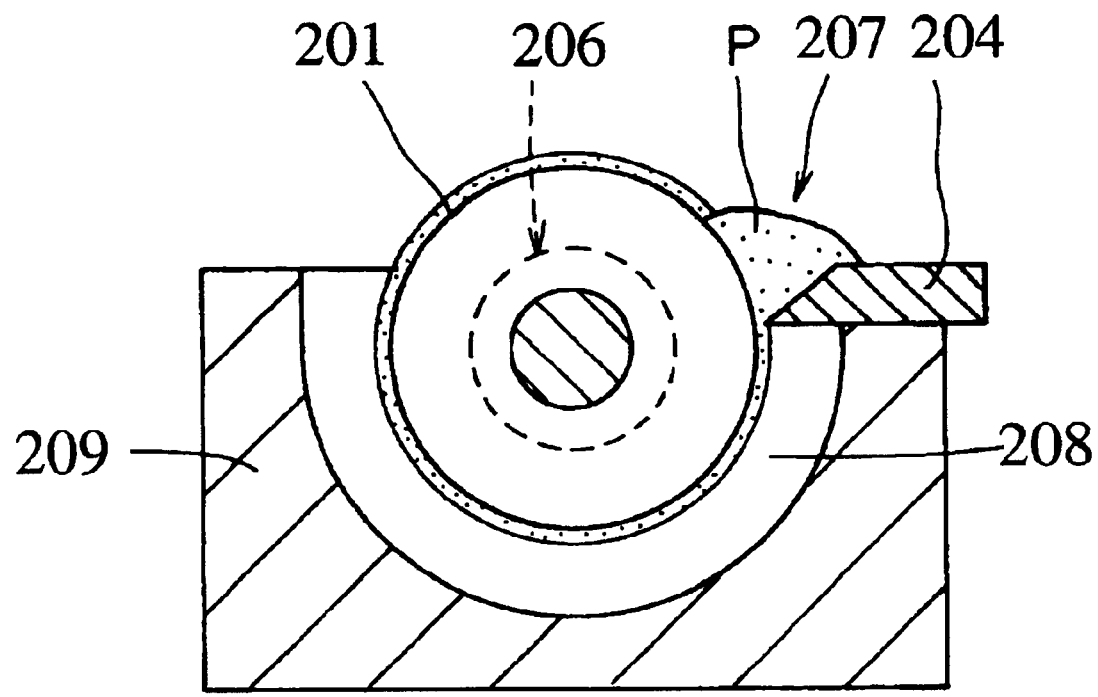
FIG. 28 is a vertical side view of a roller portion of a paste application apparatus according to a modified example of the present invention.
Figure 29:
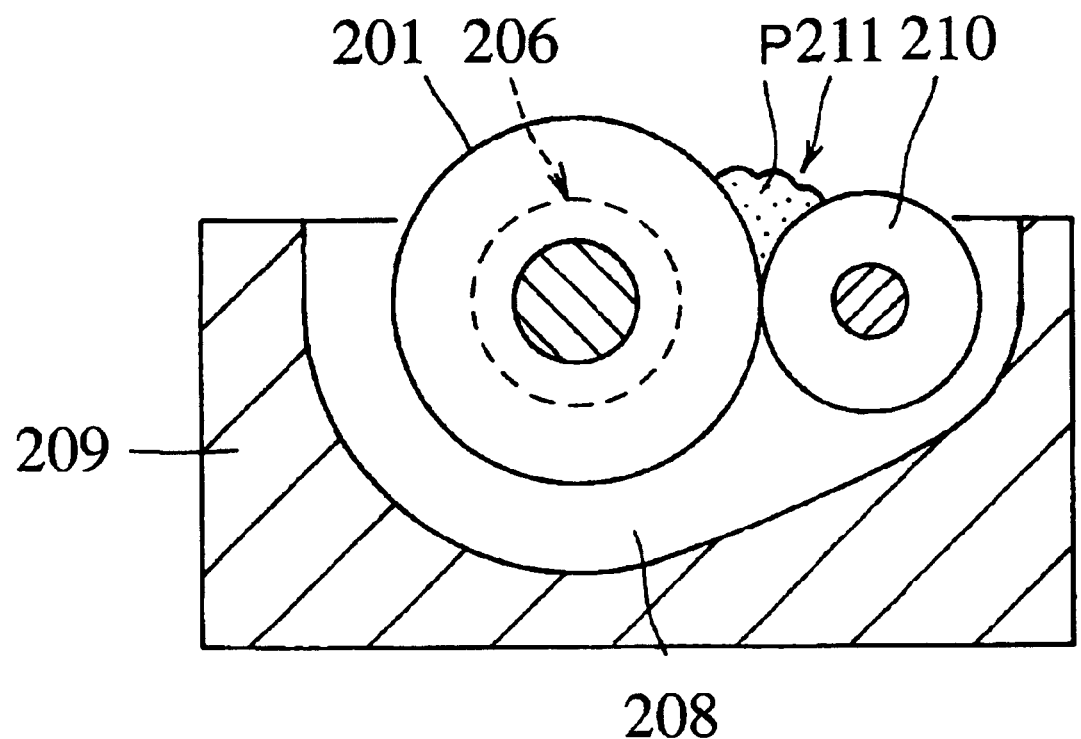
FIG. 29 is a vertical side view of a roller portion of a paste application apparatus according to another modified example of the present invention.

The supply portion of the paste P to the perimeter surface of the roller 201 is not limited to the paste bath 202 shown in FIG. 25, and as shown in FIG. 28 and FIG. 29, paste supply portions having other structures can be adopted.

FIG. 28 is a vertical side view of a roller portion of a paste application apparatus according to a modified example of the aforementioned third embodiment. In this modified example, the perimeter surface of a roller 201 and a liquid thickness adjustment plate 204 arranged on the perimeter of this roller 201 while in the condition of being in contact with or non-contact with the perimeter of this roller 201 constitute a paste supply portion 207 to the perimeter surface of the roller 201, and a paste P is stored in a space therebetween, the space being open upward. Reference numeral 208 denotes a paste reception portion for receiving an excess portion of the paste, and reference numeral 209 denotes a housing thereof.

A circumferential groove 206 is formed as a paste holding portion on the perimeter surface of the roller 201 in a manner similar to that in the roller 201 shown in the drawings in the aforementioned embodiment. Although not shown in FIG. 28, a transport mechanism of the target for coating is arranged on the roller 201.

FIG. 29 is a vertical side view of a roller portion of a paste application apparatus according to another modified example of the aforementioned third embodiment. In this modified example, the perimeter surface of a roller 201 and an auxiliary roller 210 which rotates in contact with the perimeter surface of this roller 201 constitute a paste supply portion 211 to the perimeter surface of the roller 201, and a paste P is stored in a space therebetween, the space being open upward. The roller 201 and the auxiliary roller 210 are arranged in a paste reception portion 208.

A circumferential groove 206 is formed as a paste holding portion on the perimeter surface of the roller 201, and a transport mechanism of the target for coating is arranged on the roller 201, although not shown in the drawing, in a manner similar to those in the aforementioned embodiment.

Figure 30:
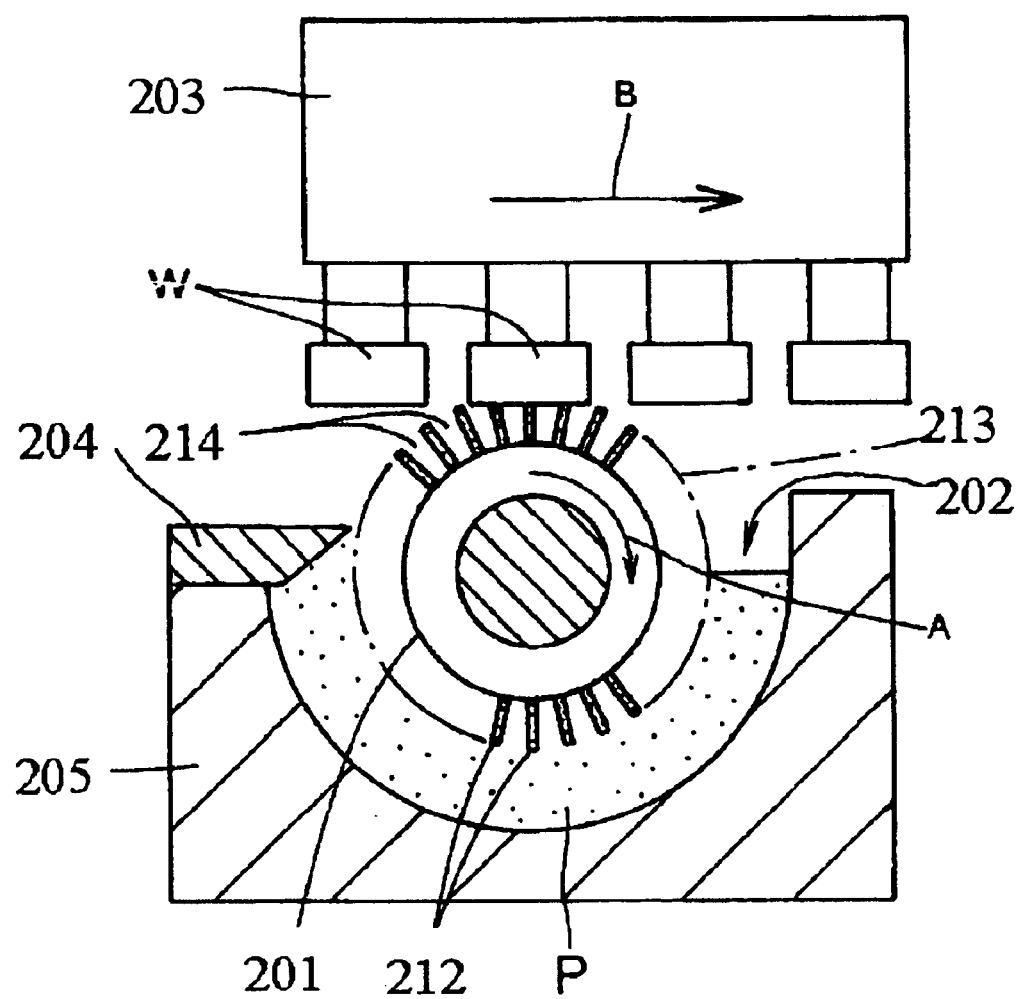
FIG. 30 is a vertical side view of a paste application apparatus according to a fourth embodiment of the present invention.
Figure 31:
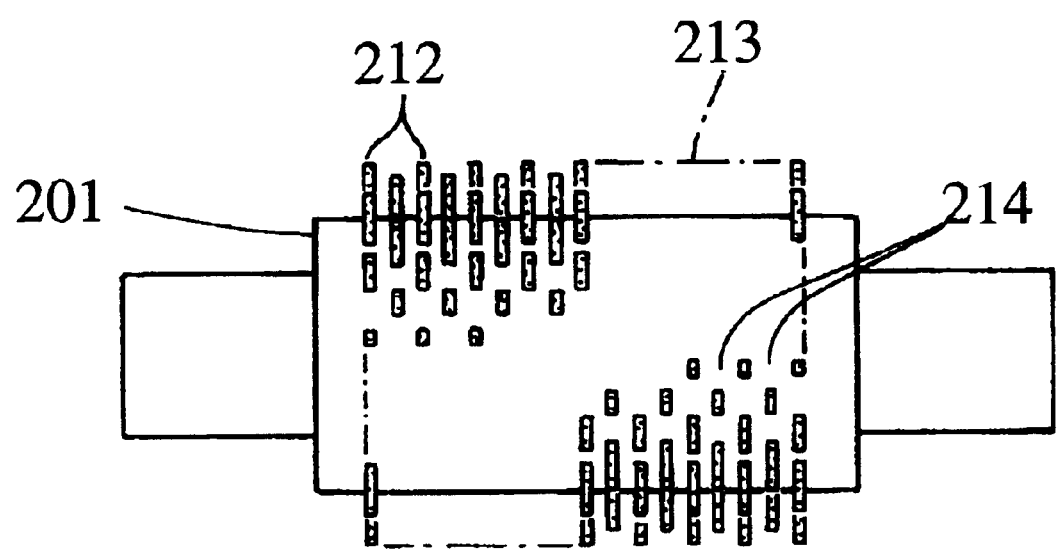
FIG. 31 is a plan view of a roller that is the key portion of the apparatus shown in FIG. 30.
Figure 32:
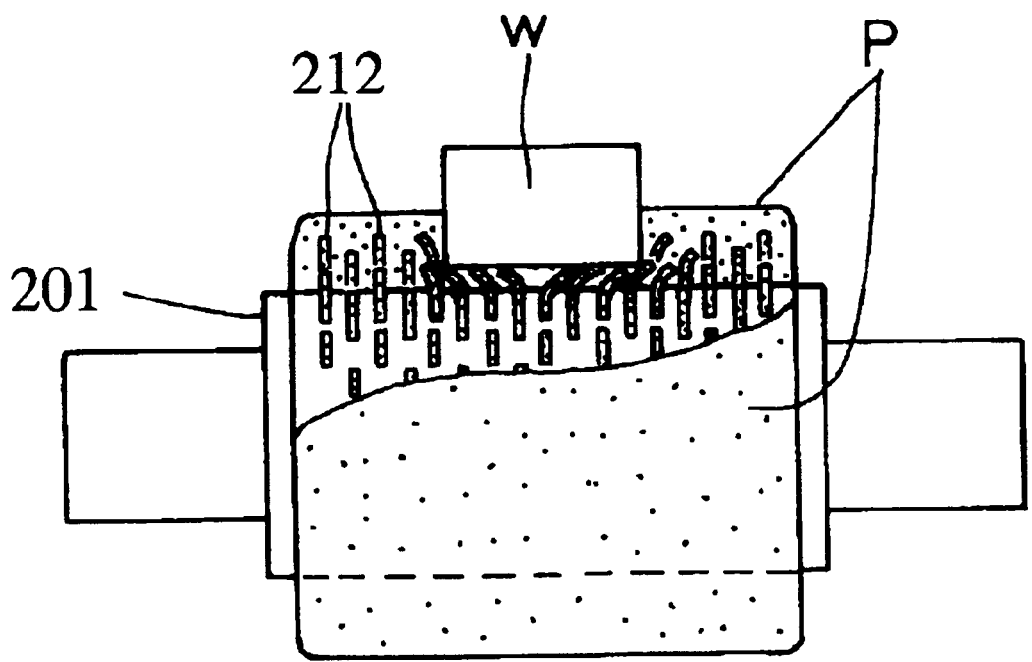
FIG. 32 is a diagram for illustrating the action of the apparatus shown in FIG. 30.

FIGS. 30 to 32 show a fourth embodiment of the present invention. FIG. 30 is a vertical side view of a paste application apparatus, FIG. 31 is a plan view of a roller that is the key portion of the aforementioned apparatus, and FIG. 32 is a diagram for illustrating the action.

In this embodiment, as a paste holding portion, a flexible holding layer 213 for a paste P is formed by implanting numbers of pliable linear bodies 212, such as fibrous strings and soft resin wires, on the perimeter surface of a roller 201. Gaps 214 communicated with each other are arranged among the linear bodies 212 in this flexible holding layer 213, and these gaps 214 serve as gaps for holding the paste P.

In this embodiment, a paste bath 202 is arranged as a paste supply portion, and a transport mechanism 203 of a target for coating w is arranged on a roller 201 in a manner similar to those in the aforementioned embodiment. Consequently, the portions common to the apparatus in the aforementioned embodiment are indicated by the same reference numerals.

In the configuration of the present embodiment, the flexible holding layer 213 made of the linear bodies 212 holds the paste P with a liquid thickness corresponding to the upstanding height of the linear bodies 212. The target for coating w is transported to this flexible holding layer 213 by the transport mechanism 203. Since the linear bodies 212 constituting the flexible holding layer 213 is flexible, as shown in FIG. 32, the linear bodies 212 deform in such a manner as to avoid the target for coating w and allow the target for coating to deeply enter into the flexible holding layer 213. Accompanying this, the paste P contained in the gaps 214 among the linear bodies 212 is infiltrated and is adhered to the target for coating w. Consequently, the target for coating w is deeply immersed in the layer of the paste P, and large quantities of paste P is applied to the portion from the bottom surface to the side surface thereof.

Figure 33:
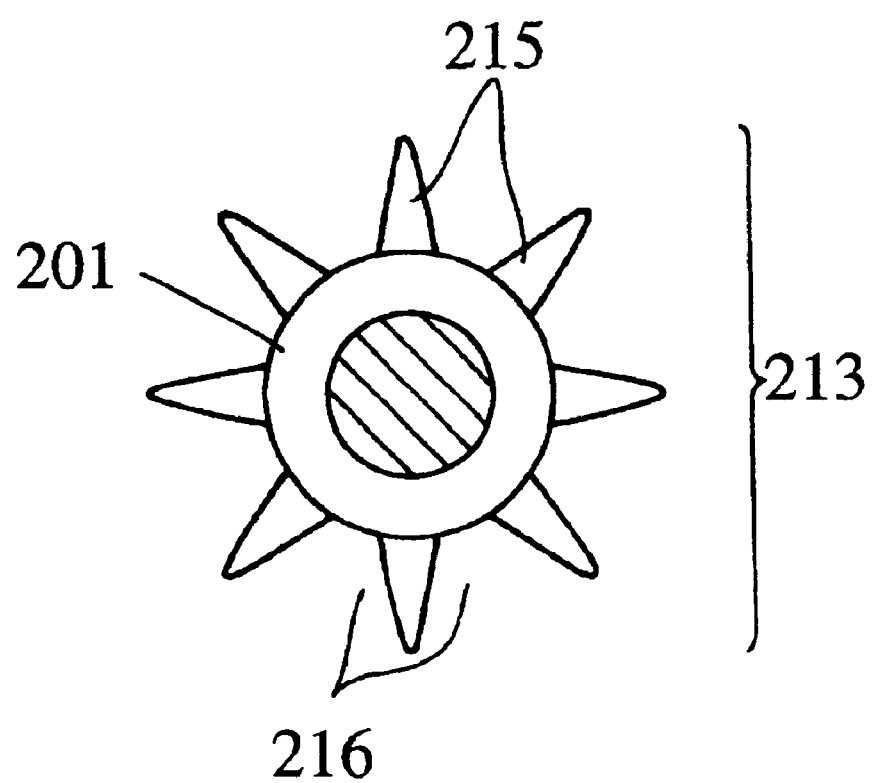
FIG. 33 is a side view of a roller of an apparatus according to a fifth embodiment of the present invention.
Figure 34:
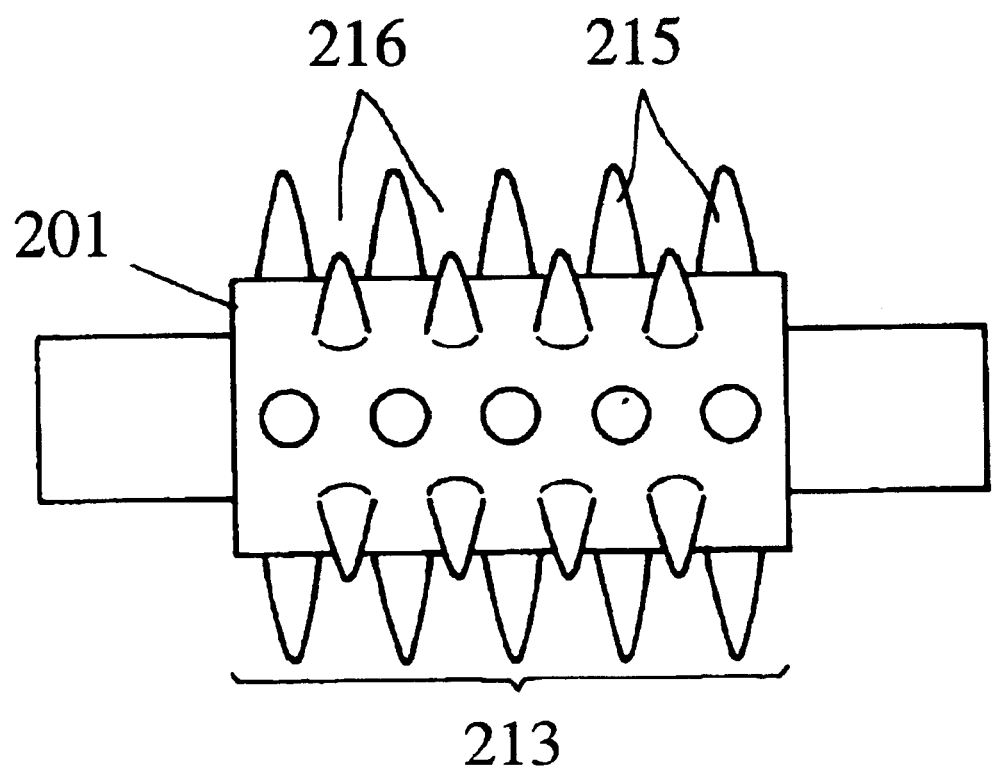
FIG. 34 is a plan view of the roller shown in FIG. 33.
Figure 35:
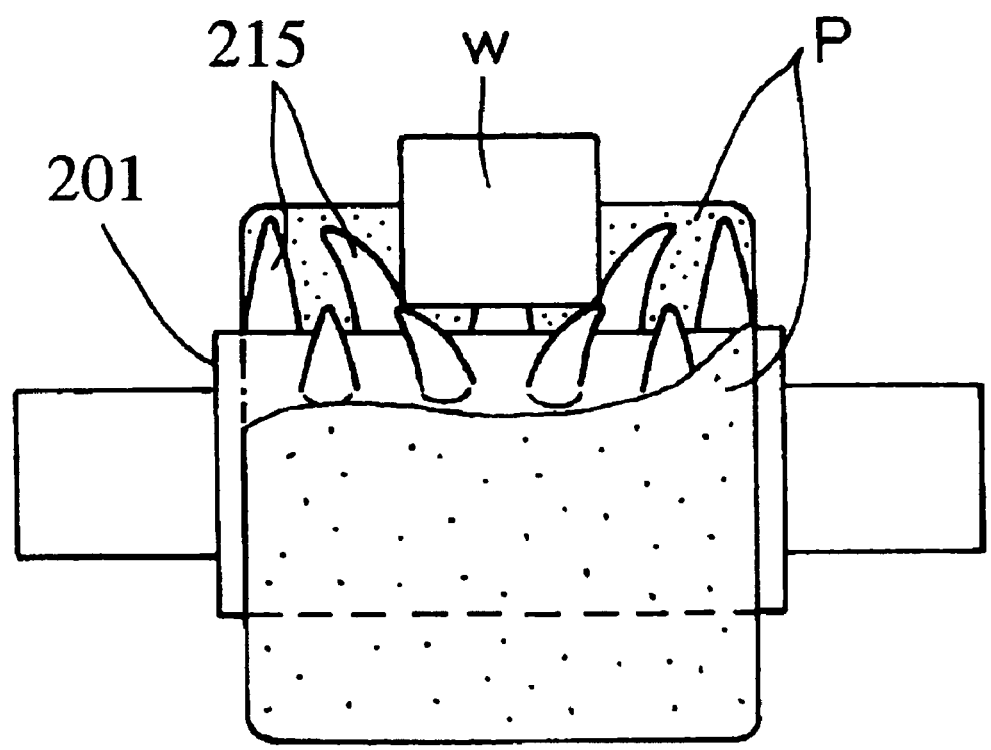
FIG. 35 is a diagram for illustrating the action of the roller shown in FIG. 33.

FIGS. 33 to 35 show a fifth embodiment of the present invention. FIG. 33 is a side view of a roller, FIG. 34 is a plan view of the roller, and FIG. 35 is a diagram for illustrating the action.

In this embodiment, a flexible holding layer 213 is formed by numbers of elastic protrusions 215 protruding from the perimeter surface of the roller 201 in all directions. Gaps 216 communicated with each other are arranged among the elastic protrusions 215, and these gaps 216 serve as gaps for holding the paste P. The elastic protrusions 215 may be implanted on the perimeter surface of the roller 201, or the portion of the perimeter side of the roller 201 may be composed of the same material, and this portion and the elastic protrusions 215 may be formed integrally. The portions other than the roller 201 and the flexible holding layer 213 may be similar to those in the aforementioned embodiment.

In the present embodiment, the flexible holding layer 213 made of the elastic protrusions 215 holds the paste P with a liquid thickness corresponding to the upstanding height of the elastic protrusions 215. When the target for coating w is transported to this flexible holding layer 213, as shown in FIG. 35, the elastic protrusions 215 deform in such a manner as to avoid the target for coating w and, in addition, the paste P contained in the gaps 216 among the elastic protrusions 215 is flowed to the target for coating w side and is adhered to the target for coating w. Consequently, large quantities of paste P is applied to the target for coating w.

Figure 36:
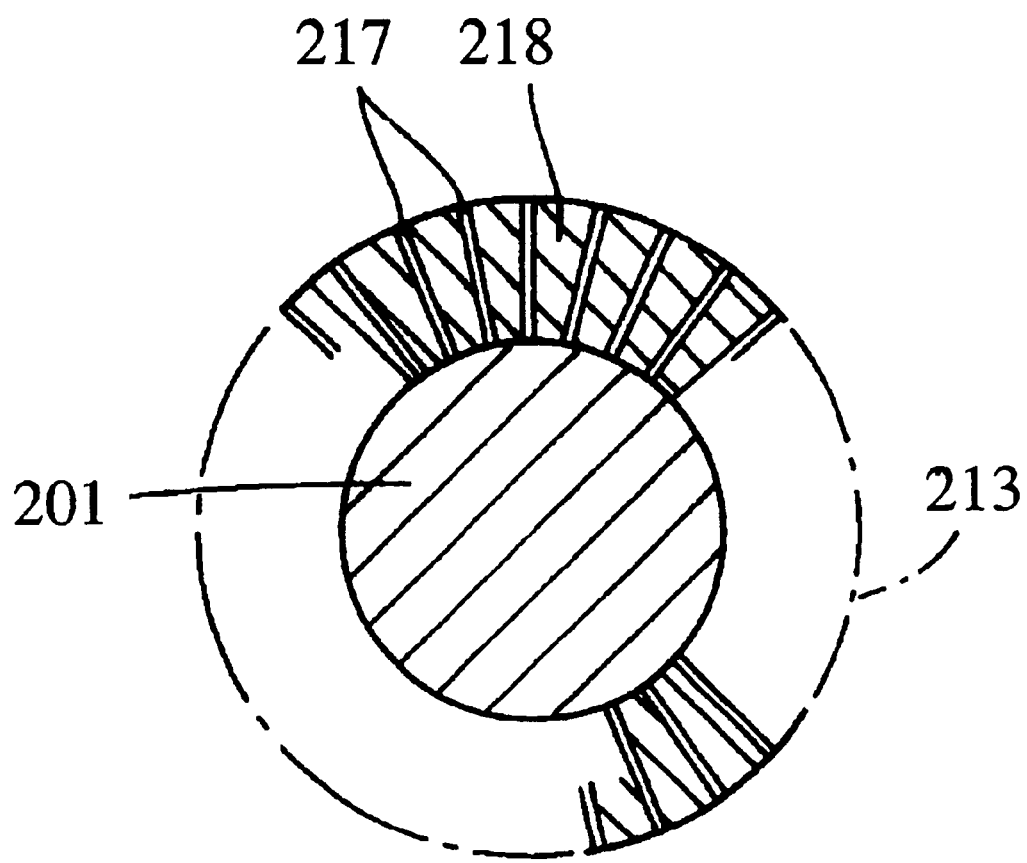
FIG. 36 is a vertical side view of a roller of an apparatus according to a sixth embodiment of the present invention.
Figure 37:
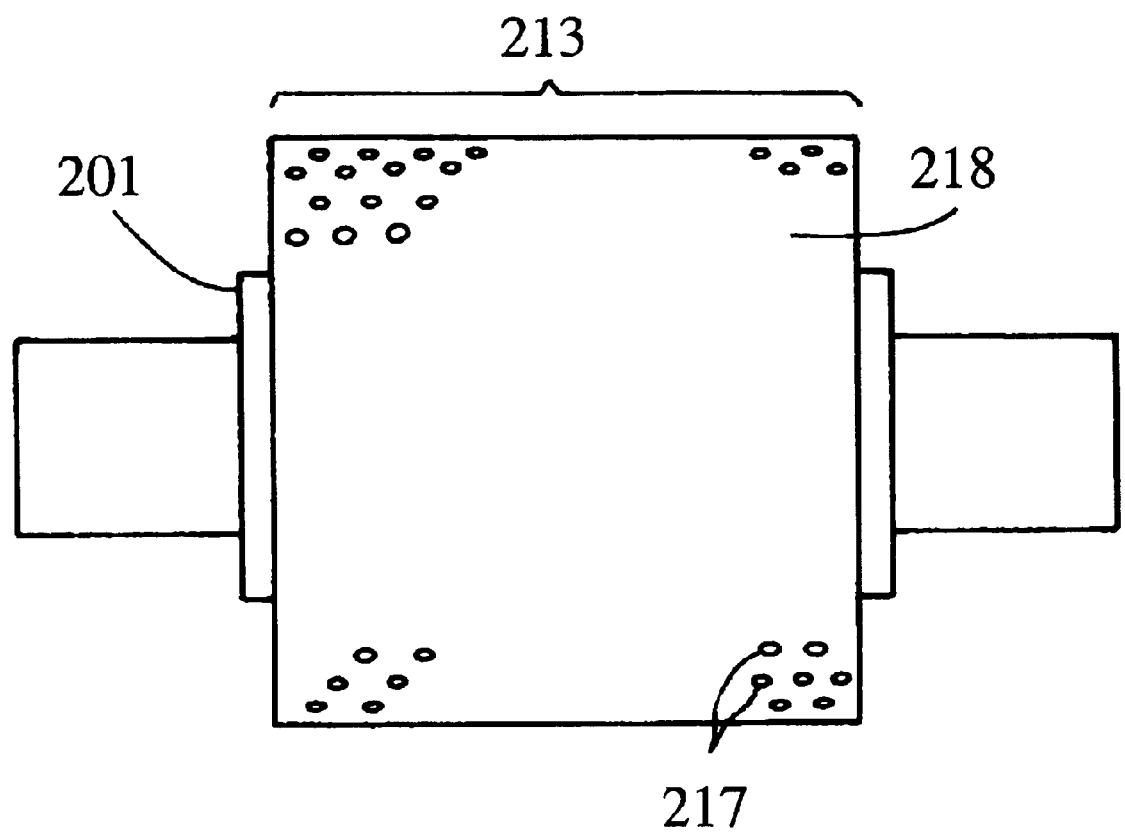
FIG. 37 is a plan view of the roller shown in FIG. 36.
Figure 38:
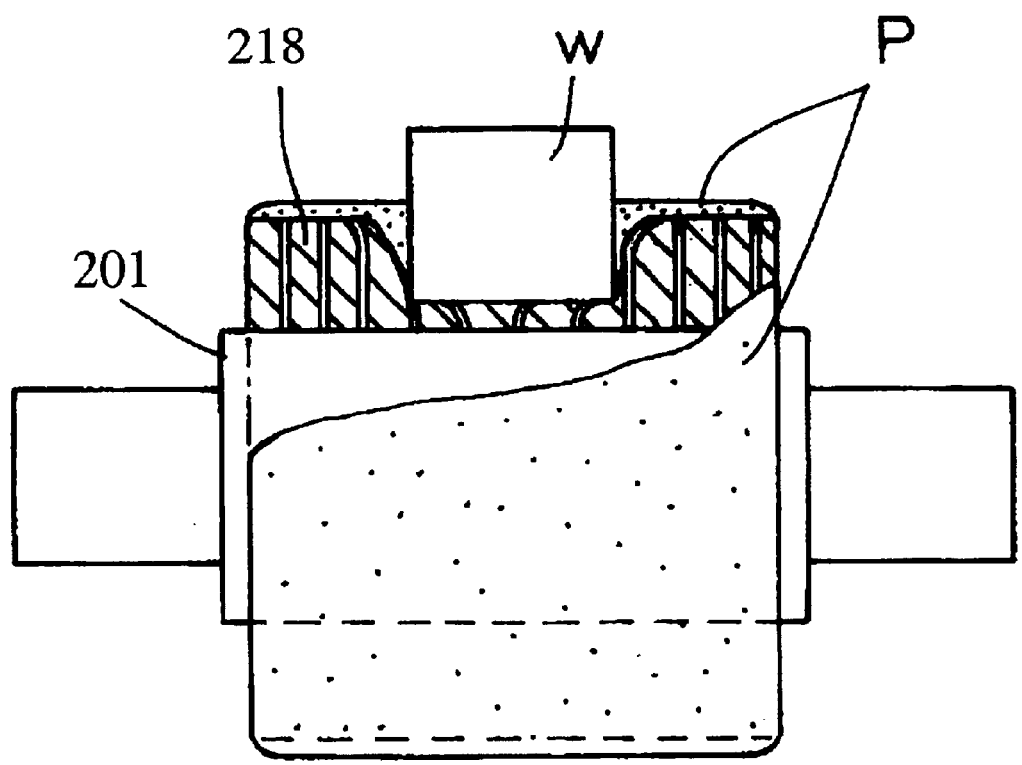
FIG. 38 is a diagram for illustrating the action of the roller shown in FIG. 36.
Figure 39:
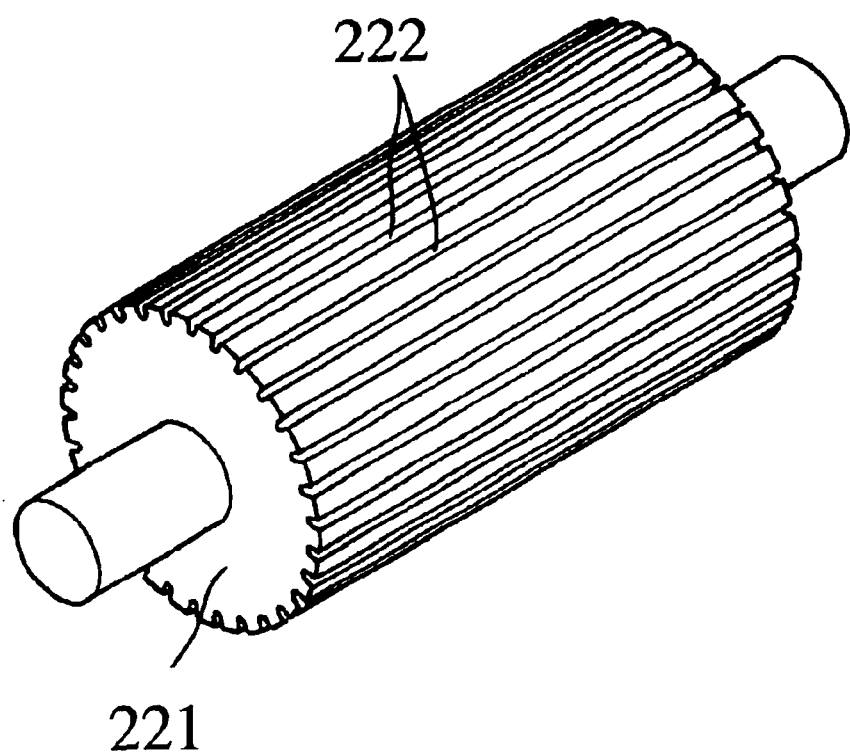
FIG. 39 is a perspective view of a conventional coating roller.

FIGS. 36 to 38 show a sixth embodiment of the present invention. FIG. 36 is a vertical side view of a roller, FIG. 37 is a plan view of the roller, and FIG. 38 is a diagram for illustrating the action.

In the present embodiment, a flexible holding layer 213 for a paste P is formed from an elastic body 218 having numbers of gaps 217 open toward the outer diameter side. Examples of materials constituting this flexible holding layer 213 include, for example, sponge and a sponge finishing resin with continuous voids. The gaps 217 in the elastic body 218 serve as gaps for holding the paste P. The portions other than the roller 201 and the flexible holding layer 213 may be similar to those in the aforementioned embodiment.

In the present embodiment, the flexible holding layer 213 made of the elastic body 218 holds the paste P with a liquid thickness corresponding to the thickness of the elastic body 218. When the target for coating w is transported to this flexible holding layer 213, as shown in FIG. 38, the elastic body 218 deforms in such a manner as to form a concave portion and, in addition, the paste P contained in the gaps 217 in the elastic body 218 is flowed to the target for coating w side and is adhered to the target for coating w. Consequently, large quantities of paste P is applied to the target for coating w.

In the aforementioned each embodiment, the flexible holding layer 213 for the paste P is composed of the pliable linear bodies 212, the elastic protrusions 215, or the sponge-shaped elastic body 218. However, the flexible holding layer 213 can be composed of other materials. It is essential that the flexible holding layer 213 is formed from a flexible member on the perimeter surface of the roller 201 while having gaps for holding the paste in the inside.

In the aforementioned each embodiment, as shown in FIG. 30 as well, the paste bath 202 is adopted as the paste supply portion. However, the paste supply portion 207 shown in FIG. 28 or the paste supply portion 211 shown in FIG. 29 may be used.

Figure 40:
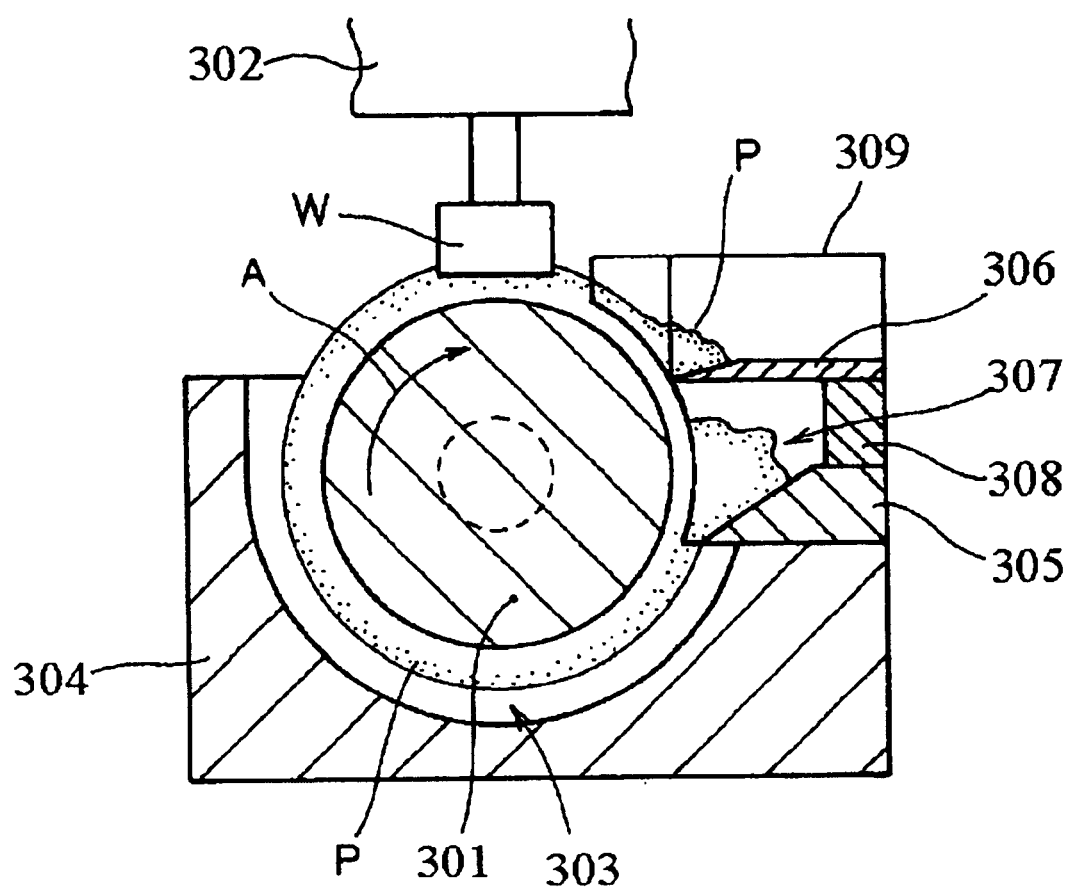
FIG. 40 is a vertical side view of a paste application apparatus according to a seventh embodiment of the present invention.
Figure 41:
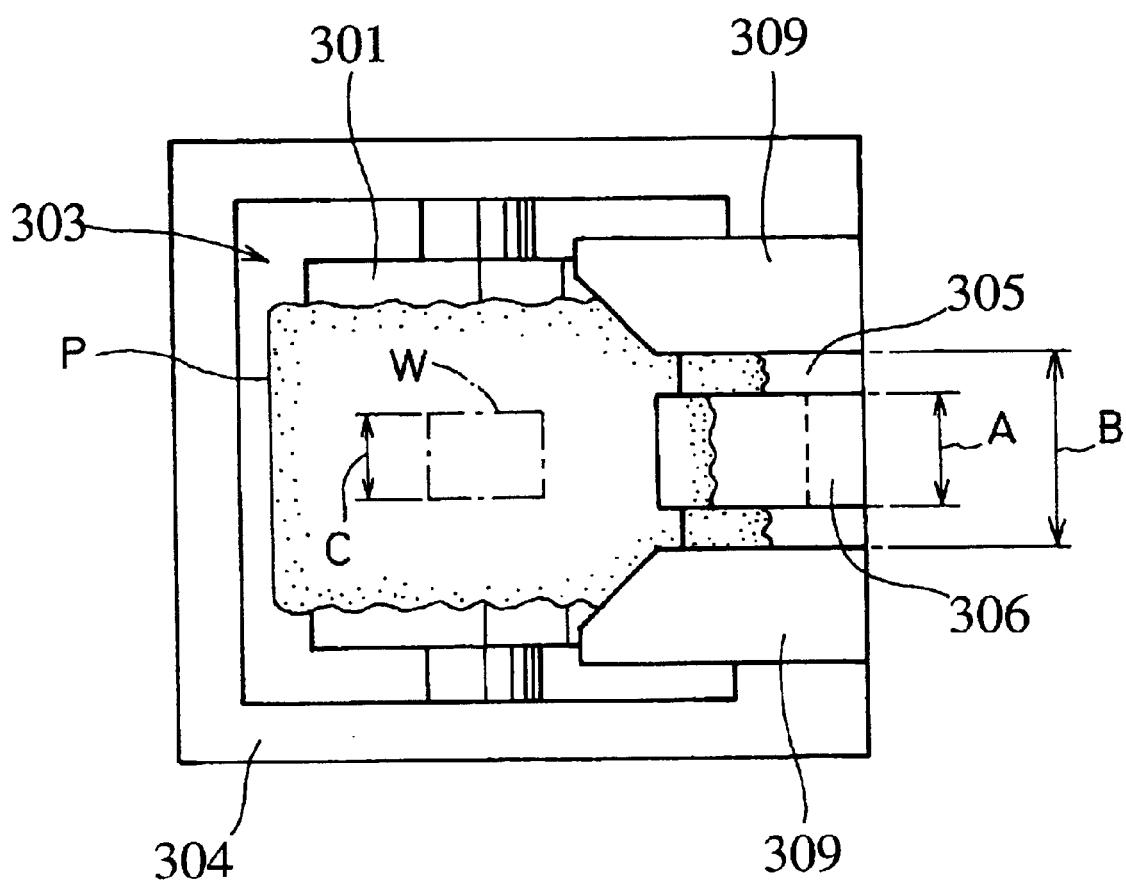
FIG. 41 is a plan view of the apparatus shown in FIG. 40.
Figure 42:
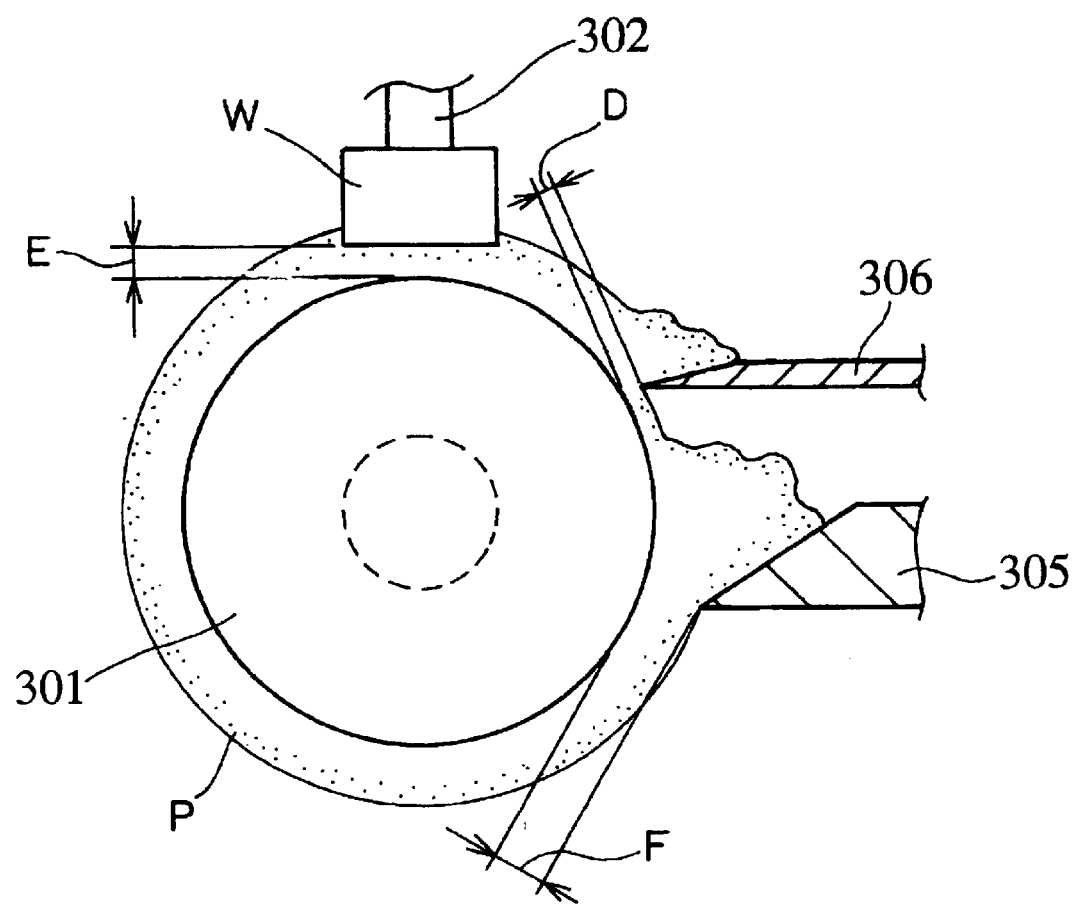
FIG. 42 is a diagram for illustrating an arrangement showing the positional relationship between a roller, which is a part of the apparatus shown in FIG. 40, and other members.
Figure 43:
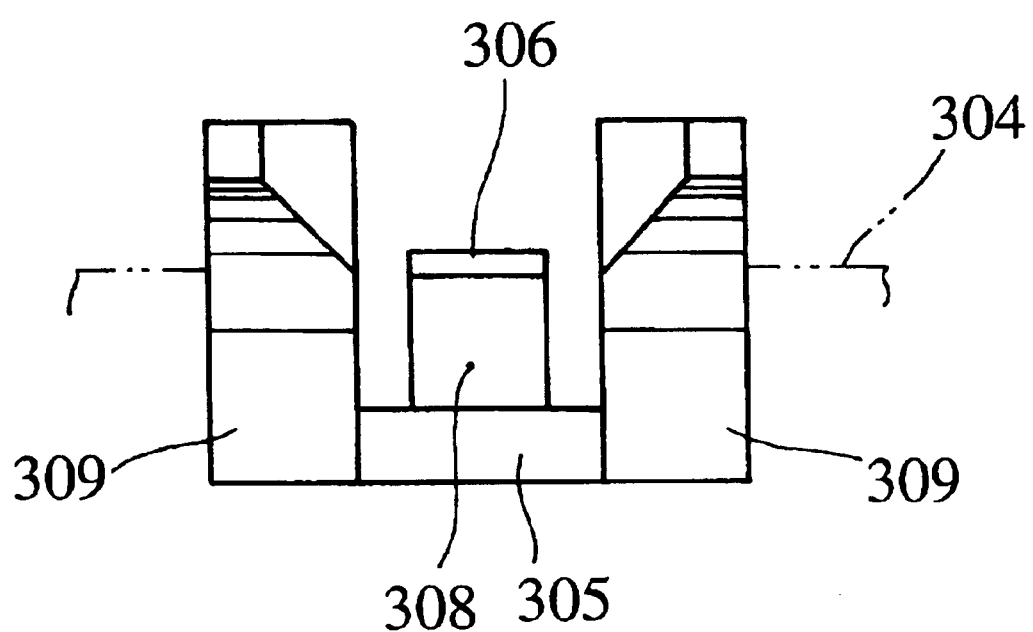
FIG. 43 is a front view of a scraping member, a liquid thickness adjustment member, etc., which is a part of the apparatus shown in FIG. 40, viewed from the roller side.

A paste application apparatus according to a seventh embodiment of the present invention will be described with reference to drawings. FIGS. 40 to 43 show the seventh embodiment of the present invention. FIG. 40 is a vertical side view of a paste application apparatus according to the seventh embodiment, FIG. 41 is a plan view thereof, FIG. 42 is a diagram for illustrating an arrangement showing the positional relationship between a roller, which is a part of the apparatus shown in FIG. 40, and other members, and FIG. 43 is a front view of a scraping member, a liquid thickness adjustment member, etc., which is a part of the apparatus shown in FIG. 40, viewed from the roller side.

In these drawings, reference numeral 301 denotes a roller, and reference numeral 302 denotes an application position setting mechanism and a head portion thereof is shown in FIG. 40. Reference numeral 303 denotes a paste reception portion for receiving a paste P dropped from the roller 301 side, and reference numeral 304 denotes a housing thereof.

The aforementioned roller 301 is arranged in the paste reception portion 303 with the upper side exposing outside, and is rotated in one direction (the direction indicated by an arrow A in FIG. 40). In the present embodiment, the application position setting mechanism 302 adsorbs and holds the target for coating w by suction of air, and transports this to the application position set at a required position above the perimeter surface of the roller 301. This application position setting mechanism 302 may transport the target for coating w in the horizontal direction relative to the aforementioned application position or may transport vertically.

A liquid thickness adjustment member 305 and a scraping member 306 are arranged at the position which is forward of the paste application position of the target for coating w in the rotation direction A of the roller 301 and which faces the perimeter surface of the roller 301.

The liquid thickness adjustment member 305 is for scraping off an excess portion of the paste P on the perimeter surface of the roller 301 so as to adjust the liquid thickness of the paste P adhered. Therefore, the interval between the tip of this liquid thickness adjustment member 305 and the perimeter surface of the roller 301 (clearly shown in FIG. 42) corresponds to the adherence thickness of the paste P on the perimeter surface of the roller 301. The liquid thickness adjustment member 305 shown in the drawing is a squeegee-shaped plate having a sharp tip, and is attached to the housing 304 of the paste reception portion 303.

In this seventh embodiment, the liquid thickness adjustment member 305 and the perimeter surface of the roller 301 facing this constitute a paste supply portion 307 for supplying a paste P to the perimeter surface of the roller 301, and a paste P is stored in a space therebetween, the space being open upward.

The scraping member 306 scrapes off the paste P adhered on the perimeter surface of the roller 301. As shown in FIG. 41, the width A thereof is narrower than the width B of the liquid thickness adjustment member 305, and is wider than the width C of the target for coating w (B>A>C).

This scraping member 306 is arranged at the position above the aforementioned liquid thickness adjustment member 305 with a spacer 308 roller 301. As shown in FIG. 42, the interval D between the tip of the scraping member 306 and the perimeter surface of the roller 301 is set to be smaller than the interval E between the target for coating w positioned at the application position by the application position setting mechanism 302 and the perimeter surface of the roller 301 (E>D). The interval E between the target for coating w positioned at the application position and the perimeter surface of the roller 301 is smaller than the interval F between the tip of the liquid thickness adjustment member 305 and the perimeter surface of the roller 301 (F>E).

Shifting members 309 and 309 for shifting the paste P toward the liquid thickness adjustment member 305 side are arranged on both sides of the liquid thickness adjustment member 305. These shifting members 309 and 309 are protruding toward the roller 301 and, in addition, stand from the liquid thickness adjustment member 305 in a manner as to surround the scraping member from both sides. The interval between the two shifting members 309 and 309 becomes small with distance in the rotation direction of the roller 301. The tip edge on the roller 301 side of the shifting member 309 is dented in the shape of an arc corresponding to the perimeter surface of the roller 301.

In the aforementioned configuration, the paste P is supplied from the paste supply portion 307 arranged on the liquid thickness adjustment member 305 to the perimeter surface of the roller 301 and, in addition, the adherence thickness of the paste p is adjusted at a predetermined thickness by the liquid thickness adjustment member 305. This paste P adhered is transported above the perimeter of the roller 301 accompanying the rotation of the roller 301.

Since the target for coating w is transported to the required position above the perimeter of the roller 301 by the application position setting mechanism 302, the bottom surface portion of the target for coating w is immersed in the paste P adhered on the perimeter surface of the roller 301, and, therefore, the paste P is applied to the bottom surface portion.

The adhered paste P passed this application position moves toward the scraping member 306 side. At the position of the scraping member 306, the surface layer portion of the adhered paste P is scraped off by the scraping member 306. This surface layer portion is the portion from the surface of the adhered paste P to the layer at the depth deeper than the immersion depth of the target for coating w, and is the portion exposed to the external air or remaining portion which is in the region immersed by the target for coating w, but is not applied to the target for coating w.

Among the adhered paste P, scraped surface layer portion is flow down from both sides of the scraping member 306 to the paste supply portion 307 located below. In this case, a pair of shifting members 309 and 309 arranged both sides of the scraping member 306 guide the paste P flowing down not to flow outside the paste supply portion 307. The inner layer portion inside the surface layer portion of the adhered paste P is exposed to the outside on a temporary basis, and is entered into the paste supply portion 307. In the paste supply portion 307, the surface layer portion of the adhered paste P and the inner layer portion thereof are mixed with the other paste stored in the paste supply portion 307.

As described above, since the adhered paste P is forced to divide by the scraping member 306 and, thereafter, is mixed with the other paste in the paste supply portion 307, the total paste P is adequately self-agitated. Consequently, viscosity change of the total paste P due to drying is suppressed and, therefore, the quantity of the paste applied to the target for coating w is stabilized. Since the scraped paste P of the surface layer portion is returned to the paste supply portion 307, the quantity of decrease of the paste P can be controlled at minimum. Therefore, the paste P can be used continuously for a long time.

In this case, since the scraping member 306 is not brought into contact with the roller 301, wear does not occur, and degradation of the quality of the paste P due to powders resulting from wear does not occur. The frictional heat between the scraping member 306 and the roller 301 does not occur and, therefore, degradation and cure of the paste P due to the frictional heat between the two do not occur. Furthermore, since the scraping member 306 does not wear, adjustment of the interval to the roller 301 is unnecessary, and frequency of exchange of the scraping member 306 itself is reduced.

Figure 44:
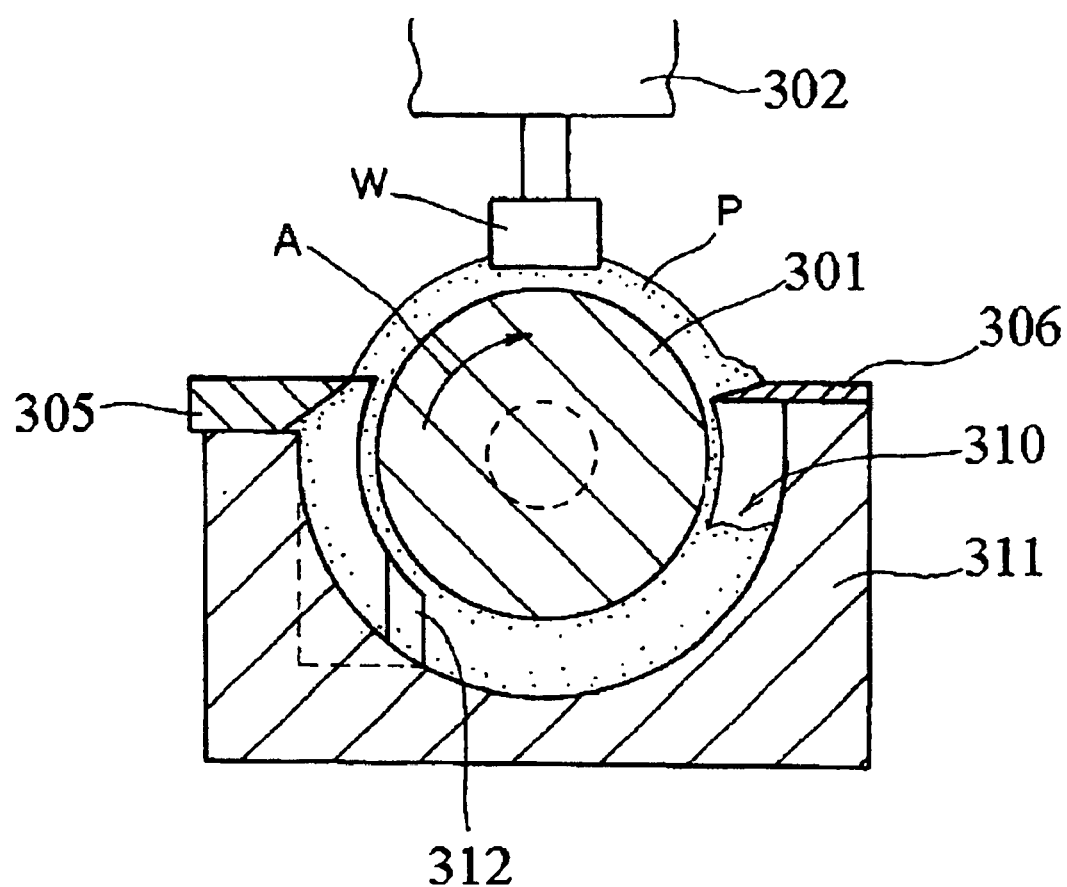
FIG. 44 is a vertical side view of a paste application apparatus according to an eighth embodiment of the present invention.
Figure 45:
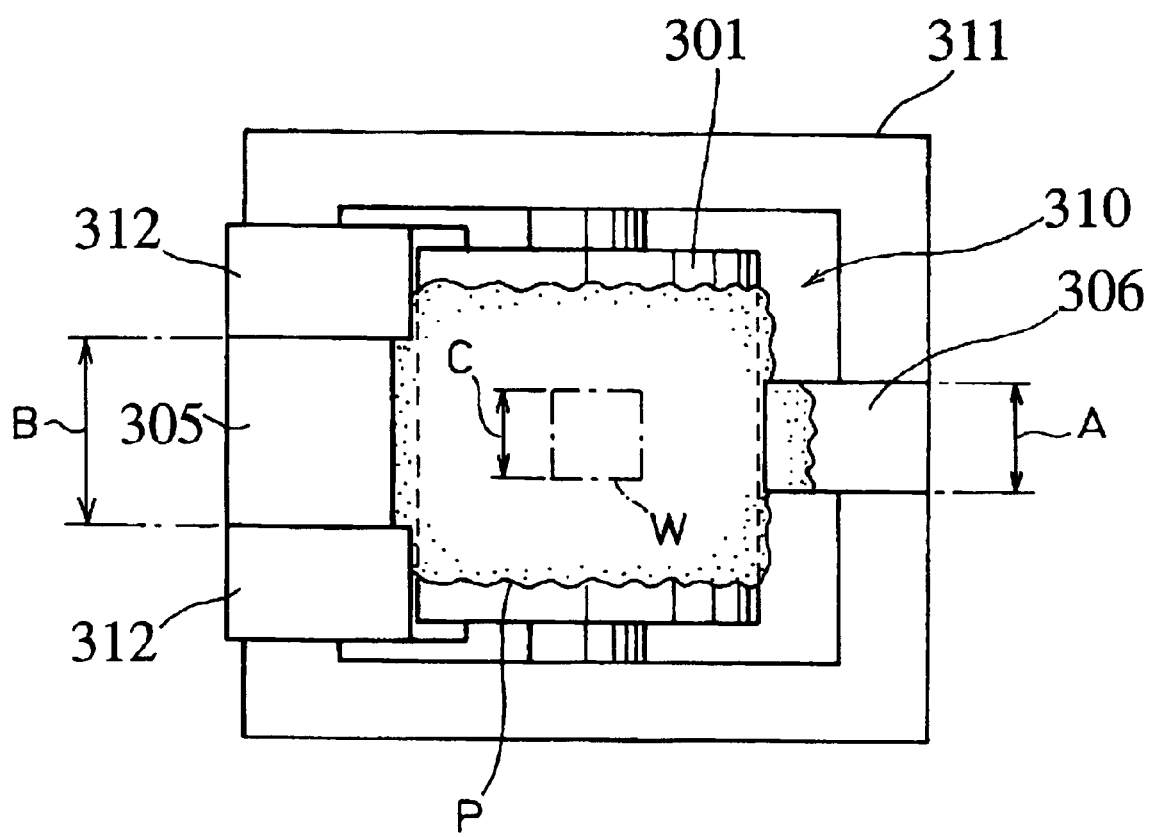
FIG. 45 is a plan view of the apparatus shown in FIG. 44.
Figure 46:
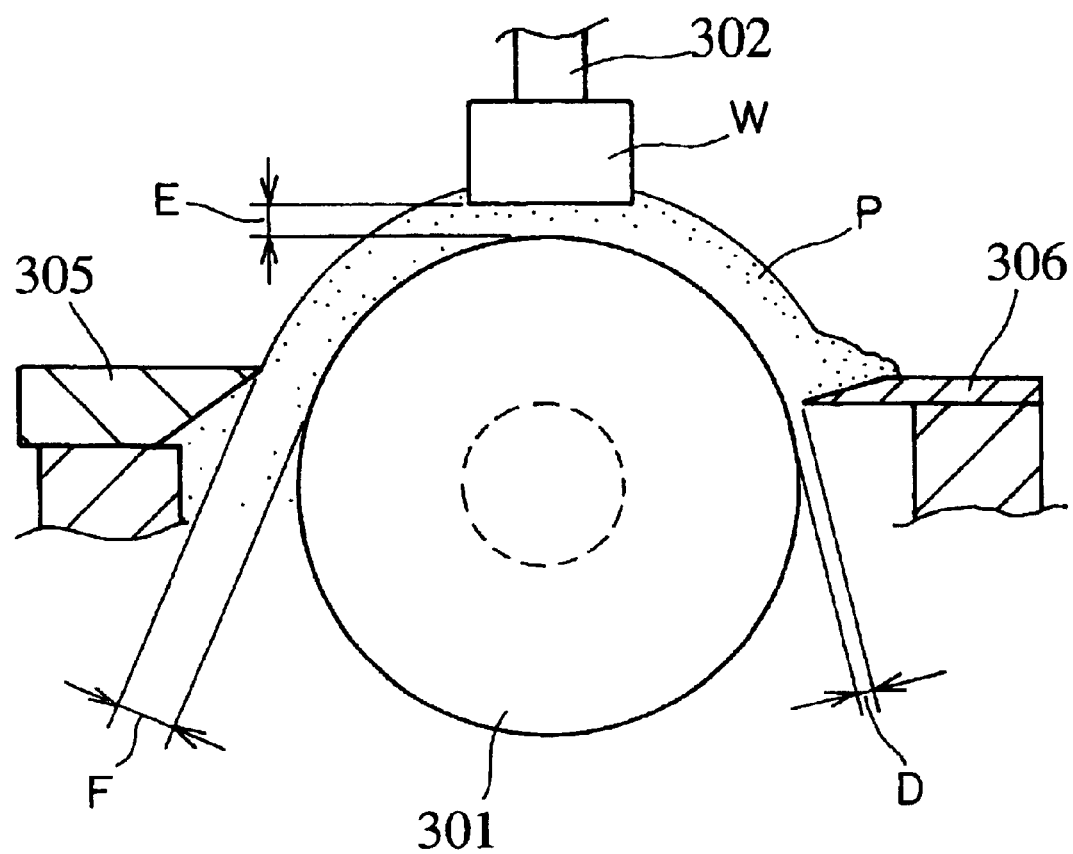
FIG. 46 is a diagram for illustrating an arrangement showing the positional relationship between a roller, which is a part of the apparatus shown in FIG. 44, and other members.
Figure 47:
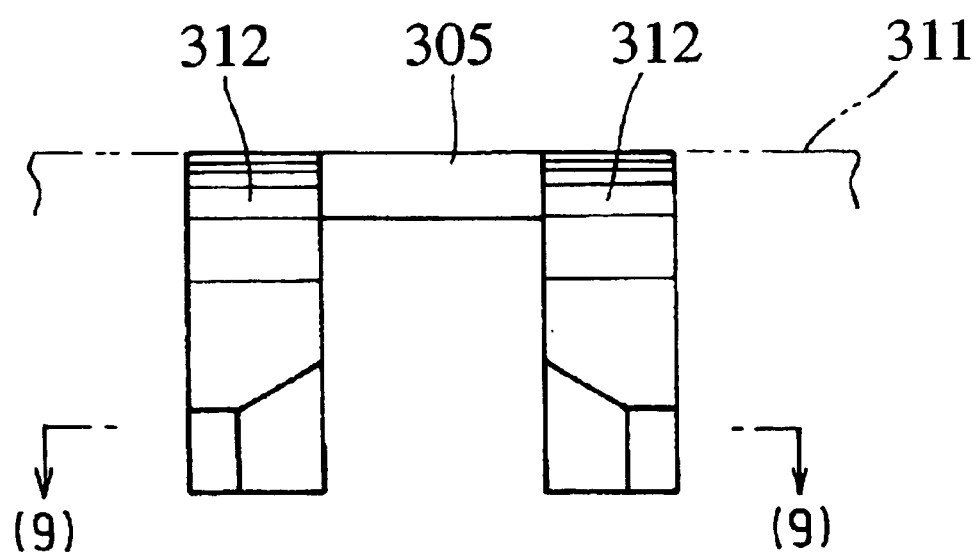
FIG. 47 is a front view of a liquid thickness adjustment member and a shifting member, which is a part of the apparatus shown in FIG. 44, viewed from the roller side.
Figure 48:
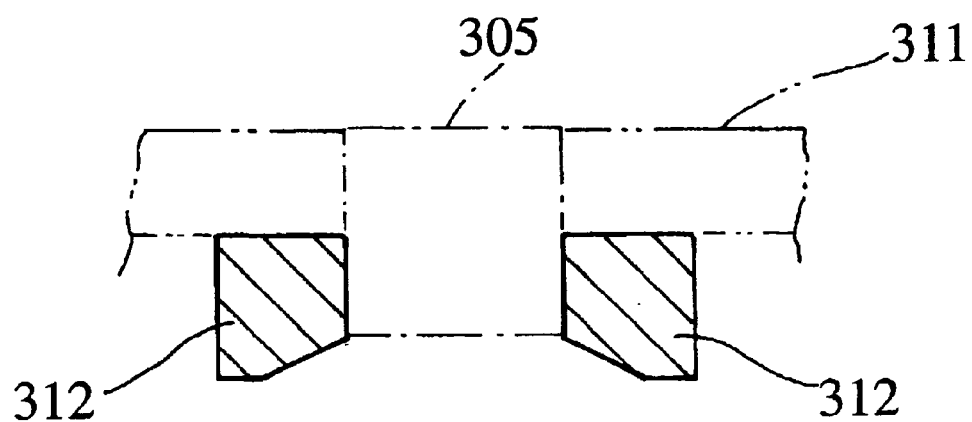
FIG. 48 is a horizontal plan view of the section indicated by a line (9)—(9) shown in FIG. 47.

Next, FIGS. 44 to 48 show an eighth embodiment of the present invention. FIG. 44 is a vertical side view of a paste application apparatus according to the eighth embodiment, FIG. 45 is a plan view thereof, FIG. 46 is a diagram for illustrating an arrangement showing the positional relationship between a roller, which is a part of the apparatus shown in FIG. 44, and other members, FIG. 47 is a front view of a liquid thickness adjustment member and a shifting member, which is a part of the apparatus shown in FIG. 44, viewed from the roller side, and FIG. 48 is a horizontal plan view of the section indicated by a line (9)—(9) shown in FIG. 47.

In these drawings, the portions corresponding to respective portions in the apparatus of the seventh embodiment shown in FIGS. 40 to 43 are indicated by the same reference numerals as in the seventh embodiment. In this eighth embodiment, a paste bath 310 for storing a paste P is a paste supply portion for supplying the paste P to the perimeter surface of a roller 301. The upper side of this paste bath 310 is open, and the roller 301 is arranged inside the opening. This roller 301 is rotated in one direction (the direction indicated by an arrow A in FIG. 44) in the condition that the upper side is exposed outside from the paste bath 310. Reference numeral 311 denotes a housing of the paste bath 310.

In a manner similar to that in the seventh embodiment, the application position setting mechanism 302 adsorbs and holds the target for coating w by suction of air, transports this to the application position set at a required position above the perimeter surface of the roller 301, and is arranged at the position above the roller 301. FIG. 44 shows a head portion thereof. This application position setting mechanism 302 may transport the target for coating w in the horizontal direction relative to the aforementioned application position or may transport vertically.

A liquid thickness adjustment member 305 is arranged at the position which faces the perimeter surface of the roller 301 and which is in a rearward position of the paste application position of the target for coating w in the rotation direction A of the roller 301, and a scraping member 306 is arranged at the position which faces the perimeter surface of the roller 301 and which is forward of the paste application position of the target for coating w in the rotation direction A of the roller 301.

In a manner similar to that in the seventh embodiment, the liquid thickness adjustment member 305 is for scraping off an excess portion of the paste P on the perimeter surface of the roller 301 so as to adjust the liquid thickness of the adhered paste P. Therefore, the interval between the tip of this liquid thickness adjustment member 305 and the perimeter surface of the roller 301 corresponds to the adherence thickness of the paste P on the perimeter surface of the roller 301. The liquid thickness adjustment member 305 shown in the drawing is a squeegee-shaped plate having a sharp tip. However, the shape thereof may be the shape of a block having some thickness, and the shape thereof is not limited to that shown in the drawing.

Shifting members 312 and 312 for shifting the paste P toward the liquid thickness adjustment member 305 side are arranged on both sides of the liquid thickness adjustment member 305. These shifting members 312 and 312 are protruding toward the roller 301 and, in addition, droop from the liquid thickness adjustment member 305 side to the inside of the paste bath 310. The interval between the two shifting members 312 and 312 becomes small with distance in the rotation direction of the roller 301. The tip edge on the roller 301 side of the shifting member 312 is dented in the shape of an arc corresponding to the perimeter surface of the roller 301.

In a manner similar to that in the seventh embodiment, the scraping member 306 scrapes off the paste P adhered on the perimeter surface of the roller 301, and the tip thereof is in non-contact with the perimeter surface of the roller 301. The width A of this scraping member 306 is narrower than the width B of the liquid thickness adjustment member 305, and is wider than the width C of the target for coating w (B>A>C). The tip of this scraping member 306 is protruding above the paste bath 310.

As shown in FIG. 46, the interval D between the tip of the scraping member 306 and the perimeter surface of the roller 301 is set to be smaller than the interval E between the target for coating w positioned at the application position by the application position setting mechanism 302 and the perimeter surface of the roller 301 (E>D). The interval E between the target for coating w positioned at the application position and the perimeter surface of the roller 301 is smaller than the interval F between the tip of the liquid thickness adjustment member 305 and the perimeter surface of the roller 301 (F>E).

In the aforementioned configuration, the paste P supplied from the paste bath 310 to the perimeter surface of the roller 301 is transported to the liquid thickness adjustment member 305 side accompanying the rotation of the roller 301, the adherence thickness thereof is adjusted at a predetermined thickness by this liquid thickness adjustment member 305, and is moved above the perimeter of the roller 301. At the required position above the perimeter of the roller 301, since the bottom surface portion of the target for coating w transported by the application position setting mechanism 302 is immersed in the paste P adhered on the perimeter surface of the roller 301, the paste P is applied to the bottom surface portion of the target for coating w.

Subsequently, the adhered paste P passed this application position is acted upon by the scraping member 306, and among the adhered paste P, the surface layer portion from the surface to the layer at the depth deeper than the immersion depth of the target for coating w is scraped off.

Among the paste P adhered on the perimeter surface of the roller 301, scraped surface layer portion is flow down from both sides of the scraping member 306 to the paste bath 310 located below. The inner layer portion inside the surface layer portion is exposed to the outside on a temporary basis, and is entered into the paste bath 310. In the paste bath 310, the surface layer portion of the adhered paste P and the inner layer portion thereof are mixed with the other paste stored in the paste bath 310.

According to this, the total paste P is adequately self-agitated. Consequently, viscosity change of the total paste P due to drying is suppressed and, therefore, the quantity of the paste applied to the target for coating w is stabilized. Since the scraped paste P of the surface layer portion is returned to the paste bath 310, the quantity of decrease of the paste P can be controlled at minimum. As a result, the paste P can be used continuously for a long time.

In this case, since the scraping member 306 is not brought into contact with the perimeter surface of the roller 301, and wear does not occur, degradation of the quality of the paste P due to powders resulting from wear does not occur, and degradation and cure of the paste P due to the frictional heat between the two do not occur. Furthermore, adjustment of the interval between the scraping member 306 and the roller 301 is unnecessary, and frequency of exchange of the scraping member 306 itself is reduced.

The paste P in the past bath 310 is moved to the liquid thickness adjustment member 305 side accompanying the rotation of the roller 301 because of viscosity thereof. Since a shifting members 312 are arranged under the liquid thickness adjustment member 305, large quantities of paste P is gathered under the liquid thickness adjustment member 305, is supplied to the perimeter surface of the roller 301 from the tip of the liquid thickness adjustment member 305, and becomes the adhered paste on the perimeter surface of the roller 301.

Figure 49:
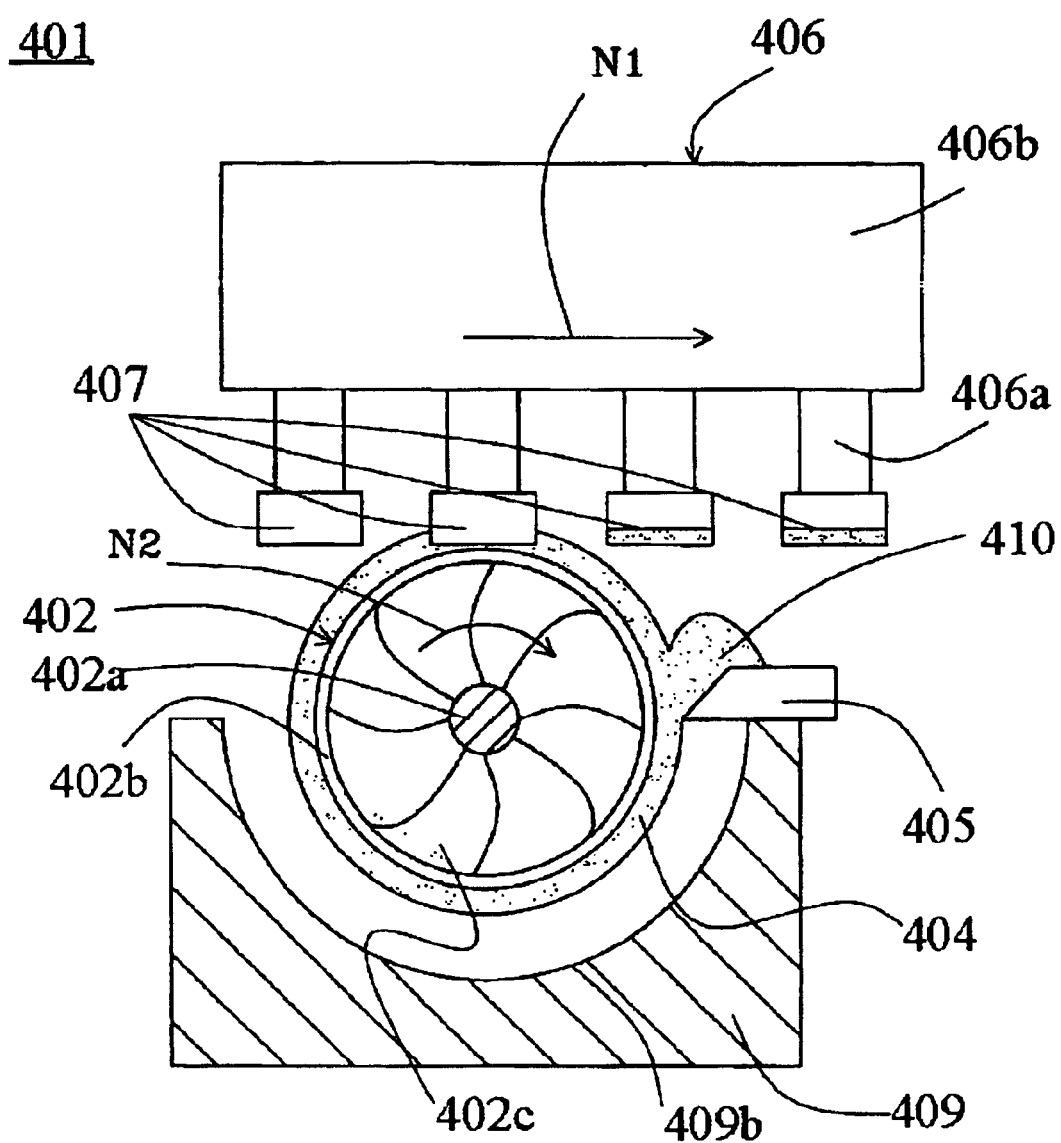
FIG. 49 is a schematic sectional view of a paste application apparatus according to a ninth embodiment of the present invention.
Figure 51A:
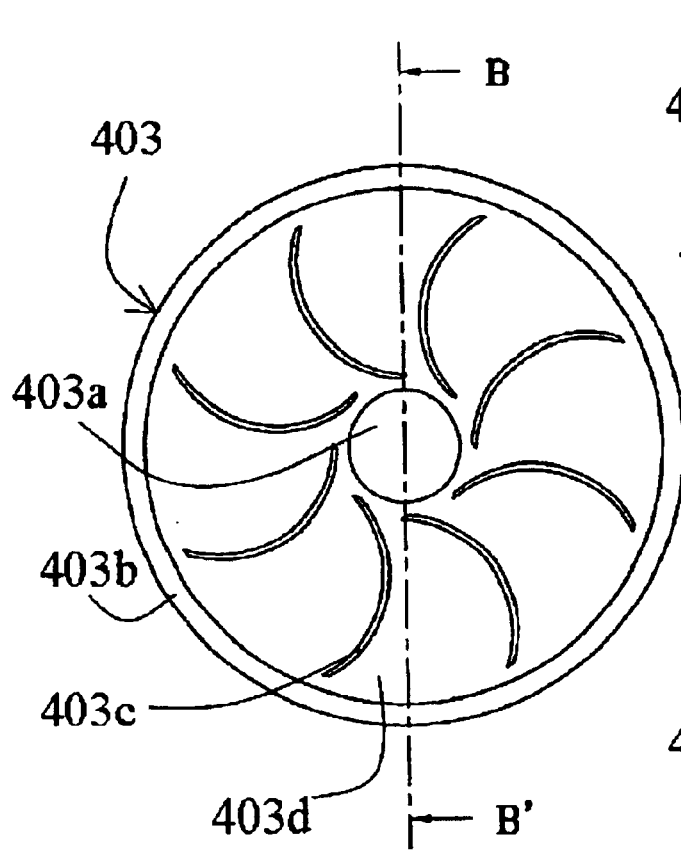
FIG. 51A is a plan view showing a modified example of a roller portion in a paste application apparatus of the present invention.

Next, a paste application apparatus according to a ninth embodiment of the present invention will be described. FIG. 49 is a schematic sectional view of a paste application apparatus 401 according to a ninth embodiment of the present invention. FIG. 50A is a plan view showing a roller portion that is the key portion of a paste application apparatus, and FIG. 50B is a sectional view of the section indicated by a line A–A' shown in FIG. 50A. FIG. 51A is a plan view showing a modified example of a roller portion that is the key portion of a paste application apparatus, and FIG. 51B is a sectional view of the section indicated by a line B–B' shown in FIG. 51A.

The paste application apparatus 401 shown in FIG. 49 is provided with a base portion 409, a roller 402 rotatably arranged in a semicircular concave portion 409b provided in the base portion 409, a squeegee 405 arranged on the base portion 409 with a certain clearance relative to the roller 402, and a paste supply mechanism (not shown in the drawing). The paste application apparatus 401 is provided with an application position setting mechanism 406 composed of nozzles 406a for adsorbing target for coating 407 and a head 406b above the roller 402.

The roller 402 is provided with a center axis 402a, a rim-shaped perimeter 402b, and a blade-shaped blast plate 402c joining the center axis 402a and the perimeter 402b. This blast plate 402c generates an air stream toward the perimeter 402b of the roller 402 accompanying the rotation of the roller 402, air-cools the perimeter 402b and, in addition, the blast plate 402c itself performs a function of dissipating heat by receiving a wind. The material constituting the roller 402 is not specifically limited, and various materials, for example, a metal, resin, and ceramic, can be used. However, materials which do not bring about dissolution, swelling, deformation, etc., by reaction with the paste used are used suitably. In particular, desirably, a stainless steel having excellent corrosion resistance and a rust prevention property, a metal, for example, copper and aluminum, having a high thermal conductivity and an excellent air-cooling effect are used. In the present embodiment, a stainless steel having excellent corrosion resistance and a rust prevention property is used. The shape and the number of blast plates 402c are not limited to those shown in the drawing, and various application and modification can be performed.

Figure 51B:
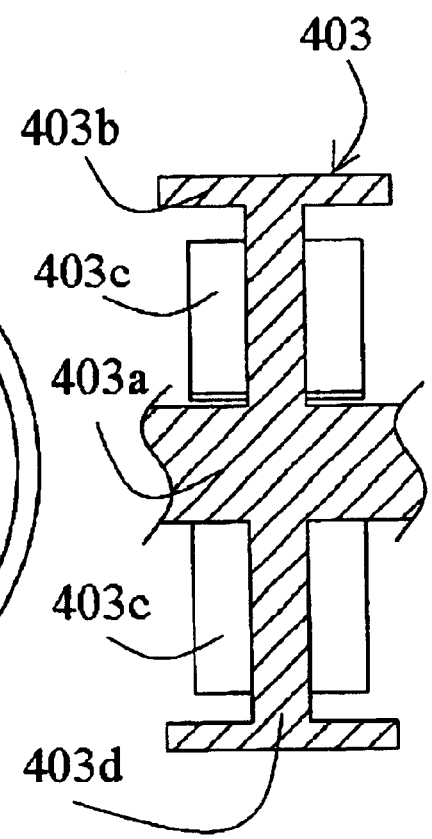
FIG. 51B is a sectional view of the section indicated by a line B–B' shown in FIG. 51A.

A roller 403 shown in FIGS. 51A and 51B can also be used instead of the roller 402. This roller 403 is provided with a rim-shaped perimeter 403b and a plate-shaped main body 403d. The main body 403d includes blast plate 403c arranged in the shape protruding toward the axis direction of the main body 403d. The blast plate 403c generates an air stream accompanying the rotation of the roller 403, and performs a function of air-cooling the perimeter 403b of the roller 403 and, in addition, the blast plate 403c itself performs a function of dissipating heat by receiving a wind. The shape and the number of blast plates are not limited to those shown in the drawing, and various application and modification can be performed.

The squeegee 405 is a flat plate arranged on the base portion 409 with a certain clearance relative to the roller 402. The material is not specifically limited. However, the material is desirably a metal, resin, ceramic, etc., which do not bring about dissolution, swelling, deformation, etc., by reaction with the paste used.

The application position setting mechanism 406 moves the target for coating 407 to a predetermined position in order that the paste is adhered to the bottom surface of the target for coating 407, and is provided with nozzles 406a for adsorbing and holding the target for coating 407 by vacuum aspiration and a head 406b which moves nozzles 406a horizontally. Regarding the nozzles 406a, 404 nozzles are arranged on the head 406b along the movement direction of the head 406b. Each of the nozzles 406a is moved horizontally so as to take out or put the target for coating 407. The head 406b is driven to reciprocate along a guide rail (not shown in the drawing) arranged in the horizontal direction (direction indicated by an arrow N1) orthogonal to the center axis of the roller 402.

A paste supply mechanism (not shown in the drawing) is an air type dispenser, and automatically supplies a paste to a paste bank 410 at a certain time interval. The paste supply mechanism is arranged between the paste bank 410 and the application position setting mechanism 406 in a manner as not to interfere movement of the application position setting mechanism 406, and the paste is supplied from a paste supply port to the paste bank 410.

The base portion 409 is in the shape of a nearly rectangular parallelepiped including a semicircular concave portion 409b. The roller 402 is rotatably arranged in this concave portion 409b, and the upper half of the roller 402 is exposed from the base portion 409. Furthermore, a roller support portion (not shown in the drawing) for supporting the center axis 402a of the roller 402 is arranged on the base portion 409.

A method for applying a paste using the aforementioned paste application apparatus 401 will be described. The roller 402 is rotated in one direction (the direction indicated by an arrow N2 in FIG. 49). The paste is supplied from the paste supply mechanism, and the paste bank 410 is formed. The perimeter 402b of the roller 402 passes through the paste bank 410 and, therefore, paste is adhered to the perimeter 402b. An excess portion of the paste among the paste adhered is scraped off by an action of the squeegee 405 and, therefore, a paste layer 404 having a constant thickness is formed on the surface of the perimeter 402b of the roller 402.

On the other hand, the application position setting mechanism 406 adsorbs the target for coating 407 with a nozzle 406a, and transports the target for coating 407 in one horizontal direction (direction indicated by an arrow N1) orthogonal to the center axis direction of the roller 402. The target for coating 407 is kept at a predetermined height, is immersed in the paste layer 404 above the roller 402 and, therefore, application of the paste to the target for coating 407 is completed.

In the present invention, the application position setting mechanism 406 is moved. However, the roller 402 may be configured to move, or both of the application position setting mechanism 406 and the roller 402 may be moved. The target for coating 407 is not limited to immerse in the paste layer 404 above the roller 402, and may be configured to bring into contact with the paste layer 404 at the side of or under the roller 402.

In the paste application apparatus 401, when the paste layer 404 is adjusted to have a constant thickness by the action of the squeegee 405, frictional heat is generated between the squeegee 405 and the paste layer 404. This frictional heat is increased accompanying the rotation of the roller 402 and, therefore, the temperature of the paste layer 404 is increased. However, by rotating the blast plate 402c together with the roller 402, the temperature increase of the perimeter 402b of the roller 402 can be suppressed and, therefore, the temperature of the paste layer 404 arranged on the perimeter 402b can be kept constant.

The present invention can exert effects to a certain degree when the circumferential velocity of the roller is 200 mm/s or more, and in particular, can exert high degree of effects when the circumferential velocity of the roller is 1,000 mm/s or more.

Figure 52:
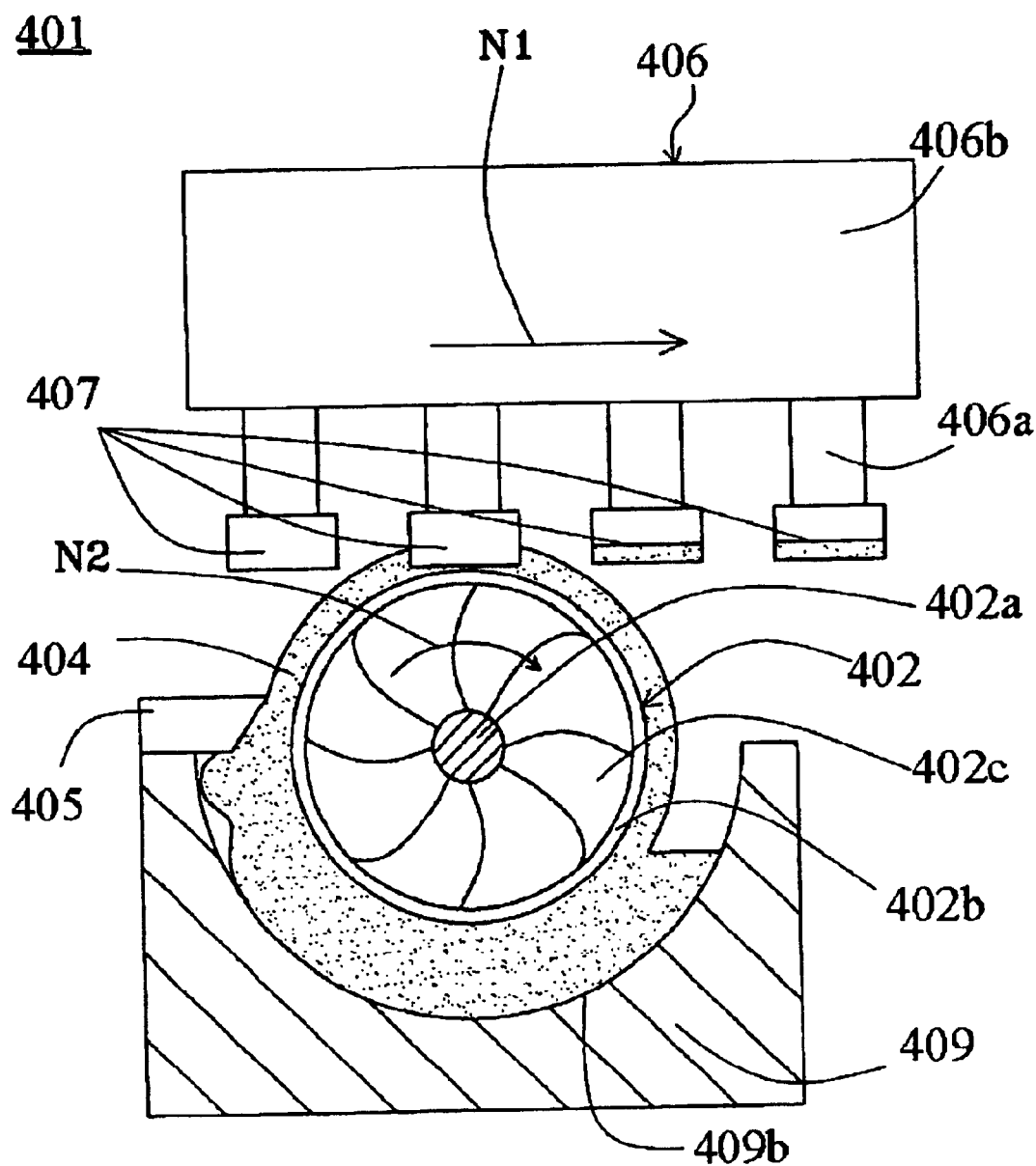
FIG. 52 is a schematic sectional view of a paste application apparatus according to a tenth embodiment of the present invention.
Figure 53:
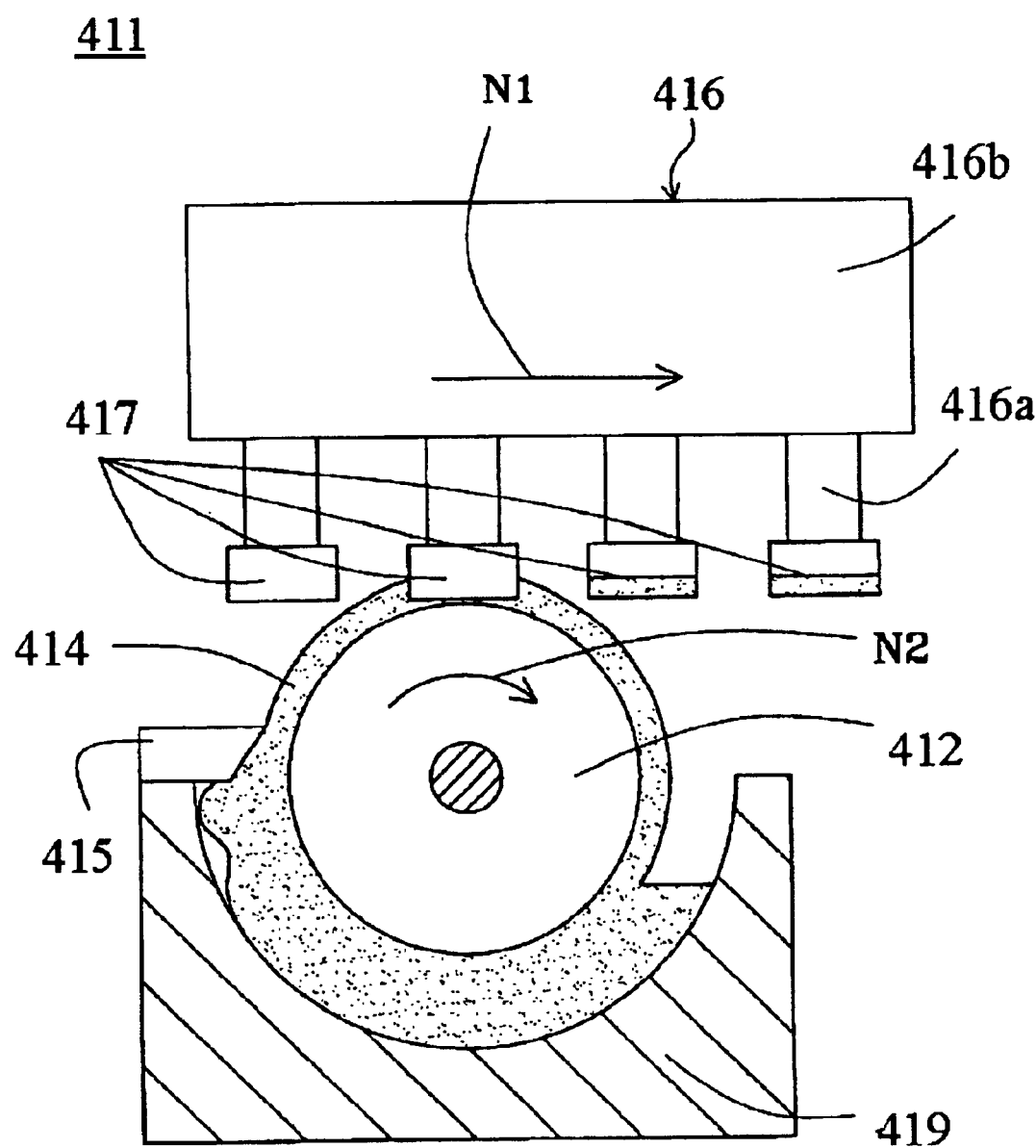
FIG. 53 is a schematic sectional view of a conventional paste application apparatus.

FIG. 52 is a schematic sectional view of a paste application apparatus according to a tenth embodiment of the present invention. Regarding this application apparatus 401, a paste is stored in a semicircular concave portion 409b formed on a base portion 409 with the quantity of such degree as the lower portion of a roller 402 is immersed. The paste stored is adhered to the perimeter surface of the roller 402 accompanying the rotation of the roller 402, and the paste adhered to the roller 402 is adjusted to have a predetermined thickness by a squeegee 405. Since other configurations are similar to those in the aforementioned embodiment, the explanations thereof are omitted.

What is claimed is:

1. A control system for a paste application apparatus comprising:
a setting device for setting a velocity difference between a movement velocity of a target for coating and a movement velocity of a paste layer, in order to evenly apply a paste to a front portion and a rear portion of the target for coating during application of the paste to the target for coating,
wherein the paste layer is formed with a constant layer thickness on a substrate surface, the paste layer moves along a pat which is an arc-shaped path when viewed from the side together with the substrate, and the target for coating moves along the tangential direction of the arc-shaped path, along which the paste layer moves, while the target for coating is immersed to a predetermined depth relative to the paste layer, and thereby the paste is applied to the target for coating;
further comprising a device for applying a paste to the target for coating via a roller, the device being provided with the roller to be supplied with a paste on the perimeter surface and a transport mechanism which transports the target for coating to the required position above the roller,
wherein a paste holding portion, in which at least a part of the target for coating can enter and which can hold the paste, is arranged on the perimeter surface of the roller.

2. The control system for a paste application apparatus according to claim 1, further comprising:
a supply portion for supplying the paste to the surface of the arc-shaped path; and
a layer thickness adjustment portion for keeping the layer thickness of the paste layer on the surface of the arc-shaped path constant, wherein:
the arc-shaped path is set byte perimeter surface of a cylindrical roller; and
the paste layer is adhered to the surface of the arc-shaped path.

3. The control system for a paste application apparatus according to claim 1 or claim 2, wherein the setting device sets the velocity difference between the movement velocity of the paste layer and the movement velocity of to target for coating during application of the paste at the position of application of the paste to the target for coating based on the distance from the center of the arc of the arc-shaped path to the paste layer surface, the immersion depth of the target for coating in the paste layer, and the external dimensions of the target for coating.

4. The control system for a paste application apparatus according to claim 1, further comprising:
a supply portion for supplying the paste to the surface of a cylindrical roller; and
a layer thickness adjustment portion for keeping the layer thickness of the paste layer on the surface of the roller constant,
wherein the substrate comprises the roller driven to rotate.

5. The control system for a paste application apparatus according to claim 4, wherein the setting device sets to velocity difference between the movement velocity of the paste layer and the movement velocity of the target for coating during application of the paste at the position of application of the paste to the target for coating based on to distance from the center of the roller to the paste layer surface, the immersion depth of the target for coating in the paste layer, and the external dimensions of the target for coating.

6. The control system for a paste application apparatus according to claim 1 or claim 2, wherein the setting device sets the movement velocity of the paste layer at a velocity higher than the movement velocity of the target for coating during application of the paste.

7. The control system for a paste application apparatus according to claim 1 or claim 2, wherein the setting device sets the velocity difference so that in respective movement trajectories of immersion of the front portion and the rear portion in the movement direction of the target for coating relative to the paste layer during immersion in the paste layer, an immersion start position and an immersion completion position are in agreement with each other.

8. The control system for a paste application apparatus according to claim 1, wherein the paste holding portion is a circumferential groove arranged along the circumference on the perimeter surface of the roller, and the size of the circumferential groove is set in order that the portion on the side of paste application of the target for coating can enter therein with clearance.

9. The control system for a paste application apparatus according to claim 1, wherein the paste holding portion is a flexible holding layer for the paste formed from a flexible member on the perimeter surface of the roller, and the flexible holding layer has paste holding gaps therein.

10. The control system for a paste application apparatus according to claim 9, wherein the flexible holding layer comprises a plurality of pliable linear bodies arranged on the perimeter surface of the roller.

11. The control system for a paste application apparatus according to claim 9, wherein the flexible holding layer comprises numbers of elastic protrusions protruding from the perimeter surface of the roller in multiple directions.

12. The control system for a paste application apparatus according to claim 9, wherein the flexible holding layer comprises an elastic body having a plurality of gaps open toward the outer diameter side.

13. The control system for a paste application apparatus according to claim 1 or claim 2, further comprising:
   a roller to be supplied with a paste on a perimeter surface thereof;
   an application position setting mechanism for setting relative positions of the roller and the target for coating in order that at least a part of the target for coating is immersed in the paste adhered to the perimeter surface of the roller at a required depth; and
   a scraping member for scraping off the paste adhered to the perimeter surface of the roller,
   wherein the scraping member scrapes off the paste with a scraping depth larger than the immersion depth of the target for coating being immersed in the adhered paste while the scraping member is out of contact with the perimeter surface of the roller.

14. The control system for a paste application apparatus according to claim 13, further comprising a paste supply portion for supplying the paste to the perimeter surface of the roller.

15. The control system for a paste application apparatus according to claim 14, wherein at least a tip portion of the scraping member is arranged above the paste supply portion in order that the paste scraped off by the scraping member flows into the paste supply portion under its own weight.

16. The control system for a paste application apparatus according to claim 15, wherein the paste supply portion is a paste bath including an open upper portion, and the roller is ranged inside the open portion.

17. The control system for a paste application apparatus according to claim 15, further comprising a liquid thickness adjustment member for adjusting the adhesion thickness of the paste adhered to the perimeter surface of the roller, arranged under the scraping member, wherein the paste supply portion comprises the top surface of the liquid thickness adjustment member and the perimeter surface of the roller.

18. The control system for a paste application apparatus according to claim 14, wherein the paste supply portion is a paste bath including an open upper portion, and the roller is arranged inside the open portion.

19. The control system for a paste application apparatus according to claim 14, further comprising a liquid thickness adjustment member for adjusting the adhesion thickness of the paste adhered to the perimeter surface of the roller, arranged under the scraping member, wherein the paste supply portion comprises the top surface of the liquid thickness adjustment member and the perimeter surface of the roller.

20. The control system for a paste application apparatus according to claim 13, wherein the application position setting mechanism is a mechanism which holds the target for coating and transports the target for holding toward the required application position relative to the perimeter surface of the roller.

21. The control system for a paste application apparatus according to claim 20, wherein the application position setting mechanism transports the target for coating in the horizontal direction or vertical direction.

22. A control system for a paste application apparatus comprising:
   a setting device for setting a velocity difference between a movement velocity of a target for coating and a movement velocity of a paste layer, in order to evenly apply a paste to a front portion and a rear portion of the target for coating during application of the paste to the target for coating,
   wherein the paste layer is formed with a constant layer thickness on a substrate surface, the paste layer moves along a path which is an arc-shaped path when viewed from the side together with the substrate, and the target for coating moves along the tangential direction of the arc-shaped path, along which the paste layer moves, while the target for coating is immersed to a predetermined depth relative to the paste layer, and thereby the paste is applied to the target for coating;
   a roller to be supplied with a paste on a perimeter surface thereof;
   an application position setting mechanism for setting relative positions of the roller and the target for coating in order that at least a part of the target for coating is immersed in the paste adhered to the perimeter surface of the roller at a required depth; and
   a scraping member for scraping off the paste adhered to the perimeter surface of the roller,
   wherein the scraping member scrapes off the paste with a scraping depth larger than the immersion depth of the target for coating being immersed in the adhered paste while the scraping member is out of contact with the perimeter surface of the roller;
   a paste supply portion for supplying the paste to the perimeter surface of the roller;
   a liquid thickness adjustment member for adjusting the adhesion thickness of the paste adhered to the perimeter surface of the roller, arranged under the scraping member, wherein the paste supply portion comprises the top surface of the liquid thickness adjustment member and the perimeter surface of the roller; and
   a shifting member, for shifting the paste toward the liquid thickness adjustment member, arranged on both sides of the liquid thickness adjustment member in a shape for surrounding the scraping member from both sides.

23. The control system for a paste application apparatus according to claim 22, wherein at least a tip portion of the scraping member is arranged above the paste supply portion in order that the paste scraped off by the scraping member flows into the paste supply portion under its own weight.

24. The control system for a paste application apparatus comprising:
   a setting device for setting a velocity difference between a movement velocity of a target for coating and a movement velocity of a paste layer, in order to evenly apply a paste to a front portion and a rear portion of the target for coating during application of the paste to the target for coating, wherein the paste layer is formed with a constant layer thickness on a substrate surface, the paste layer moves along a path which is an arc-shaped path when viewed from the side together with the substrate, and the target for coating moves along the tangential direction of the arc-shaped path, along which the paste layer moves, while the target for coating is immersed to a predetermined depth relative to the paste layer, and thereby the paste is applied to the target for coating;

a roller having a rim-shaped perimeter;

a paste supply mechanism for supplying the paste on the perimeter of the roller so as to form the paste layer; and an application position netting mechanism for setting relative positions of the roller and the target for coating in order that the paste layer on the roller and the target for coating are brought into contact with each other and the paste is adhered to the surface of the target for coating, wherein the roller comprises a blast plate which generates an air current by the rotation of the roller.

25. The control system for a paste application apparatus according to claim 24, wherein the roller comprises a center axis, a rim-shaped perimeter, and a blade-shaped blast plate joining the center axis and the perimeter.

26. The control system for a paste application apparatus according to claim 25, further comprising:

a supply portion for supplying the paste to the surface of the arc-shaped path; and a layer thickness adjustment portion for keeping the layer thickness of the paste layer on the surface of the arc-shaped path constant, wherein:

the arc-shaped path is set byte perimeter surface of a cylindrical roller; and the paste layer is adhered to the surface of the arc-shaped path.

27. The control system of a paste application apparatus according to claim 24, wherein the roller comprises a plate-shaped main body and a rim-shaped perimeter, end the main body includes a blast plate ranged in the shape protruding in the axis direction of the main body.

28. The control system for a paste application apparatus according to claim 27, further comprising:

a supply portion for supplying the paste to the surface of the arc-shaped path; and a layer thickness adjustment portion for keeping the layer thickness of the paste layer on the surface of the arc-shaped path constant, wherein:

the arc-shaped path is set by the perimeter surface of a cylindrical roller; and the paste layer is adhered to the surface of the arc-shaped path.

29. The control system for a paste application apparatus according to claim 24, further comprising:

a supply portion for supplying the paste to the surface of the arc-shaped path; and a layer thickness adjustment portion for keeping the layer thickness of the paste layer on the surface of the arc-shaped path constant, wherein:

the arc-shaped path is set by the perimeter surface of a cylindrical roller; and the paste layer is adhered to the surface of the arc-shaped path.

30. A control system for a paste application apparatus comprising:

a coating roller for transferring and applying a paste to a target for coating;

a device for supplying the paste to a perimeter of the coating roller; and a paste layer formation member for scraping off an excess portion of the paste supplied to the perimeter of the roller and forming a paste layer having a predetermined cross-sectional shape on the perimeter of the coating roller, wherein:

the shape of the paste layer formation member is set to form the paste layer having a width smaller than the width in the axis center direction of the coating roller as the paste layer;

the target for coating is held by a movable head;

the paste is applied to the target for coating by immersing the target for coating in the paste layer while the head moves on the rotating coating roller; and the paste layer formation member comprises a fixed squeegee provided with a concave portion at the tip portion;

wherein the concave portion is formed in a direction generally perpendicular to a rolling direction of the coating roller.

31. The control system of a paste application apparatus according to claim 30, wherein the paste layer formation member comprises a fixed squeegee provided with a taper-shaped concave portion at the tip portion.

32. The control system of a paste application apparatus comprising:

a coating roller for transferring and applying a paste to a target for coating;

a device for supplying the paste to a perimeter of the coating roller; and a paste layer formation member for scraping off an excess portion of the paste supplied to the perimeter of the roller and forming a paste layer having a predetermined cross-sectional shape on the perimeter of the coating roller, wherein:

the shape of the paste layer formation member is set to form the paste layer having a width smaller than the width in the axis center direction of the coating roller as the paste layer;

the target for coating is held by a movable head;

the paste is applied to the target for coating by immersing the target for coating in the paste layer while the head moves on the rotating coating roller; and the paste layer formation member comprises a fixed squeegee provided with a concave portion at the tip portion, wherein the paste layer formation member comprises a rotary roller provided with a circular concave groove on the perimeter.

33. The control system of a paste application apparatus according to claim 32, wherein a circular convex thread is arranged on the perimeter of the coating roller, and a concave portion to be fitted with this circular convex thread is arranged in the paste layer formation member.

34. The control system of a paste application apparatus according to claim 33, wherein taper-shaped circular convex threads are arranged at both edge portions on the perimeter of the coating roller, and concave portions to be fitted with these circular convex threads are arranged in the paste layer formation member.

35. The control system of a paste application apparatus according to claim 32, wherein the paste layer formation member comprises a rotary roller provided with a taper-shaped circular concave groove on the tip portion.

36. The control system for a paste application apparatus according to claim 30 or claim 32, further comprising:
   a roller to be supplied with a paste on a perimeter surface thereof;
   an application position setting mechanism for setting relative positions of the roller and the target for coating in order that at least a part of the target for coating is immersed in the paste adhered to the perimeter surface of the roller at a required depth; and
   a scraping member for scraping off the paste adhered to the perimeter surface of the roller,
   wherein the scraping member scrapes off the paste with a scraping depth larger than the immersion depth of the target far coating being immersed in the adhered paste while the scraping member is out of contact with the perimeter surface of the roller.

37. The control system of a paste application apparatus according to claim 36, further comprising a paste supply portion for supplying the paste to the perimeter surface of the roller.

38. The control system of a paste application apparatus according to claim 37, wherein at least the tip portion of the scraping member is arranged above the paste supply portion in order that the paste scraped off by the scraping member flows into the paste supply portion under its own weight.

39. The control system of a paste application apparatus according to claim 37, wherein the paste supply portion is a paste bath including an open upper portion, and the roller is arranged inside the open portion.

40. The control system of a paste application apparatus according to claim 38, wherein the paste supply portion is a paste bath including an open upper portion, and the roller is arranged inside the open portion.

41. The control system for a paste application apparatus according to claim 37, further comprising a liquid thickness adjustment member for adjusting the adhesion thickness of the paste adhered to the perimeter surface of the roller, ranged under the scraping member, wherein the paste supply portion comprises the top surface of the liquid thickness adjustment member and the perimeter surface of the roller.

42. The control system for a paste application apparatus according to claim 38, further comprising a liquid thickness adjustment member for adjusting the adhesion thickness of the paste adhered to the perimeter surface of the roller, arranged under the scraping member, wherein the paste supply portion comprises the top surface of the liquid thickness adjustment member and the perimeter surface of the roller.

43. The control system for a paste application apparatus according to claim 41, further comprising a shifting member for shifting the paste toward the liquid thickness adjustment member side, arranged on both sides of the liquid thickness adjustment member in a shape for surrounding the scraping member from both sides.

44. The control system for a paste application apparatus according to claim 42, further comprising a shifting member for shifting the paste toward the liquid thickness adjustment member, arranged on both sides of the liquid thickness adjustment member, in a shape for surrounding the scraping member from both sides.

45. The control system for a paste application apparatus according to claim 36, wherein the application position setting mechanism is a mechanism which holds the target for coating and transports the target for heading toward the required application position relative to the perimeter surface of to roller.

46. The control system for a paste application apparatus according to claim 45, wherein the application position setting mechanism transports to target for coating in the horizontal direction or vertical direction.

47. The control system of a paste application apparatus comprising:
   a coating roller for transferring and applying a paste to a target for coating;
   a device for supplying the paste to a perimeter of the coating roller; and
   a paste layer formation member for scraping off an excess portion of the paste supplied to the perimeter of the roller and forming a paste layer having a predetermined cross-sectional shape on the perimeter of the coating roller, wherein:
   the shape of the paste layer formation member is set to form the paste layer having a width smaller than the width in the axis center direction of the coating roller as the paste layer;
   the target for coating is held by a movable head;
   the paste is applied to the target for coating by immersing the target for coating in the paste layer while the head moves on the rotating coating roller; and
   the paste layer formation member comprises a fixed squeegee provided with a concave portion at the tip portion,
   wherein a circular convex thread is arranged on the perimeter of the coating roller, and a concave portion to be fitted with this circular convex thread is arranged in the paste layer formation member.

48. The control system of a paste application apparatus according to claim 47, wherein taper-shaped circular convex threads are arranged at both edge portions on the perimeter of the coating roller, and concave portions to be fitted with these circular convex threads are arranged in the paste layer formation member.

49. The control system for a paste application apparatus comprising:
   a coating roller for transferring and applying a paste to a target far coating;
   a device for supplying the paste to a perimeter of the coating roller; and
   a paste layer formation member for scraping off an excess portion of the paste supplied to the perimeter of the roller and forming a paste layer having a predetermined cross-sectional shape on the perimeter of the coating roller, wherein:
   the shape of the paste layer formation member is set to form the paste layer having a width smaller than the width in the axis center direction of the coating roller as the paste layer;
   the target for coating is held by a movable head;
   the paste is applied to the target for coating by immersing the target for coating in the paste layer while the head moves on the rotating coating roller; and
   the paste layer formation member comprises a fixed squeegee provided with a concave portion at the tip portion.
   a roller having a rim-shaped perimeter;
   a paste supply mechanism for supplying the paste on the perimeter of the roller so as to form the paste layer; and an application position setting mechanism for setting relative positions of the roller and the target for coating in order that the paste layer on the roller and the target for coating are brought into contact with each other and the paste is adhered to the surface of the target for coating, wherein the roller comprises a blast plate which generates an air current by the rotation of the roller.

50. The control system for a paste application apparatus according to claim 49, wherein the roller comprises a center axis, a rim-shaped perimeter, and a blade-shaped blast plate joining the center axis and the perimeter.

51. The control system for a paste application apparatus according to claim 50, wherein the paste layer formation member comprises a rotary roller provided with a circular concave groove on the perimeter.

52. The control system for a paste application apparatus according to claim 49, wherein the roller comprises a plate-shaped main body and a rim-shaped perimeter, and the main body includes a blast plate arranged in a shape protruding in the axis direction of a main body.

53. The control system for a paste application apparatus according to claim 52, wherein the paste layer formation member comprises a rotary roller provided with a circular concave groove on the perimeter.

54. The control system for a paste application apparatus according to claim 49, wherein the paste layer formation member comprises a rotary roller provided with a circular concave groove on the perimeter.

55. A control system for a paste application apparatus comprising:

a setting device for setting a velocity difference between a movement velocity of a target for coating and a movement velocity of a paste layer, in order to evenly apply a paste to a front portion and a rear portion of the target for coating during application of the paste to the target for coating, wherein the paste layer is formed with a constant layer thickness on a substrate surface, the paste layer moves along a path which is an arc-shaped path when viewed from the side together with the substrate, and the target for coating moves along the tangential direction of the arc-shaped path, along which the paste layer moves, while the target for coating is immersed to a predetermined depth relative to the paste layer, and thereby to paste is applied to the target for coating;

a coating roller for transferring and applying a paste to a target for coating;

a device for supplying the paste to a perimeter of the coating roller; and a paste layer formation member for scraping off an excess portion of the paste supplied to the perimeter of the roller and forming a paste layer having a predetermined cross-sectional shape on the perimeter of the coating roller, wherein:

the shape of the paste layer formation member is set to form the paste layer having a width smaller than the width in the axis center direction or the coating roller as the paste layer;

the target for coating is held by a movable head;

the paste is applied to the target for coating by immersing the target for coating in the paste layer while the head moves on the rotating coating roller; and the paste layer formation member comprises a fixed squeegee provided with a concave portion at the tip portion;

wherein the concave portion is formed in a direction generally perpendicular to a rolling direction of the coating roller.

56. The control system for a paste application apparatus according to claim 55, further comprising:

a supply portion for supplying the paste to the surface of the arc-shaped path; and a layer thickness adjustment portion for keeping the layer thickness of the paste layer on the surface of the arc-shaped path constant, wherein:

the arc-shaped path is set by the perimeter surface of a cylindrical roller; and the paste layer is adhered to the surface of the arc-shaped path.

57. The control system for a paste application apparatus comprising:

a setting device for setting a velocity difference between a movement velocity of a target for coating and a movement velocity of a paste layer, in order to evenly apply a paste to a front portion and a rear portion of the target for coating during application of the paste to the target for coating, wherein the paste layer is formed with a constant layer thickness on a substrate surface, the paste layer moves along a path which is an arc-shaped path when viewed from the side together with the substrate, and the target for coating moves along the tangential direction of the arc-shaped path, along which the paste layer moves, while the target for coating is immersed to a predetermined death relative to the paste layer, and thereby the paste is applied to the target for coating;

a coating roller for transferring and applying a paste to a target for coating;

a device for supplying the paste to a perimeter of the coating roller; and a paste layer formation member for scraping off an excess portion of the paste supplied to the perimeter of the roller and forming a paste layer having a predetermined cross-sectional shape on the perimeter of the coating roller, wherein:

the shape of the paste layer formation member is set to form the paste layer having a width smaller than the width in the axis center direction of the coating roller as the paste layer;

the target for coating is held by a movable head;

the paste is applied to the target for coating by immersing the target for coating in the paste layer while the head moves on the rotating coating roller; and the paste layer formation member comprises a fixed squeegee provided with a concave portion at the tip portion;

wherein the paste layer formation member comprises a rotary roller provided with a circular concave groove on a perimeter thereof.

58. The control system for a paste application apparatus according to claim 57, further comprising a circular convex thread arranged on the perimeter of the coating roller, and a concave portion to be fitted with the circular convex thread is arranged in the paste layer formation member.

59. The control system for a paste application apparatus according to claim 58, wherein taper-shaped circular convex threads are arranged at both edge portions on the perimeter of the coating roller, and concave portions to be fitted with these circular convex threads are arranged in the paste layer formation member.

60. The control system for a paste application apparatus according to claim 59, further comprising:
- a supply portion for supplying the paste to the surface of the arc-shaped path; and
- a layer thickness adjustment portion for keeping the layer thickness of the paste layer on the surface of the arc-shaped path constant, wherein:
- the arc-shaped path is set by the perimeter surface of a cylindrical roller; and
- the paste layer is adhered to the surface of the arc-shaped path.

61. The control system for a paste application apparatus according to claim 58, further comprising:
- a supply portion for supplying the paste to the surface of the arc-shaped path; and
- a layer thickness adjustment portion for keeping the layer thickness of the paste layer on the surface of the arc-shaped path constant, wherein:
- the arc-shaped path is set by the perimeter surface of a cylindrical roller; and
- the paste layer is adhered to the surface of the arc-shaped path.

62. The control system for a paste application apparatus according to claim 57, wherein the paste layer formation member comprises a rotary roller provided with a taper-shaped circular concave groove on a tip portion thereof.

63. The control system for a paste application apparatus according to claim 62, further comprising:
- a supply portion for supplying the paste to the surface of the arc-shaped path; and
- a layer thickness adjustment portion for keeping the layer thickness of the paste layer on the surface of the arc-shaped path constant, wherein:
- the arc-shaped path is set by the perimeter surface of a cylindrical roller; and
- the paste layer is adhered to the surface of the arc-shaped path.

64. The control system for a paste application apparatus according to claim 57, further comprising:
- a supply portion for supplying the paste to the surface of the arc-shaped path; and
- a layer thickness adjustment portion for keeping the layer thickness of the paste layer on the surface of the arc-shaped path constant, wherein:
- the arc-shaped path is set byte perimeter surface of a cylindrical roller; and
- the paste layer is adhered to the surface of the arc-shaped path.

65. The control system for a paste application apparatus, comprising:
- a setting device for setting a velocity difference between a movement velocity of a target for coating and a movement velocity of a paste layer, in order to evenly apply a paste to a front portion and a rear portion of the target for coating during application of the paste to the target for coating,
- wherein the paste layer is formed with a constant layer thickness on a substrate surface, the paste layer moves along a path which is an arc-shaped path when viewed from the side together with the substrate, and the target for coating moves along the tangential direction of the arc-shaped path, along which the paste layer moves, while the target for coating is immersed to a predetermined depth relative to the paste layer, and thereby the paste is applied to the target for coating;
- a coating roller for transferring and applying a paste to a target for coating;
- a device for supplying the paste to a perimeter of the coating roller; and
- a paste layer formation member for scraping off an excess portion of the paste supplied to the perimeter of the roller and forming a paste layer having a predetermined cross-sectional shape on the perimeter of the coating roller, wherein:
- the shape of the paste layer formation member is set to form the paste layer having a width smaller than the width in the axis center direction of the coating roller as the paste layer;
- the target for coating is held by a movable head;
- the paste is applied to the target for coating by immersing the target for coating in the paste layer while the head moves on the rotating coating roller; and
- the paste layer formation member comprises a fixed squeegee provided with a concave portion at the tip portion;
- further comprising a circular convex thread ranged on the perimeter of the coating roller, and a concave portion to be fitted with the circular convex thread is arranged in the paste layer formation member.

66. The control system for a paste application apparatus according to claim 65, wherein taper-shaped circular convex threads are arranged at both edge portions on the perimeter of the coating roller, and concave portions to be fitted with these circular convex threads are arranged in the paste layer formation member.

67. The control system for a paste application apparatus according to claim 65, further comprising:
- a supply portion for supplying the paste to the surface of the arc-shaped path; and
- a layer thickness adjustment portion for keeping the layer thickness of the paste layer on the surface of the arc-shaped path constant, wherein:
- the arc-shaped path is set by the perimeter surface of a cylindrical roller; and
- the paste layer is adhered to the surface of the arc-shaped path.

68. The control system for a paste application apparatus according to claim 66, further comprising:
- a supply portion for supplying the paste to the surface of the arc-shaped path; and
- a layer thickness adjustment portion for keeping the layer thickness of the paste layer on the surface of the arc-shaped path constant, wherein:
- the arc-shaped path is set by the perimeter surface of a cylindrical roller; and
- the paste layer is adhered to the surface of the arc-shaped path.

69. The control system for a paste application apparatus comprising:
- a setting device for setting a velocity difference between a movement velocity of a target for coating and a movement velocity of a paste layer, in order to evenly apply a paste to a front portion and a rear portion of the target for coating during application of the paste to the target for coating,
- wherein the paste layer is formed with a constant layer thickness on a substrate surface, the paste layer moves along a path which is an arc-shaped path when viewed from the side together with the substrate, and the target for coating moves along the tangential direction of the arc-shaped path, along which the paste layer moves, while the target for coating is immersed to a predetermined depth relative to the paste layer, and thereby the paste is applied to the target for coating;

a coating roller for transferring and applying a paste to a target for coating;

a device for supplying the paste to a perimeter of the coating roller; and a paste layer formation member for scraping off an excess portion of the paste supplied to the perimeter of the roller and forming a past layer having a predetermined cross-sectional shape on the perimeter of the coating roller, wherein:

the shape of the paste layer formation member is set to form the paste layer having a width smaller than the width in the axis center direction of the coating roller as the paste layer;

the target for coating is held by a movable head;

the paste is applied to the target for coating by immersing the target for coating in the paste layer while the head moves on the rotating coating roller; and the paste layer formation member comprises a fixed squeegee provided with a concave portion at the tip portion;

wherein the paste layer formation member comprises a fixed squeegee provided with a taper-shaped concave portion at a tip portion thereof.

70. The control system for a paste application apparatus according to claim 69, further comprising:

a supply portion for supplying the paste to the surface of the arc-shaped path; and a layer thickness adjustment portion for keeping the layer thickness of the paste layer on the surface of the arc-shaped path constant, wherein:

the arc-shaped path is set by the perimeter surface of the cylindrical roller; and the paste layer is adhered to the surface of the arc-shaped path.

* * * * *